(12) United States Patent
  Iriyama

(10) Patent No.: US 9,356,215 B2
(45) Date of Patent: May 31, 2016

(54) THERMOELECTRIC GENERATOR

(71) Applicant: Yojiro Iriyama, Toyota (JP)

(72) Inventor: Yojiro Iriyama, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/423,199

(22) PCT Filed: Sep. 10, 2013

(86) PCT No.: PCT/JP2013/074415
§ 371 (c)(1),
(2) Date: Feb. 23, 2015

(87) PCT Pub. No.: WO2014/042159
PCT Pub. Date: Mar. 20, 2014

(65) Prior Publication Data
US 2015/0243866 A1    Aug. 27, 2015

(30) Foreign Application Priority Data

Sep. 11, 2012  (JP) .................................. 2012-199438
Oct. 19, 2012  (JP) .................................. 2012-231992

(51) Int. Cl.
*F01N 11/00*    (2006.01)
*H01L 35/02*    (2006.01)
(Continued)

(52) U.S. Cl.
CPC ................ *H01L 35/02* (2013.01); *F01N 5/025* (2013.01); *F01N 11/00* (2013.01); *F02D 41/0065* (2013.01); *F02M 25/0753* (2013.01); *F02M 25/0872* (2013.01); *H01L 35/30* (2013.01); *H01L 35/32* (2013.01); *H02N 11/00* (2013.01);
(Continued)

(58) Field of Classification Search
CPC ....... F01N 3/0205; F01N 3/043; F01N 5/025; F01N 11/00; F01N 13/008; F01N 2240/02; F01N 2260/024; F01N 2550/00; F01N 2560/08; F01N 2900/08; F01N 2900/1406; F02M 25/0703; Y02T 10/166
USPC ........................... 60/277, 278, 283, 320, 324
See application file for complete search history.

(56) References Cited

U.S. PATENT DOCUMENTS

2007/0272290 A1* 11/2007 Sims ...................... B60H 1/004
                                                    136/201
2012/0073276 A1    3/2012  Meisner et al.

FOREIGN PATENT DOCUMENTS

JP        04-041944       4/1992
JP        10-234194       9/1998
(Continued)

OTHER PUBLICATIONS

Extended Search Report issued Aug. 10, 2015 in European Patent Application No. 13836792.5.
(Continued)

*Primary Examiner* — Jorge Leon, Jr.
(74) *Attorney, Agent, or Firm* — Oblon, McClelland, Maier & Neustadt, L.L.P

(57) ABSTRACT

A thermoelectric generator has a module chamber defined between an exhaust pipe portion and a coolant pipe. A thermoelectric conversion module and an HC sensor are located in the module chamber. An ECU performs a fault diagnosis on the thermoelectric generator by detecting the leakage of exhaust gas into the module chamber from the exhaust pipe portion based on detection information output by the HC sensor.

15 Claims, 29 Drawing Sheets

(51) Int. Cl.

| | | |
|---|---|---|
| *H01L 35/32* | (2006.01) | |
| *F01N 5/02* | (2006.01) | |
| *H02N 11/00* | (2006.01) | |
| *F02D 41/00* | (2006.01) | |
| *H01L 35/30* | (2006.01) | |
| *F01N 3/04* | (2006.01) | |
| *F02M 25/07* | (2006.01) | |
| *F01N 13/00* | (2010.01) | |
| *F01N 3/10* | (2006.01) | |
| *F02M 25/08* | (2006.01) | |

(52) U.S. Cl.
CPC ............... *F01N 3/043* (2013.01); *F01N 3/101* (2013.01); *F01N 13/008* (2013.01); *F01N 13/0093* (2014.06); *F01N 2240/36* (2013.01); *F01N 2260/024* (2013.01); *F01N 2410/00* (2013.01); *F01N 2550/00* (2013.01); *F01N 2560/025* (2013.01); *F01N 2560/08* (2013.01); *F01N 2900/08* (2013.01); *F01N 2900/1402* (2013.01); *F01N 2900/1406* (2013.01); *F02M 25/0703* (2013.01); *F02M 25/0717* (2013.01); *F02M 25/0836* (2013.01); *Y02T 10/16* (2013.01); *Y02T 10/166* (2013.01); *Y02T 10/22* (2013.01); *Y02T 10/47* (2013.01)

(56) References Cited

FOREIGN PATENT DOCUMENTS

| JP | 11-122960 | 4/1999 |
| JP | 2008-223504 | 9/2008 |
| JP | 2009-209764 | 9/2009 |
| JP | 2011-94493 A | 5/2011 |

OTHER PUBLICATIONS

International Search Report issued Nov. 26, 2013 in PCT/JP2013/074415 filed Sep. 10, 2013.

\* cited by examiner

THERMOELECTRIC GENERATOR

TECHNICAL FIELD

The present invention relates to a thermoelectric generator, and in particular, to a thermoelectric generator provided with thermoelectric conversion modules that perform thermoelectric generation using a temperature difference between a high-temperature part and a low-temperature part.

BACKGROUND ART

A conventional thermoelectric generator of this type has been known that includes an inner tube, an outer tube, and thermoelectric conversion modules. The inner tube has at least one heat collecting surface on which heat collecting fins are formed on its inner surface. The inner tube receives exhaust gas discharged from an internal combustion engine. The outer tube has a heat radiating surface opposed to the heat collecting surface of the inner tube and is formed of a cooling jacket in which coolant (cooling medium) circulates. The thermoelectric conversion modules are located between the heat collecting surface of the inner tube and the heat radiating surface of the outer tube. The thermoelectric generator has a high-temperature end face (high-temperature part) in close contact with the heat collecting surface. The thermoelectric conversion modules are stored in a space portion surrounded by the outer tube (refer to Patent Document 1, for example).

In the thermoelectric generator, the inner tube and the heat collecting fins are formed of stainless steel plates to prevent corrosion due to exhaust gas.

PRIOR ART DOCUMENTS

Patent Documents

PRIOR ART DOCUMENTS

Patent Documents

Patent Document 1: Japanese Laid-Open Patent Publication No. 11-122960

SUMMARY OF THE INVENTION

Problems that the Invention is to Solve

However, in regions where fuel having a high sulfur content is used, acidic condensed water is generated in the exhaust passage and thus, even when the inner tube and the heat collecting fins are formed of the corrosion-resistant stainless steel plates, a hole may be formed in the inner tube by the corrosive action of condensed water.

In this case, the thermoelectric conversion modules are exposed to the exhaust gas leaking into the space portion for a long time. Particularly, when thermoelectric conversion modules made of semiconductors or alloys are used, the modules can be degraded by the exhaust gas.

To solve the above-mentioned conventional problem, an object of the present invention is to provide a thermoelectric generator capable of detecting leakage of exhaust gas into the space portion in which the thermoelectric conversion modules are located and performing fault diagnosis on the thermoelectric generator.

Means for Solving the Problems (1) To achieve the foregoing objective, a thermoelectric generator according to the present invention includes an exhaust pipe portion into which exhaust gas is conducted, a cooling portion to which a cooling medium is supplied, and a thermoelectric conversion module that has a high-temperature part opposed to the exhaust pipe portion and a low-temperature part opposed to the cooling portion. The thermoelectric conversion module performs thermoelectric generation using a temperature difference between the high-temperature part and the low-temperature part. The thermoelectric conversion module is located in a space portion defined between the exhaust pipe portion and the cooling portion. The thermoelectric generator includes a fault diagnosis means that performs fault diagnosis on the thermoelectric generator based on exhaust gas leaking from the exhaust pipe portion into the space portion.

In the thermoelectric generator, when exhaust gas leaks into the space portion through a hole generated in the exhaust pipe portion due to corrosion of the exhaust pipe portion, the fault diagnosis means performs fault diagnosis on the thermoelectric generator based on the exhaust gas leaked from the exhaust pipe portion into the space portion.

Thus, the fault diagnosis means reliably detects the exhaust gas leaked into the space portion through the hole formed in the exhaust pipe portion due to corrosion, thereby reliably determining a fault on the thermoelectric generator. This prevents the thermoelectric conversion module from being exposed to the exhaust gas leaked into the space portion for a long time and deteriorating.

Particularly, in a case in which the thermoelectric conversion module is formed of semiconductors and alloys, degradation of the thermoelectric conversion module is prevented.

(2) In the thermoelectric generator according to the above configuration (1), the fault diagnosis means may have an exhaust detecting means located in the space portion and performs fault diagnosis on the thermoelectric generator based on detection information from the exhaust detecting means.

In the thermoelectric generator, the fault diagnosis means performs fault diagnosis on the thermoelectric generator by using the exhaust detecting means located in the space portion. The exhaust detecting means can directly detect the exhaust gas leaked from the exhaust pipe portion into the space portion to find a fault on the thermoelectric generator at an early stage, improving the accuracy of detecting leakage of exhaust gas.

(3) The thermoelectric generator according to the above configuration (1) may be configured such that the space portion is a sealed space, and the fault diagnosis means detects a change in the pressure in the sealed space and performs fault diagnosis on the thermoelectric generator based on the change in the pressure in the sealed space.

In the thermoelectric generator, since the fault diagnosis means detects the change in the pressure in the sealed space and performs fault diagnosis on the thermoelectric generator based on the change in the pressure in the sealed space, leakage of exhaust gas into the space portion through the hole formed in the exhaust pipe portion due to corrosion is reliably detected, thereby reliably detecting a fault on the thermoelectric generator. This prevents the thermoelectric conversion module from being exposed to the exhaust gas leaked into the space portion for a long time and deteriorating.

(4) The thermoelectric generator according to the above configuration (1) or (2) may include a communication pipe having a communication passage that connects the inside of an intake pipe for conducting intake air into an internal combustion engine with the space portion. In this case, the fault diagnosis means performs fault diagnosis on the thermoelectric generator based on detection information from an exhaust detecting means located in an exhaust pipe to which exhaust gas is discharged from the internal combustion engine.

The thermoelectric generator includes the communication pipe having the communication passage, which connects the intake pipe of the internal combustion engine with the space portion. Thus, when exhaust gas leaks into the space portion through the hole formed in the exhaust pipe portion due to corrosion, the exhaust gas leaked into the space portion can be conducted from the intake pipe into the internal combustion engine by the negative pressure generated in the intake pipe, and the exhaust gas conducted into the internal combustion engine can be discharged from the internal combustion engine to the exhaust pipe.

The fault diagnosis means performs fault diagnosis on the thermoelectric generator based on the detection information from the exhaust detecting means in the exhaust pipe. Thus, for example, in the case where exhaust detecting means is an air-fuel ratio sensor provided in the exhaust pipe, if the air-fuel ratio sensor detects that the oxygen concentration of the exhaust gas discharged from the internal combustion engine decreases, the fault diagnosis means can determine that the thermoelectric generator has a fault.

In this manner, a fault on the thermoelectric generator can be determined using the existing exhaust detecting means in the internal combustion engine, preventing an increase in manufacturing costs of the thermoelectric generator.

(5) The thermoelectric generator according to the above configuration (1) or (2) may be configured such that the thermoelectric generator is mounted in an internal combustion engine provided with an exhaust pipe to which exhaust gas is discharged from the internal combustion engine, an intake pipe that conducts intake air into the internal combustion engine, an adsorber having an adsorbent that absorbs evaporated fuel, and a purge pipe having a purge passage that connects the inside of the adsorber with the inside of the intake pipe, wherein the exhaust pipe portion is connected to the exhaust pipe. In this case, the thermoelectric generator further comprises a communication pipe having a communication passage that connects the space portion with the purge passage, and the fault diagnosis means performs fault diagnosis on the thermoelectric generator based on detection information from an exhaust detecting means provided in the exhaust pipe.

The internal combustion engine equipped with the thermoelectric generator includes the purge pipe having the purge passage, which connects the inside of the adsorber having the adsorbent that absorbs evaporated fuel with the inside of the intake pipe, and the communication passage of the communication pipe of the thermoelectric generator connects the space portion with the purge passage.

Thus, when exhaust gas leaks into the space portion through the hole formed in the exhaust pipe portion due to corrosion, the exhaust gas leaked into the space portion can be conducted into the internal combustion engine via the communication pipe, the purge pipe, and the intake pipe by the negative pressure generated in the intake pipe, and the exhaust gas conducted into the internal combustion engine can be discharged from the internal combustion engine to the exhaust pipe.

The fault diagnosis means performs fault diagnosis on the thermoelectric generator based on the detection information from the exhaust detecting means in the exhaust pipe. Thus, for example, in the case where the exhaust detecting means is an air-fuel ratio sensor provided in the exhaust pipe, if the air-fuel ratio sensor detects that the oxygen concentration of the exhaust gas discharged from the internal combustion engine decreases, the fault diagnosis means can determine that the thermoelectric generator has a fault.

In this manner, the fault on the thermoelectric generator can be determined using the existing purge pipe of the adsorber or the existing exhaust detecting means in the internal combustion engine, preventing an increase in manufacturing costs of the thermoelectric generator.

(6) The thermoelectric generator according to the above configuration (5) may be configured such that the internal combustion engine includes an open-close means provided in a section of the purge pipe upstream from a connection between the communication pipe and the purge pipe in the purge gas flow direction. In this case, the open-close means opens and closes the purge passage, and the fault diagnosis means performs fault diagnosis on the thermoelectric generator when the open-close means closes the purge passage.

Since the fault diagnosis means of the thermoelectric generator performs fault diagnosis on the thermoelectric generator when the open-close means closes the purge passage to block communication of the inside of the adsorber with the inside of the intake pipe, the purge gas is prevented from flowing to the intake pipe if exhaust gas leaks into the space portion through a hole formed in the exhaust pipe portion due to corrosion.

Therefore, only the exhaust gas leaked into the space portion can be conducted into the intake pipe, preventing an effect of disturbances (purge gas) on the exhaust detecting means. This improves the accuracy of detecting the exhaust gas leaked into the space portion.

(7) In the thermoelectric generator according to the above configuration (1) or (2), the thermoelectric generator may be mounted in an internal combustion engine provided with an exhaust pipe to which exhaust gas is discharged from the internal combustion engine, an intake pipe that conducts intake air into the internal combustion engine, and an EGR pipe having an EGR passage that connects the inside of the exhaust pipe with the inside of the intake pipe and returns some of the exhaust gas discharged from the exhaust pipe as EGR gas to the intake pipe, wherein the exhaust pipe portion is connected to the exhaust pipe. In this case, the thermoelectric generator further comprises a communication pipe having a communication passage that connects the EGR passage with the space portion, and the fault diagnosis means performs fault diagnosis on the thermoelectric generator based on detection information from an exhaust detecting means provided in the exhaust pipe.

The internal combustion engine equipped with the thermoelectric generator includes the EGR pipe having the EGR passage, which connects the inside of the exhaust pipe with the inside of the intake pipe, and returns some of the exhaust gas discharged from the exhaust pipe as the EGR gas to the intake pipe. The thermoelectric generator includes the communication pipe having the communication passage that connects the EGR passage with the space portion.

Thus, when exhaust gas leaks into the space portion through a hole formed in the exhaust pipe portion due to corrosion, the exhaust gas leaked into the space portion is conducted into the internal combustion engine through the communication pipe, the EGR pipe, and the intake pipe by the negative pressure generated in the intake pipe. The exhaust gas conducted into the internal combustion engine is discharged from the internal combustion engine to the exhaust pipe.

The fault diagnosis means performs fault diagnosis on the thermoelectric generator based on the detection information from the exhaust detecting means in the exhaust pipe. Thus, for example, in the case where the exhaust detecting means is an air-fuel ratio sensor provided in the exhaust pipe, if the air-fuel ratio sensor detects that the oxygen concentration of the exhaust gas discharged from the internal combustion engine decreases, the fault diagnosis means can determine that the thermoelectric generator has a fault.

In this manner, the fault on the thermoelectric generator can be determined using the existing EGR pipe or the existing exhaust detecting means in the internal combustion engine, preventing an increase in manufacturing costs of the thermoelectric generator.

(8) In the thermoelectric generator according to the above configuration (7), the internal combustion engine may include an open-close means provided in a section of the EGR pipe upstream from a connection between the communication pipe and the EGR pipe in the EGR gas flow direction to open and close the EGR pipe, and the fault diagnosis means may perform fault diagnosis on the thermoelectric generator when the open-close means closes the EGR passage.

The fault diagnosis means of the thermoelectric generator performs fault diagnosis on the thermoelectric generator when the open-close means closes the EGR to block communication of the EGR with the communication passage. Thus, the EGR gas is prevented from flowing to the intake pipe if exhaust gas leaks into the space portion through a hole formed in the exhaust pipe portion due to corrosion.

Accordingly, only exhaust gas leaked into the space portion is conducted into the intake pipe, thereby preventing the exhaust detecting means from being affected by disturbances (EGR gas). This increases the accuracy of detecting exhaust gas leaked into the space portion.

(9) In the thermoelectric generator according to the above configuration (1) or (2), the exhaust pipe portion of the thermoelectric generator may be connected to an exhaust pipe to which exhaust gas is discharged from an internal combustion engine, and the exhaust pipe may include a large-diameter portion and a small-diameter portion configured to be located downstream from the large-diameter portion and have a smaller inner diameter than the large-diameter portion. Also, the thermoelectric generator may include a communication pipe having a communication passage having a first end in connection with the inside of the small-diameter portion and a second end in connection with the space portion. Further, the fault diagnosis means may perform fault diagnosis on the thermoelectric generator based on detection information from an exhaust detecting means provided in the small-diameter portion downstream from the first end of the communication pipe.

In the internal combustion engine equipped with the thermoelectric generator, a part of the exhaust pipe, which is connected to the upstream side of the exhaust pipe portion, includes the large-diameter portion and the small-diameter portion located downstream from the large-diameter portion, and the thermoelectric generator includes the communication pipe having the communication passage having the first end communicating with the inside of the small-diameter portion and the second end communicating with the space portion. Thus, the flow rate of the exhaust gas flowing through the small-diameter portion increases, generating a negative pressure in the small-diameter portion by the Venturi effect.

When exhaust gas leaks into the space portion through a hole formed in the exhaust pipe portion due to corrosion, the exhaust gas leaked into the space portion is conducted from the space portion into the intake pipe by the negative pressure generated in the small-diameter portion.

The fault diagnosis means performs fault diagnosis on the thermoelectric generator based on the detection information from the exhaust detecting means in the exhaust pipe. Thus, for example, in the case where the exhaust detecting means is an oxygen concentration sensor provided in the exhaust pipe, if the oxygen sensor detects that the oxygen concentration of the exhaust gas discharged from the internal combustion engine decreases, the fault diagnosis means can determine that the thermoelectric generator has a fault.

In this manner, the fault on the thermoelectric generator can be determined using the existing exhaust detecting means in the internal combustion engine, preventing an increase in manufacturing costs of the thermoelectric generator.

(10) In the thermoelectric generator according to any one of the above configurations (4) to (9), the fault diagnosis means may perform fault diagnosis on the thermoelectric generator after stop of supply of fuel to the internal combustion engine.

In the thermoelectric generator, when supply of fuel to the internal combustion engine stops, the flow rate of the exhaust gas discharged from the internal combustion engine decreases. For this reason, in the case where exhaust gas leaks into the space portion through a hole formed in the exhaust pipe portion due to corrosion, if the fault diagnosis means performs fault diagnosis on the thermoelectric generator after supply of fuel to the internal combustion engine, the exhaust detecting means detects only the exhaust gas leaked into the space portion.

Therefore, the exhaust detecting means is prevented from being affected by disturbances (mixture of fuel and intake air). This increases the accuracy of detecting exhaust gas leaked into the space portion.

(11) In the thermoelectric generator according to any one of the above configurations (1) to (10), the fault diagnosis means may have an alarm member that issues an alarm when the fault diagnosis means determines that the thermoelectric generator has a fault.

The fault diagnosis means of the thermoelectric generator has the alarm member that issues an alarm if the fault diagnosis means determines that the thermoelectric generator has a fault. Thus, a fault on the thermoelectric generator can be informed to the occupant, urging the occupant to repair or replace the thermoelectric generator. This reliably prevents deterioration of the thermoelectric conversion module.

(12) In the thermoelectric generator according to any one of the above configurations (1) to (11), the space portion may be a sealed space that is defined by partitions provided in the exhaust pipe portion and the cooling portion and is isolated from the atmosphere.

In the thermoelectric generator, the space portion is formed of the sealed space that is defined by the partitions provided at the exhaust pipe portion and the cooling portion and is isolated from the atmosphere. Thus, exhaust gas leaked into the space portion is prevented from leaking from the sealed space to the atmosphere through a hole formed in the exhaust pipe portion due to corrosion.

Therefore, a great amount of exhaust gas can be confined in the sealed space, increasing the accuracy in which the fault diagnosis means detects exhaust gas.

(13) In the thermoelectric generator according to any one of the above configurations (1) to (12), the cooling medium may be formed of coolant flowing through the cooling portion.

In the thermoelectric generator, coolant flows in the cooling portion. Thus, if the cooling portion corrodes due to condensed water of the exhaust gas discharged to the space portion with time to form a hole therein, the coolant can leak from the cooling portion to lower the cooling performance of the internal combustion engine.

According to the present invention, the fault diagnosis means determines a fault of the thermoelectric generator based on exhaust gas leaked into the space portion at an early stage, thereby determining a fault of the thermoelectric generator before formation of a hole in the cooling portion. This reliably prevents coolant from leaking from the cooling portion and thus reliably prevents lowering of the cooling performance of the internal combustion engine.

(14) In the thermoelectric generator according to the above configuration (3), in a case in which a pressure in the absence of leakage of fluid into the sealed space is a reference pressure, the fault diagnosis means may determine that the fluid leaks into the sealed space if a differential pressure between the reference pressure and a pressure in the sealed space is equal to or larger than a predetermined threshold.

The fault diagnosis means of the thermoelectric generator determines leakage of fluid in the sealed space if the differential pressure between the reference pressure in the absence of the leakage of fluid in the sealed space and the pressure in the sealed space is equal to or larger than the predetermined threshold. Thus, the leakage of fluid in the sealed space is readily determined at an early stage.

(15) In the thermoelectric generator according to the above configuration (14), the fault diagnosis means may correct the reference pressure depending on a temperature of the sealed space and compares the corrected reference pressure with the pressure in the sealed space.

If the reference pressure were a fixed value, changes in the temperature of the sealed space would change the true value of the reference pressure, and the reference pressure (fixed value) would deviate from the true value. In this case, the reference pressure (fixed value) can be close to the pressure in the sealed space in the presence of leakage of exhaust gas into the sealed space. In the case where the reference pressure (fixed value) is close to the pressure in the sealed space in the presence of leakage of exhaust gas into the sealed space in this manner, it is difficult to compare the pressure with the reference pressure to determine leakage of exhaust gas.

According to the present invention, the fault diagnosis means corrects the reference pressure depending on the temperature of the sealed space, preventing the reference pressure from deviating from the true value due to the change in the temperature of the sealed space, and compares the reference pressure in the sealed space higher or lower than the atmospheric pressure and the pressure in the sealed space in the presence of leakage of fluid into the sealed space, thereby reliably determining the leakage of the fluid. This improves the accuracy of detecting the fluid leakage.

(16) In the thermoelectric generator according to the above configuration (14) or (15), the fault diagnosis means may have an alarm member that issues an alarm when the fault diagnosis means determines that fluid leaks into the sealed space.

The alarm device of the thermoelectric generator issues an alarm if the fault diagnosis means determines that fluid leaks into the sealed space, thereby informing the user of the leakage of fluid into the sealed space and urging the user to repair or replace the thermoelectric generator.

(17) In the thermoelectric generator according to any one of the above configurations (14) to (16), the fault diagnosis means may include a pressure sensor located in the sealed space or a communication pipe having a sealed communication passage in communication with the sealed space and determine whether fluid leaks into the sealed space based on detection information from the pressure sensor.

In the thermoelectric generator, the fault diagnosis means determines leakage of fluid into the sealed space by the pressure sensor under the same pressure as the pressure in the sealed space. Thus, the change in the pressure in the sealed space is detected with high accuracy, improving the accuracy of determining fluid leakage.

Effects of the Invention

The present invention provides a thermoelectric generator capable of detecting leakage of exhaust gas into the space portion in which a thermoelectric conversion module is arranged and performing fault diagnosis on the thermoelectric generator.

EMBODIMENTS OF THE INVENTION

Embodiments of a thermoelectric generator according to the present invention will be described below with reference to the drawings. In the embodiments, the thermoelectric generator is used for a water-cooled multi-cylinder internal combustion engine mounted in vehicles such as automobiles, for example, 4-cycle gasoline engine (hereinafter merely referred to as engine). The engine is not limited to the gasoline engine.

First Embodiment

FIGS. 1 to 6 are diagrams illustrating a first embodiment of the thermoelectric generator according to the present invention.

First, the configuration will be described.

Figure 1:
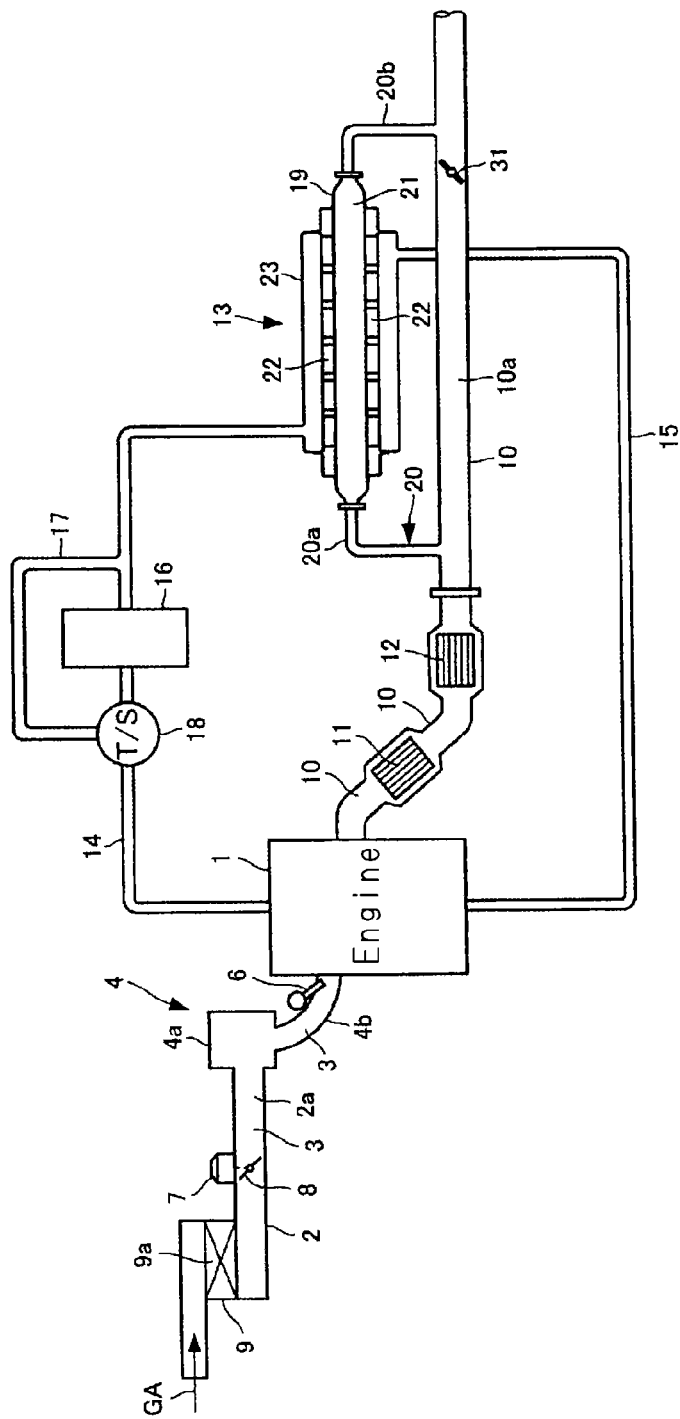
FIG. 1 is a schematic configuration diagram illustrating a vehicle provided with a thermoelectric generator in accordance with a first embodiment of the present invention.

In FIG. 1, an engine 1 as an internal combustion engine is provided with an intake pipe 2 in which an intake passage 3 is formed. The intake pipe 2 serves to conduct intake air into a combustion chamber of each cylinder of the engine 1 through an intake manifold 4.

The intake manifold 4 includes a surge tank 4a connected to the intake pipe 2, and a plurality of branch pipes 4b (only one is shown) that branch off the surge tank 4a and conduct intake air into the combustion chamber of each cylinder of the engine 1. Each of the branch pipes 4b is provided with an injector 6 for injecting fuel supplied from a fuel tank (not shown).

The branch pipes 4b are provided according to the number of cylinders of the engine 1 and accordingly, four branch pipes 4b are provided in a 4-cylinder engine. The inside of the intake manifold 4 communicates with the intake pipe 2, so that the intake passage 3 is continuous through the inside of the intake passage 3 and the inside of the intake manifold 4. In other words, the intake pipe 2 and the intake manifold 4 constitute the intake pipe.

A throttle valve 8 is provided a section of the intake pipe 2 that is upstream from the surge tank 4a. The throttle valve 8 adjusts the opening degree of the intake passage 3 by a motor 7 to adjust the amount of intake air drawn into the engine 1.

An air cleaner 9 is provided in a section of the intake pipe 2 that is upstream from the throttle valve 8 in the intake direction. The air cleaner 9 has an air filter 9a therein for removing minute dusts in air drawn into the intake pipe 2. In FIG. 1, the air intake direction is expressed by GA.

An exhaust pipe 10 having an exhaust passage 10a is connected to the engine 1. Exhaust gas burnt in the combustion chamber of each cylinder of the engine 1 is discharged through the exhaust passage 10a. The exhaust pipe 10 is connected to the engine 1 via an exhaust manifold, through which exhaust gas from the combustion chamber of each cylinder of the engine 1 is discharged.

Two catalysts 11 and 12 are serially arranged in the exhaust pipe 10 to purify exhaust gas.

Out of the catalysts 11 and 12, the catalyst 11 arranged on the upstream side in the exhaust pipe 10 in the exhaust-gas exhaust direction is called a start catalyst (S/C), and the catalyst 12 arranged on the downstream side in the exhaust pipe 10 in the exhaust-gas exhaust direction is called a main catalyst (M/C) or a underfloor catalyst (U/F).

The catalysts 11 and 12 are each formed of a three-way catalyst, for example. The three-way catalysts have a purifying effect of collectively converting carbon monoxide (CO), hydrocarbon (HC), and nitrogen oxide (NOx) into harmless components by chemical reaction.

A water jacket is formed in the engine 1, and the water jacket is filled with cooling liquid called long life coolant (LLC) (hereinafter merely referred to as coolant).

The coolant is led out through a lead-out pipe 14 attached to the engine 1 and then, is conducted into a coolant pipe of a below-mentioned thermoelectric generator 13 to return to the engine 1 through the coolant pipe and a reflux pipe 15. The lead-out pipe 14 is provided with a radiator 16, and the radiator 16 cools coolant through the lead-out pipe 14.

The lead-out pipe 14 is provided with a bypass pipe 17, which bypasses the radiator 16 and is connected to the lead-out pipe 14 downstream from the radiator 16. A thermostat 18 is provided at a connection of the lead-out pipe 14 and the bypass pipe 17, and serves to adjust the amount of coolant flowing through the radiator 16 and the amount of coolant flowing through the bypass pipe 17.

For example, during warming up of the engine 1, the amount of coolant on the side of the bypass pipe 17 is increased to promote warming up. After completion of warming up, the amount of coolant on the side of the bypass pipe 17 is decreased or coolant is not delivered to the bypass pipe 17 to improve the cooling performance of the engine 1.

The exhaust pipe 10 is provided with the thermoelectric generator 13, which serves to collect heat of the exhaust gas discharged from the engine 1 and convert thermal energy of the exhaust gas into electric energy.

Figure 2:
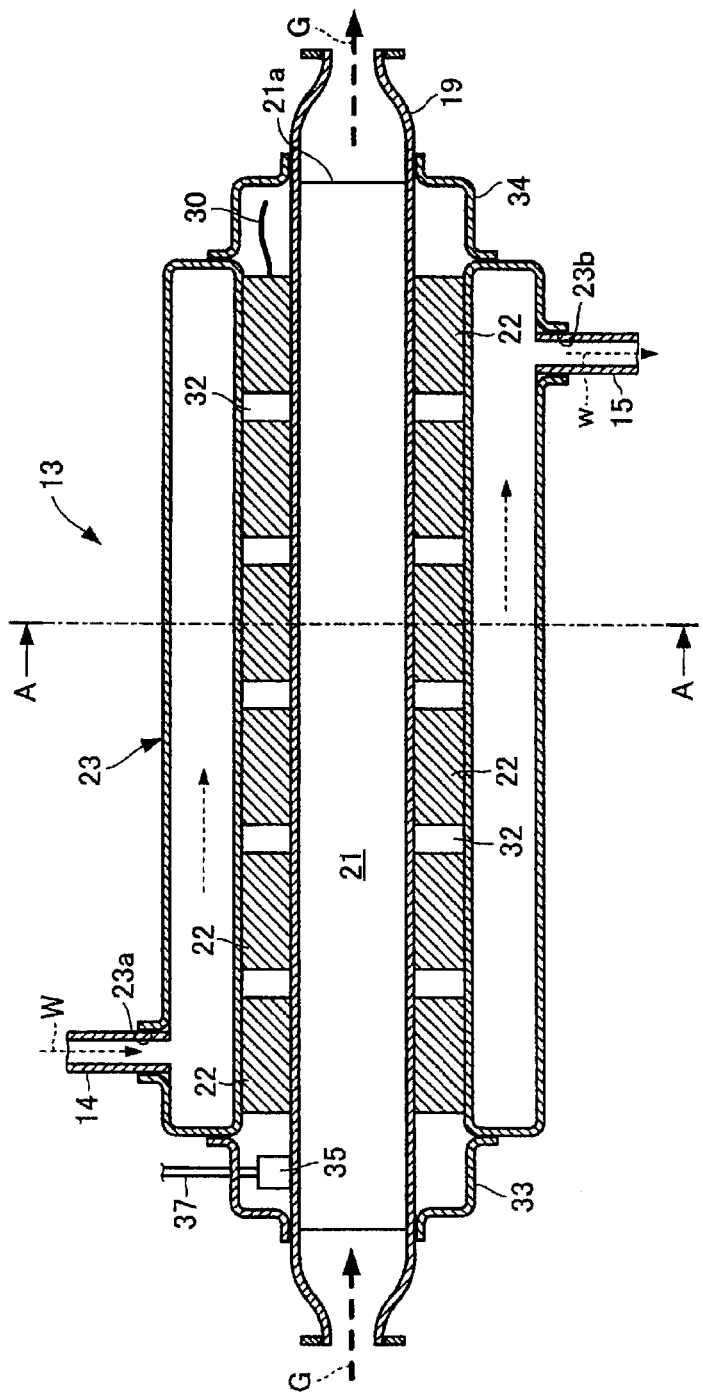
FIG. 2 is a cross-sectional side view illustrating the thermoelectric generator in accordance with the first embodiment of the present invention.
Figure 3:
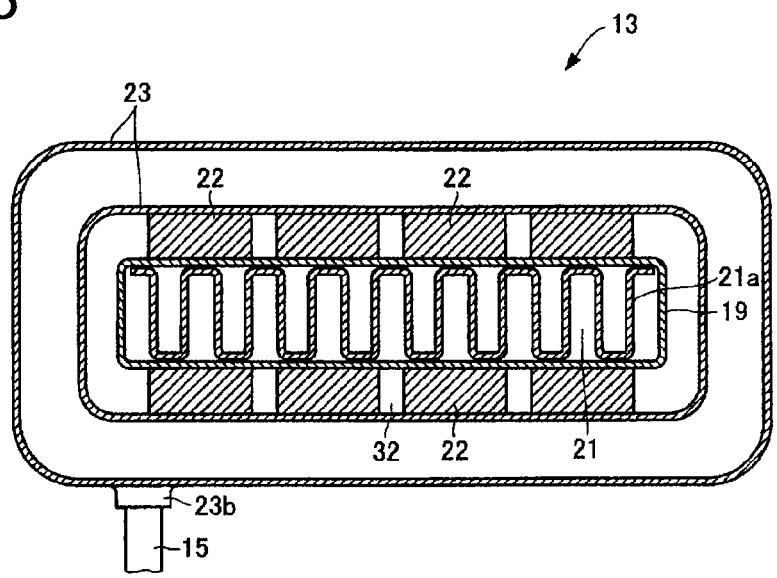
FIG. 3 is a cross-sectional view taken along line A-A in FIG. 2, illustrating the thermoelectric generator in accordance with the first embodiment of the present invention.

As shown in FIGS. 1 to 3, the thermoelectric generator 13 includes a small-diameter exhaust pipe portion 19 into which the exhaust gas G discharged from the engine 1 is conducted.

The upstream end of the exhaust pipe portion 19 is connected to an upstream pipe portion 20a of a bypass pipe 20, and the downstream end of the exhaust pipe portion 19 is connected to a downstream pipe portion 20b of the bypass pipe 20. The exhaust pipe portion 19 has an exhaust passage 21 therein, into which the exhaust gas G conducted from the exhaust pipe 10 into the upstream pipe portion 20a of the bypass pipe 20, is conducted.

The exhaust passage 21 discharges the exhaust gas G into the exhaust pipe 10 through the downstream pipe portion 20b of the bypass pipe 20.

Thus, the exhaust gas G discharged from the engine 1 into the exhaust passage 21 of the exhaust pipe portion 19 through the exhaust pipe 10 is discharged to the outside through the exhaust pipe 10 again.

The thermoelectric generator 13 includes a plurality of thermoelectric conversion modules 22 installed in the exhaust direction of the exhaust gas G, and a cylindrical coolant pipe 23 that is a cooling portion provided coaxially with the exhaust pipe portion 19.

Figure 4:
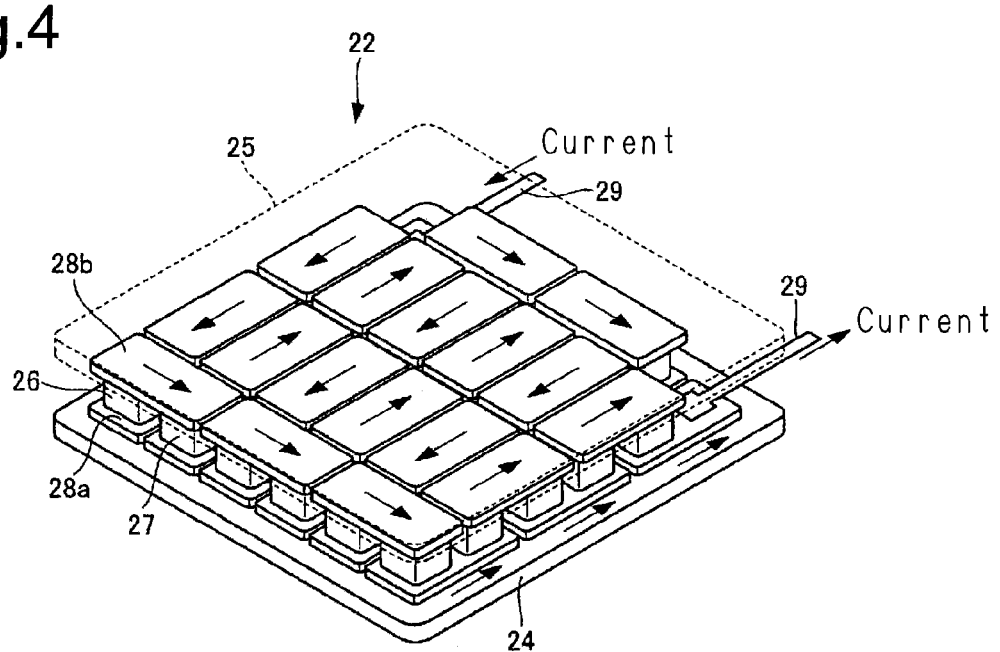
FIG. 4 is a perspective view illustrating a thermoelectric conversion module of the thermoelectric generator in accordance with the first embodiment of the present invention.

As shown in FIG. 4, in each of the thermoelectric conversion modules 22, a plurality of N-type thermoelectric conversion elements 26 and a plurality of P-type thermoelectric conversion elements 27 are arranged between an insulating ceramic heating boards 24 constituting a high-temperature part and an insulating ceramic radiating board 25 constituting a low-temperature part. The N-type thermoelectric conversion elements 26 and the P-type thermoelectric conversion elements 27 generate an electromotive force corresponding to a temperature difference by the Seebeck effect. The N-type thermoelectric conversion elements 26 and the P-type thermoelectric conversion elements 27 are connected alternatively and serially via electrodes 28a and 28b. The adjacent thermoelectric conversion modules 22 are electrically connected to each other via a wire 29.

Examples of the N-type thermoelectric conversion elements 26 and the P-type thermoelectric conversion elements 27 include Bi—Te-based thermoelectric conversion elements having a usage upper limit (heatproof temperature) of about 300° C. of the high-temperature part and Si—Ge-based thermoelectric conversion elements having a usage upper limit of about 500° C. of the high-temperature part.

In FIGS. 1 to 3, the heating boards 24, the radiating boards 25, the N-type thermoelectric conversion elements 26, the P-type thermoelectric conversion elements 27, and the electrodes 28a and 28b are omitted to simplify the thermoelectric conversion modules 22. In fact, the heating boards 24 are opposed to and contact the exhaust pipe portion 19, and the radiating boards 25 are opposed to and contact the coolant pipe 23.

The thermoelectric conversion elements are not limited to the N-type thermoelectric conversion elements 26 and the P-type thermoelectric conversion elements 27, which are semiconductors, and may be formed of alloys such as N-type Fe-based Si alloys and Fe-based Al alloys.

The thermoelectric conversion modules 22 of the present embodiment are each shaped like a substantially square plate and need to in close contact with the exhaust pipe portion 19 and the coolant pipe 23. Thus, the exhaust pipe portion 19 and the coolant pipe 23 are rectangular.

The exhaust pipe portion 19 and the coolant pipe 23 may be circular. In this case, the heating boards 24 and the radiating boards 25 of the thermoelectric conversion modules 22 may be curved.

As shown in FIGS. 2 and 3, the exhaust passage 21 of the exhaust pipe portion 19 is provided with comb-like heat transfer member 21a. The heat transfer member 21a is bent along the width of the exhaust pipe portion 19, and extends in the longitudinal direction of the exhaust pipe portion 19, such that bent portions of upper ends and lower ends contact the inner circumferential upper surface and the inner circumferential lower surface of the exhaust pipe portion 19, respectively, so as to be opposed to the heating boards 24.

For this reason, heat of the exhaust gas flowing through the exhaust passage 21 is efficiently transferred to the heating boards 24 along the heat transfer member 21a.

The coolant pipe 23 includes a coolant inlet portion 23a coupled to the lead-out pipe 14 and a coolant outlet portion 23b coupled to the reflux pipe 15.

The coolant pipe 23 is arranged such that the coolant outlet portion 23b is provided downstream from the coolant inlet portion 23a in the exhaust direction. This allows coolant W as cooling medium to be conducted from the coolant inlet portion 23a into the coolant pipe 23 and flow in the same direction as the exhaust direction of the exhaust gas G. As a result, the coolant W flows in the same direction as the flowing direction of the exhaust gas G through the exhaust pipe portion 19.

The coolant pipe 23 may be arranged such that the coolant outlet portion 23b is provided upstream from the coolant inlet portion 23a in the exhaust direction. In this case, coolant conducted from the coolant inlet portion 23a into the coolant pipe 23 flows in the opposite direction to the exhaust direction of the exhaust gas G.

As shown in FIG. 1, the exhaust pipe 10 is provided with an on-off valve 31, and the on-off valve 31 is provided between the upstream pipe portion 20a and the downstream pipe portion 20b of the bypass pipe 20, and is rotationally attached to the exhaust pipe 10 to open/close the exhaust pipe 10. The on-off valve 31 is automatically opened and closed according to the pressure of exhaust gas flowing through the exhaust pipe 10.

That is, during idling and in the low and middle speed range of the engine 1, the on-off valve 31 closes the exhaust passage 10a of the exhaust pipe 10, thereby conducting the exhaust gas conducted into the exhaust passage 10a into the exhaust pipe portion 19 through the exhaust passage 21 of the bypass pipe 20.

In the high-speed range of the engine 1, the on-off valve 31 is opened by high-pressure exhaust gas to open the exhaust passage 10a, and discharges the exhaust gas through the exhaust passage 10a, not through the exhaust passage 21, thereby preventing an increase in the back pressure of the exhaust gas to prevent a fall in the exhaust performance.

In the high-speed range of the engine 1, by adjusting the opening degree of the on-off valve 31 to a predetermined opening degree, some of the exhaust gas may be conducted into the exhaust pipe portion 19 through the bypass pipe 20. In this manner, the thermoelectric generator 13 can perform thermoelectric generation while preventing an increase in the back pressure of the exhaust gas. The on-off valve 31 may be opened and closed according to the operation state of the engine 1 by an actuator.

A space between the exhaust pipe portion 19 and the coolant pipe 23 defines a module chamber 32 that is a space portion as a sealed space in which the thermoelectric conversion modules 22 are mounted. That is, a plate 33 is attached between the upstream side of the exhaust pipe portion 19 and the coolant pipe 23 to close the upstream end of the module chamber 32.

A plate 34 is provided between the downstream side of the exhaust pipe portion 19 and the coolant pipe 23 to close the downstream end of the module chamber 32. Accordingly, the module chamber 32 is formed of a sealed space that is surrounded by the outer circumference of the exhaust pipe portion 19, the inner circumference of the coolant pipe 23, and the plates 33 and 34, and is isolated from the atmosphere. In the thermoelectric generator 13 of the present embodiment, the plates 33 and 34 constitute partitions provided on the exhaust pipe portion 19 and the coolant pipe 23.

Figure 5:
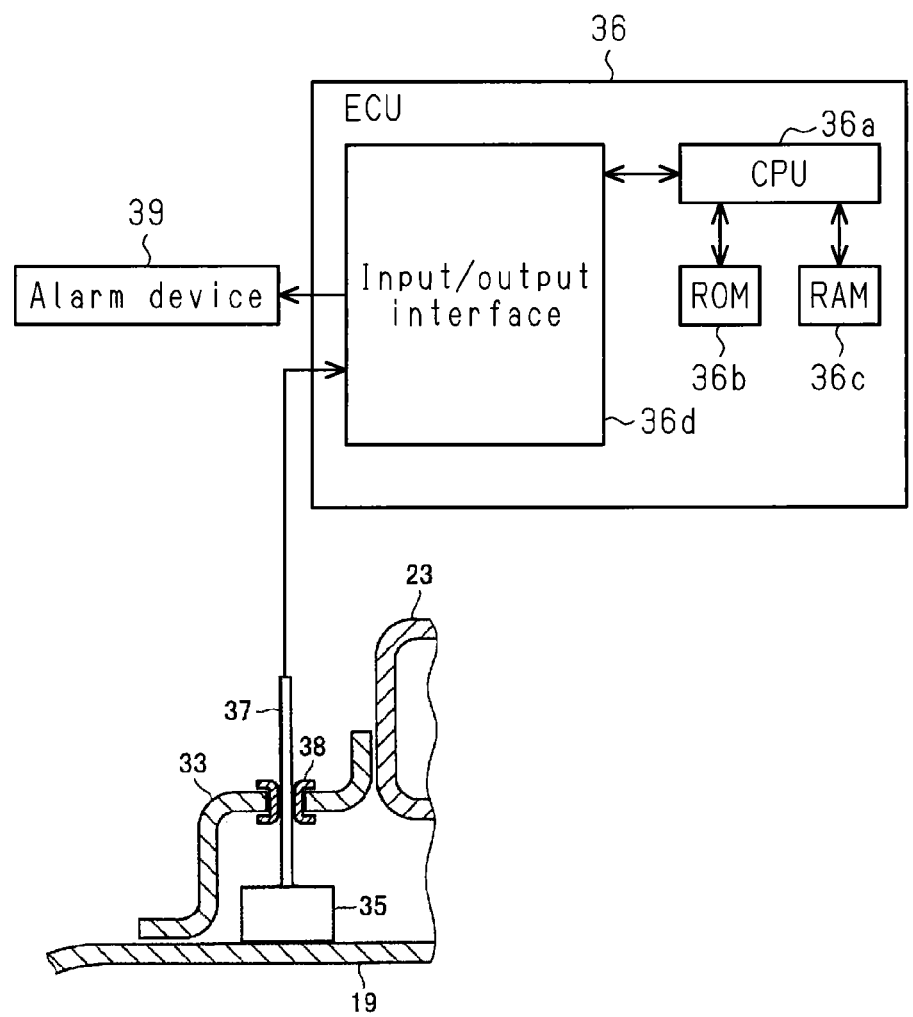
FIG. 5 is a cross-sectional view illustrating a main portion of the thermoelectric generator in accordance with the first embodiment of the present invention.

As shown in FIGS. 2 and 5, the module chamber 32 is provided with an HC (hydrocarbon) sensor 35, which is an exhaust detecting means (or exhaust gas detection portion), and the HC sensor 35 detects HC contained in the exhaust gas.

A wire 37 of the HC sensor 35 is drawn out of the module chamber 32 through the inner circumference of a sealing member 38 that seals an opening in the plate 33. The module chamber 32 is sealed with the sealing member 38. Thus, the module chamber 32 is isolated from outside air, and keeps its sealed state.

As shown in FIG. 5, an ECU 36 includes a central processing unit (CPU) 36a, a read only memory (ROM) 36b, a random access memory (RAM) 36c, and an input/output interface 36d to constitute an electronic control circuit.

At manufacturing the thermoelectric generator 13, the module chamber 32 is filled with inert gas such as argon or helium to be oxygen-free, preventing oxidation of the thermoelectric conversion modules 22.

The HC sensor 35 detects HC in the module chamber 32, and outputs detection information to the ECU 36. An initial output value of the HC sensor 35 is set to an output value P1, and if a current output value P2 of the HC sensor 35 becomes larger than the output value P1 by a threshold Pa or more, the ECU 36 determines that the exhaust gas is conducted into the module chamber 32.

If the ECU 36 detects that the exhaust gas is conducted into the module chamber 32 based on the detection information sent from the HC sensor 35, the ECU 36 diagnoses that there is leakage of the exhaust gas in the module chamber 32, and outputs a fault signal to an alarm device 39 as an alarm member.

The alarm device 39 is configured of an indication lamp, a beeper, an audio speaker, or the like, and is provided on an instrument panel. When receiving a fault signal from the ECU 36, the alarm device 39 visually or audibly issues an alarm about the fault of the thermoelectric generator 13 to the vehicle occupant, who is the user.

In the thermoelectric generator 13 of the present embodiment, the HC sensor 35 and the alarm device 39 constitute a fault diagnosis means (or fault diagnosis portion).

Next, operation will be described.

At cold start of the engine 1, all of the catalysts 11 and 12 and coolant of the engine 1 are at a low temperature (at about the outside temperature).

When the engine 1 starts in this state, the exhaust gas is discharged from the engine 1 to the exhaust passage 10a of the exhaust pipe 10, and the two catalysts 11 and 12 are heated by the exhaust gas G.

The coolant is returned to the engine 1 through the bypass pipe 20, the coolant pipe 23, and the reflux pipe 15 without passing the radiator 16, to achieve warming up.

At cold start of the engine 1, for example, the pressure of exhaust gas is low with the engine 1 at idling and thus, the on-off valve 31 is closed.

Accordingly, the exhaust gas G conducted from the exhaust passage 10a into the bypass pipe 20 is conducted into the exhaust passage 21, and the exhaust gas G flowing through the exhaust passage 21 heats the coolant W flowing through the coolant pipe 23, promoting warming up of the engine 1.

In the low and middle speed range of the engine 1 after warming of the engine 1, even when the temperature of the exhaust gas is high, the on-off valve 31 is closed. Accordingly, the exhaust gas G is conducted from the exhaust passage 10a into the exhaust passage 21 through the bypass pipe 20.

At this time, the hot exhaust gas flowing through the exhaust passage 21 acts on the heating boards 24 of the thermoelectric conversion modules 22, and the cold coolant flowing through the coolant pipe 23 acts on the radiating boards 25 of the thermoelectric conversion modules 22. Accordingly, the temperature difference between the heating boards 24 and the radiating boards 25 of the thermoelectric conversion modules 22 generates electric power. The generated electric power is supplied to a battery via a cable 30, and is charged in the battery.

In the high-speed range of the engine 1, it is required to improve the cooling performance of the engine 1. In the high-speed range of the engine 1, for example, the engine 1 operates at high speed to increase the pressure of the exhaust gas and thus, the pressure of the exhaust gas G conducted into the exhaust passage 10a becomes high to open the on-off valve 31.

When the on-off valve 31 is opened, the exhaust gas is discharged to the outside through the exhaust passage 10a without being conducted into the bypass pipe 20. Thus, hot exhaust gas does not heat the coolant W flowing through the coolant pipe 23.

Since the thermostat 18 blocks communication of the bypass pipe 20 with the reflux pipe 15 at this time, coolant led out from the engine 1 through the lead-out pipe 14 is conducted into the reflux pipe 15 via the radiator 16. As a result, cold coolant is supplied to the engine 1, improving the cooling performance of the engine 1.

In the high-speed range of the engine 1, since the on-off valve 31 is opened, the back pressure of the exhaust gas flowing through the exhaust passage 10a is prevented from increasing, preventing a fall in the exhaust performance of exhaust gas.

Even when the exhaust pipe portion 19 and the heat transfer member 21a are formed of corrosion-resistant stainless steel plate, in regions where fuel having a high sulfur content is used, acidic condensed water is generated in the exhaust passage 21, and a hole may be made in the exhaust pipe portion 19 by the corrosive action of condensed water.

In this case, the thermoelectric conversion modules 22 may be exposed to exhaust gas leaked from the exhaust pipe portion 19 into the module chamber 32, and may deteriorate to lower its power generation efficiency.

The coolant pipe 23 may corrode with time due to the condensed water leaked into the module chamber 32, causing leakage of coolant from the coolant pipe 23 to lower the cooling performance of the engine 1.

When exhaust gas leaks into the module chamber 32, the atmosphere in the module chamber 32 changes, and HC contained in the exhaust gas is conducted into the module chamber 32.

In the thermoelectric generator 13 of the present embodiment, the module chamber 32 is provided with the HC sensor 35, and when the HC sensor 35 detects HC contained in the exhaust gas conducted into the module chamber 32, the ECU 36 diagnoses that there is a fault of the thermoelectric generator 13 based on the detection information from the HC sensor 35.

Figure 6:
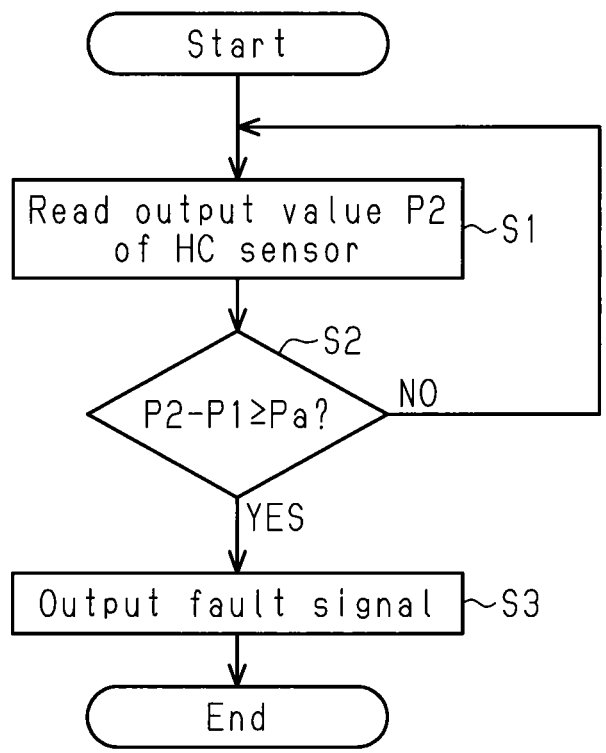
FIG. 6 is a flowchart illustrating a fault diagnosis program executed in the thermoelectric generator in accordance with the first embodiment of the present invention.

FIG. 6 is a flowchart of a fault diagnosis program executed by the ECU 36, and the fault diagnosis program is stored in the ROM 36b of the ECU 36, and is executed at regular intervals by the CPU 36a.

The ECU 36 reads the output value P2 from the HC sensor 35 (Step S1), and determines whether the difference between the output value P2 and a predetermined output value P1, that is, the initial output value P1 of the HC sensor 35 is the threshold Pa or more (Step S2).

If the ECU 36 determines that the difference between the output values P1 and P2 is less than the threshold Pa, the ECU 36 determines that no hole is formed in the exhaust pipe portion 19 due to corrosion and the thermoelectric generator 13 has no fault, and returns to Step S1.

If the ECU 36 determines that the difference between the output values P1 and P2 is the threshold Pa or more, the ECU 36 determines that a hole is formed in the exhaust pipe portion 19 due to corrosion and the thermoelectric generator 13 has a fault, outputs a fault signal to the alarm device 39 (Step S3), and finishes the current processing.

When receiving a fault signal, the alarm device 39 issues an alert to the occupant using an indication lamp, a beeper, an audio speaker, or the like.

As described above, in the thermoelectric generator 13 of the present embodiment, the module chamber 32 is provided with the HC sensor 35, and the ECU 36 detects the exhaust gas leaked from the exhaust pipe portion 19 into the module chamber 32 based on the detection information from the HC sensor 35 to perform fault diagnosis on the thermoelectric generator 13.

As described above, leakage of the exhaust gas into the module chamber 32 through the hole formed in the exhaust pipe portion 19 due to corrosion is reliably detected. This allows fault diagnosis on the thermoelectric generator 13 to be reliably performed. Therefore, it is possible to prevent the thermoelectric conversion modules 22 being exposed to the exhaust gas leaked into the module chamber 32 for a long time and deteriorating.

Particularly, in a case in which the thermoelectric conversion modules 22 are formed of semiconductors or alloy, degradation of the thermoelectric conversion modules 22 is prevented.

In the thermoelectric generator 13 of the present embodiment, the module chamber 32 is provided with the HC sensor 35, and the ECU 36 directly detects the exhaust gas leaked from the exhaust pipe portion 19 into the module chamber 32 by the HC sensor 35. Thus, fault diagnosis on the thermoelectric generator 13 can be detected at an early stage to improve the accuracy of detecting leakage of the exhaust gas.

In the thermoelectric generator 13 of the present embodiment, the alarm device 39 issues an alert if the ECU 36 determines that the thermoelectric generator 13 has a fault. Thus, the vehicle occupant can be informed of the fault of the thermoelectric generator 13, thereby urging the occupant to repair or replace the thermoelectric generator 13. This reliably prevents deterioration of the thermoelectric conversion modules 22.

The module chamber 32 of the present embodiment is formed of the sealed space that is defined by the plates 33 and 34 provided at the exhaust pipe portion 19 and the coolant pipe 23, and is isolated from the atmosphere. Thus, the exhaust gas leaked into the module chamber 32 through a hole formed in the exhaust pipe portion 19 due to corrosion is prevented from leaking from the module chamber 32 to the atmosphere.

Thus, much of exhaust gas can be confined in the module chamber 32 to improve the accuracy in which the ECU 36 detects exhaust gas.

In the present embodiment, cooling medium is coolant flowing through the coolant pipe 23. Thus, when the coolant pipe 23 corrodes with time due to condensed water of exhaust gas discharged into the module chamber 32 and a hole is made in the coolant pipe, the coolant may leak from the coolant pipe 23 to lower the cooling performance of the engine 1.

The ECU 36 of the present embodiment can detect a fault of the thermoelectric generator 13 at an early stage based on the exhaust gas leaked into the module chamber 32, enabling fault diagnosis on the thermoelectric generator 13 before the formation of a hole in the coolant pipe 23. This reliably prevents coolant from leaking from the coolant pipe 23 and thus reliably prevents lowering of the cooling performance of the engine 1.

Although the HC sensor 35 is used in the present embodiment, any sensor capable of detecting the exhaust gas conducted into the module chamber 32 may be used. For example, an air-fuel ratio sensor that detects the air-fuel ratio of a mixture of fuel and intake air, or a NOx sensor that detects nitrogen oxides contained in the exhaust gas may be used.

In thermoelectric generator 13 of the present embodiment, the module chamber 32 is formed of a sealed space. However, the present invention is not limited to this, but a part of the module chamber 32 may communicate with the atmosphere.

The HC sensor 35 of the present embodiment is provided directly in the module chamber 32. Thus, even when some of the exhaust gas leaked from the exhaust pipe portion 19 into the module chamber 32 leaks to the atmosphere, the HC sensor 35 is exposed to the exhaust gas to detect the exhaust gas, enabling the detection of the exhaust gas in the module chamber 32.

The module chamber 32 may be provided with an oxygen sensor in place of the HC sensor 35. In this case, the ECU 36 performs fault diagnosis on the thermoelectric generator 13 when supply of fuel from the injector 6 stops. Thereby, the oxygen sensor reliably detects a change in oxygen concentration in the module chamber 32, reliably determining a fault of the thermoelectric generator 13.

Second Embodiment

FIGS. 7 to 12 are diagrams illustrating a thermoelectric generator in accordance with a second embodiment of the present invention, and the same components as those in the first embodiment are given the same reference numerals and description thereof is omitted.

Figure 7:
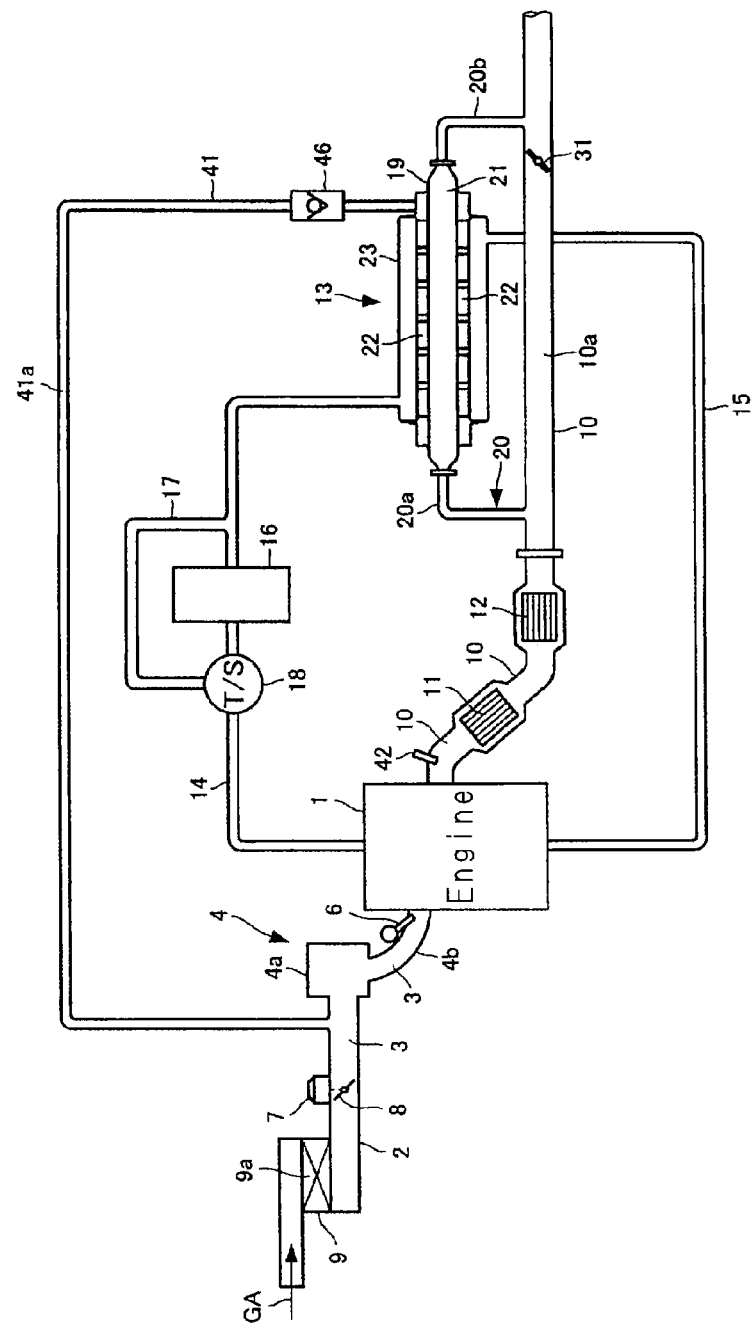
FIG. 7 is a schematic configuration view illustrating a vehicle provided with a thermoelectric generator in accordance with a second embodiment of the present invention.
Figure 8:
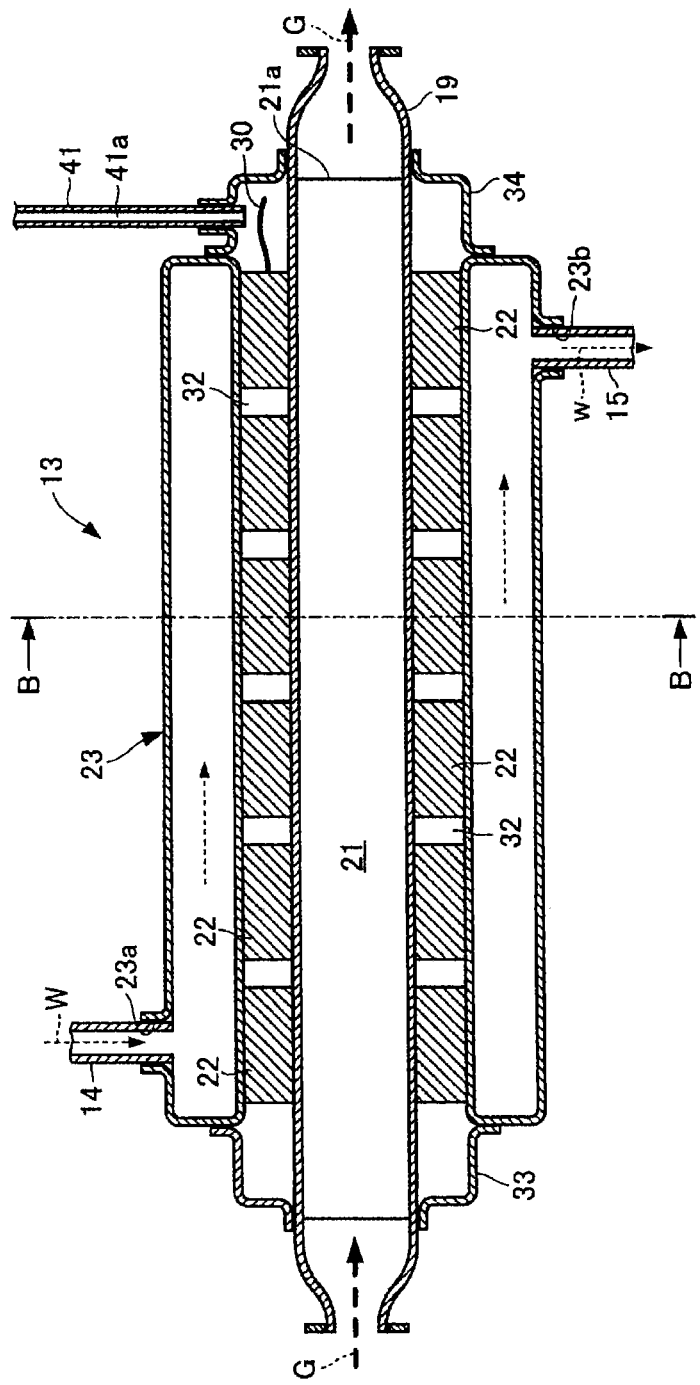
FIG. 8 is a cross-sectional side view illustrating the thermoelectric generator in accordance with the second embodiment of the present invention.
Figure 9:
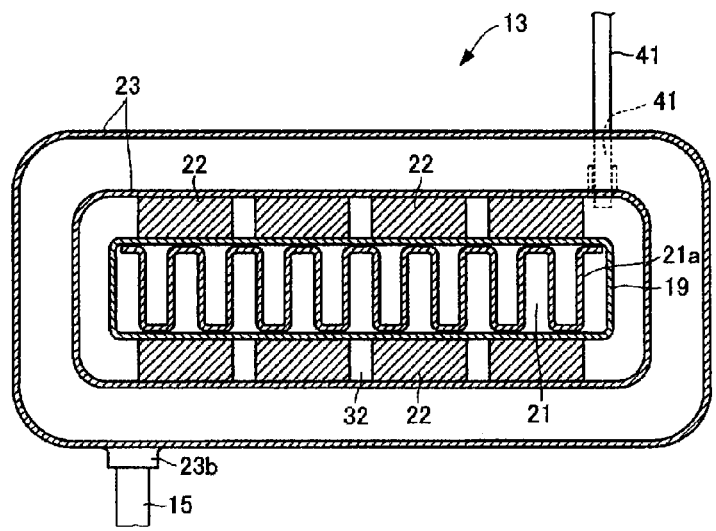
FIG. 9 is a cross-sectional view taken along line B-B in FIG. 8, illustrating the thermoelectric generator in accordance with the second embodiment of the present invention.

In FIGS. 7 to 9, a thermoelectric generator 13 includes a pipe 41, which is a communication pipe connecting the plate 34 to the intake pipe 2. The pipe 41 has a communication passage 41a that allows the intake passage 3 to communicate with the module chamber 32.

The pipe 41 is provided with a one-way valve 46, which opens when exhaust gas flows from the module chamber 32 to the intake passage 3, and closes when intake air flows from the intake passage 3 to the module chamber 32.

Thus, when the engine 1 is in stopped state and the intake passage 3 and the communication passage 41a are under the atmospheric pressure, the outside air is prevented from being conducted into the module chamber 32.

Figure 10:
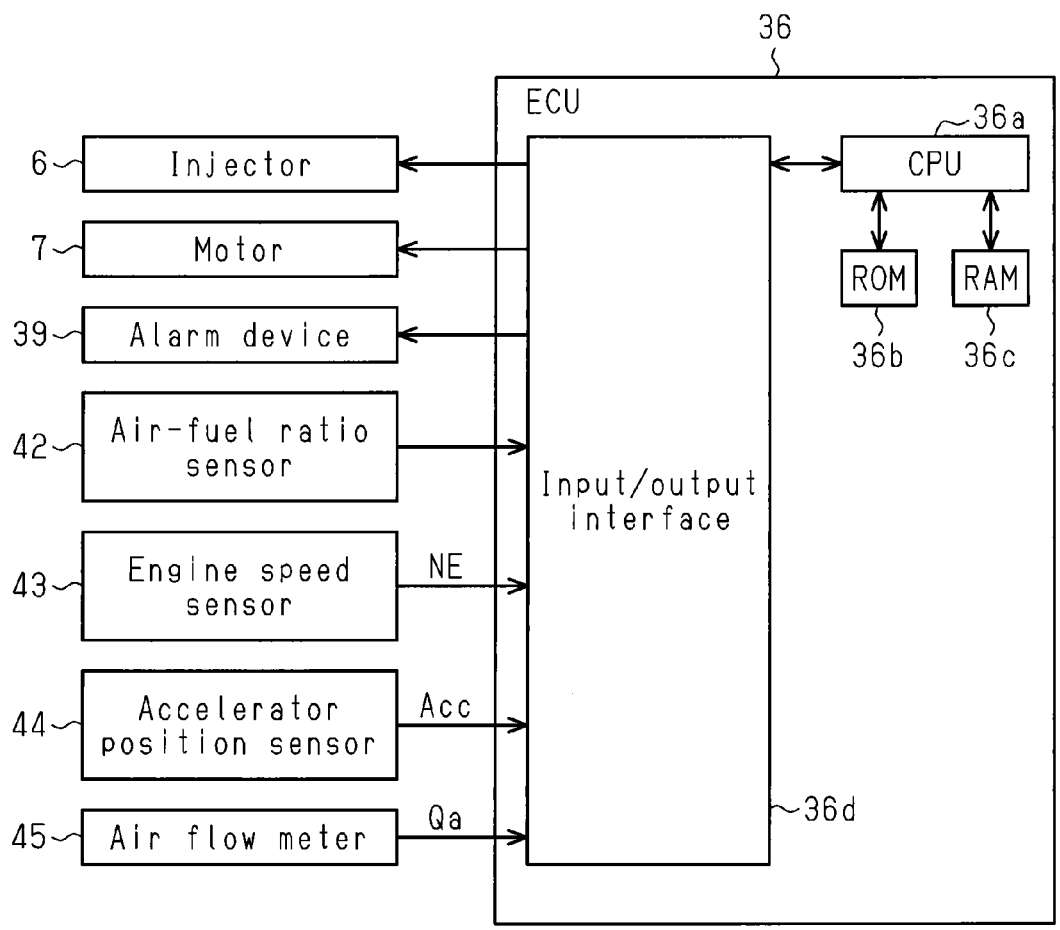
FIG. 10 is a block diagram illustrating a control circuit for an engine and the thermoelectric generator in accordance with the second embodiment of the present invention.

The exhaust pipe 10 includes an air-fuel ratio sensor 42 as an exhaust detecting means (or exhaust gas detection portion), and the air-fuel ratio sensor 42 detects the ratio of intake air and fuel in the air-fuel mixture to be combusted in the engine 1, that is, the air-fuel ratio (A/F) and outputs detection information to the ECU 36 (See FIG. 10).

The ECU 36 performs feedback control based on the detection information from the air-fuel ratio sensor 42 such that the air-fuel ratio of the air-fuel mixture supplied to the engine 1 equates with a predetermined target air-fuel ratio.

As shown in FIG. 10, the ECU 36 is connected to an engine speed sensor 43, an accelerator position sensor 44, and an air flow meter 45.

The engine speed sensor 43 detects the speed of the engine 1 (that is, the speed of the crankshaft), and outputs an engine speed signal NE to the ECU 36.

The accelerator position sensor 44 detects the opening of an accelerator pedal (not shown) for adjusting the opening of the throttle valve 8, and outputs an accelerator position signal Acc to the ECU 36.

The air flow meter 45 is provided in the intake pipe 2, and serves to detect the amount of air drawn into the intake pipe 2 and output an intake signal Qa to the ECU 36.

The ECU 36 controls the motor 7 based on the engine speed signal NE and the accelerator operation amount Acc to change the throttle opening degree, thereby adjusting the amount of intake air. In cooperation with the adjustment of the amount of intake air, a target fuel injection amount is set such that the air-fuel ratio of the air-fuel mixture conducted into the combustion chamber of the engine 1 gets close to a stoichiometric air-fuel ratio, the injector 6 is driven to adjust the fuel injection amount, and the fuel injection amount is feedback-controlled based on an output value of the air-fuel ratio sensor 42.

The ECU 36 of the present embodiment performs fault diagnosis on the thermoelectric generator 13 based on detection information from the air-fuel ratio sensor 42, and the ECU 36 and the alarm device 39 constitute a fault diagnosis means (or fault diagnosis portion).

Next, operation will be described.

Figure 11:
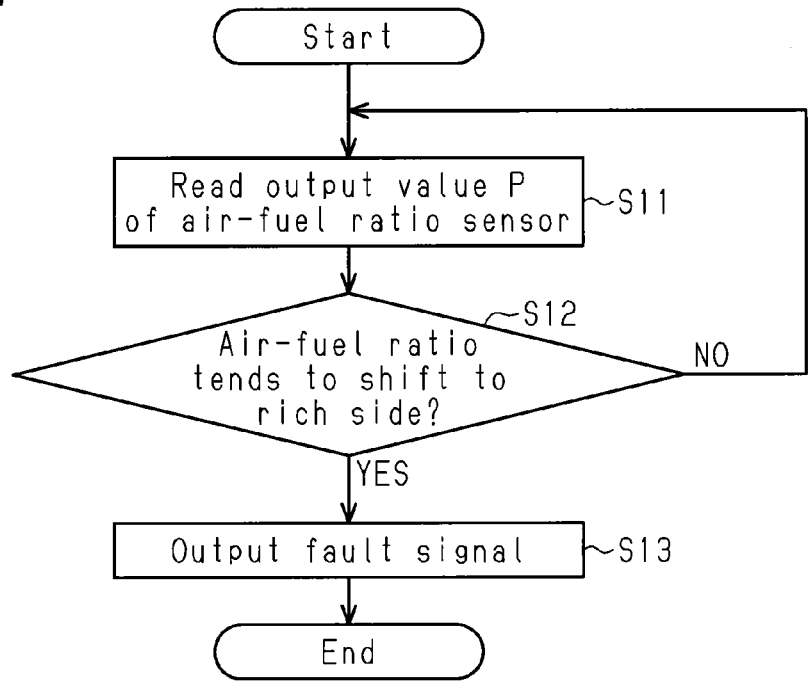
FIG. 11 is a flowchart illustrating a fault diagnosis program executed in the thermoelectric generator in accordance with the second embodiment of the present invention.

FIG. 11 is a flowchart of a fault diagnosis program executed by the ECU 36, and the fault diagnosis program is stored in the ROM 36b of the ECU 36, and is executed by regular intervals by the CPU 36a.

The ECU 36 of the present embodiment performs feedback control to control the amount of intake air and the fuel injection amount based on detection information from the air-fuel ratio sensor 42 such that the air-fuel ratio of the air-fuel mixture supplied to the engine 1 equates with the predetermined target air-fuel ratio.

Figure 12A:
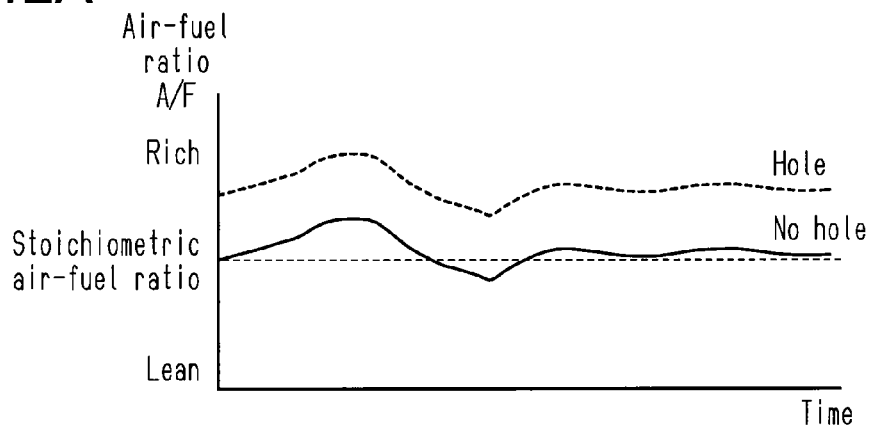
FIG. 12A is a graph on the thermoelectric generator in accordance with the second embodiment of the present invention, illustrating a change in an output signal of an air-fuel ratio sensor.

At this time, as represented by a solid line in FIG. 12A, a signal outputted from the air-fuel ratio sensor 42 becomes an output signal that moves close to the stoichiometric air-fuel ratio at all times, and shifts to a rich side and a lean side across the stoichiometric air-fuel ratio.

Figure 12B:
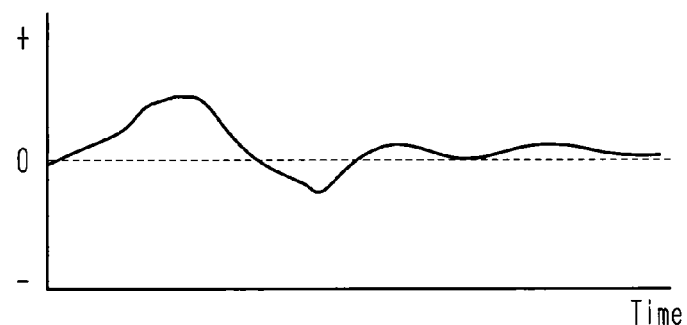
FIG. 12B is a graph illustrating a difference between the actual fuel amount and a target fuel amount in a normal case and a fault case of the thermoelectric generator.

The actual fuel amount supplied to the cylinder of the engine 1 varies to follow the target fuel amount (target fuel injection amount) set such that the air-fuel ratio of air-fuel mixture conducted into the combustion chamber of the engine 1 gets close to the stoichiometric air-fuel ratio. At this time, due to a delay of following of the actual fuel amount with respect to the target fuel amount, as shown in FIG. 12B, the difference between the actual fuel amount and the target fuel amount shifts to a positive side and a negative side across 0.

However, when a hole is formed in the exhaust pipe portion 19 due to corrosion, the exhaust gas leaked from the exhaust pipe portion 19 into the module chamber 32 is conducted into the intake pipe 2 through the pipe 41 by the negative pressure in the intake passage 3 of the engine 1.

Since the exhaust gas is mixed with the air-fuel mixture, the amount of oxygen in intake air conducted into the engine 1 decreases, which decreases the oxygen concentration of the intake air. For this reason, as represented by a broken line in FIG. 12A, the air-fuel ratio of the exhaust gas discharged from the engine 1 to the exhaust pipe 10 always shifts to the rich side with respect to the stoichiometric air-fuel ratio at all times.

If the output value of the air-fuel ratio sensor 42 tends to shift to the rich side with respect to the stoichiometric air-fuel ratio as represented by a broken line in FIG. 12A, the ECU 36 of the present embodiment determines that the thermoelectric generator 13 has a fault.

In FIG. 11, the ECU 36 reads an output value P of the air-fuel ratio sensor 42 (Step S11), and determines whether the air-fuel ratio tends to shift to the rich side with respect to the stoichiometric air-fuel ratio based on detection information from the air-fuel ratio sensor 42 (Step S12).

In Step S12, if the air-fuel ratio does not shift to the rich side with respect to the stoichiometric air-fuel ratio for not less than a certain period, the ECU 36 determines that the air-fuel ratio does not tend to shift to the rich side with respect to the stoichiometric air-fuel ratio, that is, the thermoelectric generator 13 has no fault, and returns to Step S11.

If the output value of the air-fuel ratio sensor 42 tends to shift to the rich side with respect to the stoichiometric air-fuel ratio for not less than a certain period, the ECU 36 determines that a hole is formed in the exhaust pipe portion 19 due to corrosion and the thermoelectric generator 13 has a fault.

That is, the ECU 36 determines that although the amount of intake air and the fuel injection amount are feedback-controlled based on the detection information from the air-fuel ratio sensor 42 such that the air-fuel ratio of air-fuel mixture supplied to the engine 1 equates with the predetermined target air-fuel ratio, the exhaust gas leaked into the module chamber 32 is mixed with the air-fuel mixture and thus, the thermoelectric generator 13 has a fault.

If the ECU 36 determines that the thermoelectric generator 13 has a fault, the ECU 36 outputs a fault signal to the alarm device 39 (Step S13), and finishes the current processing.

When receiving a fault signal, the alarm device 39 issues an alert to the occupant using an indication lamp, a beeper, an audio speaker, or the like to urge the occupant to repair or replace the thermoelectric generator 13.

As described above, the thermoelectric generator 13 of the present embodiment includes the pipe 41 having the communication passage 41a that connects the intake passage 3 with the module chamber 32. Thus, when exhaust gas leaks into the module chamber 32 through a hole formed in the exhaust pipe portion 19 due to corrosion, the exhaust gas leaked into the module chamber 32 can be conducted into the intake passage 3 through the communication passage 41a of the pipe 41 by the negative pressure generated in the intake passage 3.

Then, the exhaust gas conducted into the intake passage 3 can be combusted with the air-fuel mixture in the engine 1, and discharged to the exhaust pipe 10.

The ECU 36 performs fault diagnosis on the thermoelectric generator 13 based on the detection information from the air-fuel ratio sensor 42 provided in the exhaust pipe 10. If the ECU 36 determines that the oxygen concentration of exhaust gas discharged from the engine 1 to the exhaust pipe 10 decreases based on the detection information from the air-fuel ratio sensor 42, the ECU 36 can determine that the thermoelectric generator 13 has a fault.

Therefore, fault diagnosis on the thermoelectric generator 13 can be performed using the existing air-fuel ratio sensor 42 in the engine 1 to prevent an increase in manufacturing costs of the thermoelectric generator 13.

The ECU 36 of the present embodiment may perform fault diagnosis on the thermoelectric generator 13 when supply of fuel from the injector 6 stops. This can increase the detection accuracy of the air-fuel ratio sensor 42.

That is, when supply of fuel to the engine 1 stops, the flow rate of the exhaust gas discharged from the engine 1 decreases. Thus, in the case where exhaust gas leaks into the module chamber 32 through a hole formed in the exhaust pipe portion 19 due to corrosion, when the ECU 36 performs fault diagnosis on the thermoelectric generator 13 after the stop of supply of fuel to the engine 1, the air-fuel ratio sensor 42 detects only the exhaust gas leaked into the module chamber 32.

Consequently, the air-fuel ratio sensor 42 is prevented from being affected by disturbances (mixture of fuel and intake air), increasing the accuracy of detecting the exhaust gas leaked into the module chamber 32.

In thermoelectric generator 13 of the present embodiment, the module chamber 32 is formed of a sealed space. However, the present invention is not limited to this, but a part of the module chamber 32 may communicate with the atmosphere.

The thermoelectric generator 13 of the present embodiment includes the pipe 41, which allows exhaust gas to be conducted from the module chamber 32 into the intake pipe 2 by the negative pressure of intake air. Thus, even when a part of the module chamber 32 communicates with the atmosphere, much of the exhaust gas leaked into the module chamber 32 is reliably conducted into the intake passage 3 by the negative pressure of intake air. Therefore, fault diagnosis on the thermoelectric generator 13 is reliably performed using the air-fuel ratio sensor 42.

In the present embodiment, a fault of the thermoelectric generator 13 can be determined before formation of a hole in the coolant pipe 23. Thus, leakage of coolant from the coolant pipe 23 is reliably prevented. This reliably prevents lowering of the cooling performance of the engine 1.

In the thermoelectric generator 13 of the present embodiment, fault diagnosis on the thermoelectric generator 13 is performed based on the detection information from the air-fuel ratio sensor 42. Similarly to that shown in FIG. 2, however, the module chamber 32 may be provided with an HC sensor 35, and fault diagnosis on the thermoelectric generator 13 is performed based on the detection information from the HC sensor 35 and the detection information from the air-fuel ratio sensor 42. In this manner, the accuracy of detecting a fault of the thermoelectric generator 13 is further increased.

Third Embodiment

FIGS. 13 to 19 are diagrams illustrating a thermoelectric generator in accordance with a third embodiment of the present invention, and the same components as those in the first and second embodiments are given the same reference numerals and description thereof is omitted.

Figure 13:
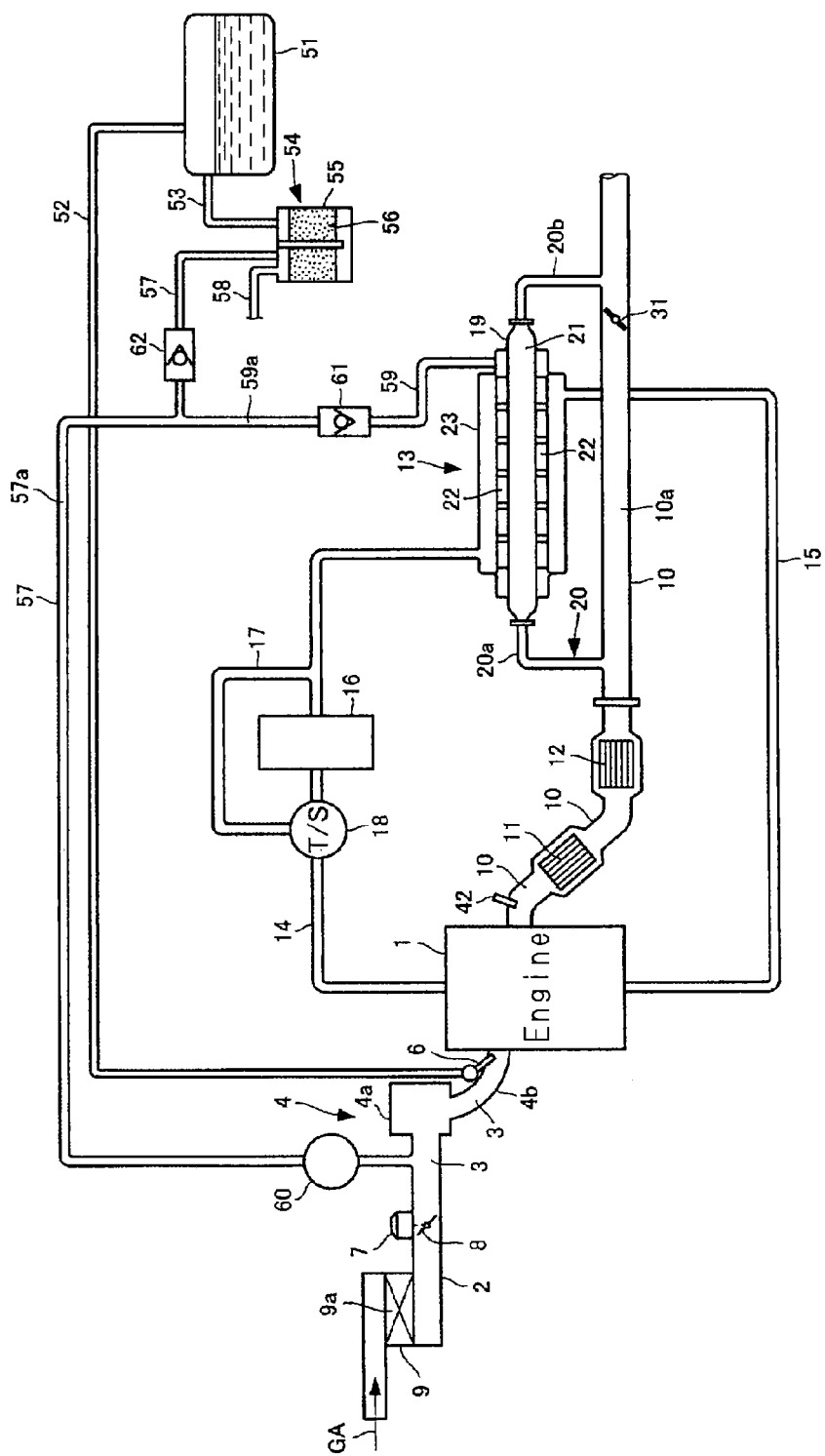
FIG. 13 is a schematic configuration view illustrating a vehicle provided with a thermoelectric generator in accordance with a third embodiment of the present invention.

In FIG. 13, an engine 1 is provided with a fuel tank 51 for storing fuel, and the fuel stored in the fuel tank 51 is pumped up by a pump module (not shown) in the fuel tank 51.

The fuel tank 51 is connected to an injector 6 via a fuel supply pump 52, and the fuel pumped up from the fuel tank 51 by the pump module is supplied to the injector 6 through the fuel supply pump 52.

The fuel tank 51 is connected to a canister 54 as an adsorber via a tank pipe 53, and the canister 54 includes a main body case 55 and an adsorbent 56 in the main body case 55, such as activated carbon.

A first end of the purge pipe 57 is connected to the main body case 55 of the canister 54, and a second end of the purge pipe 57 is connected to the intake pipe 2. The purge pipe 57 has a purge passage 57a therein, and the inside of the main body case 55 communicates with the intake passage 3 of the intake pipe 2 via the purge passage 57a.

An atmosphere introducing pipe 58, which communicates with the atmosphere, is connected to the main body case 55, and the atmosphere is conducted into the main body case 55 through the atmosphere introducing pipe 58. Thus, purge gas, in which fuel desorbed from the adsorbent 56 of the canister 54 and air conducted into the main body case 55 through the atmosphere introducing pipe 58 are mixed, is drawn into the intake pipe 2 through the purge passage 57a by the negative pressure generated in the intake passage 3.

Figure 14:
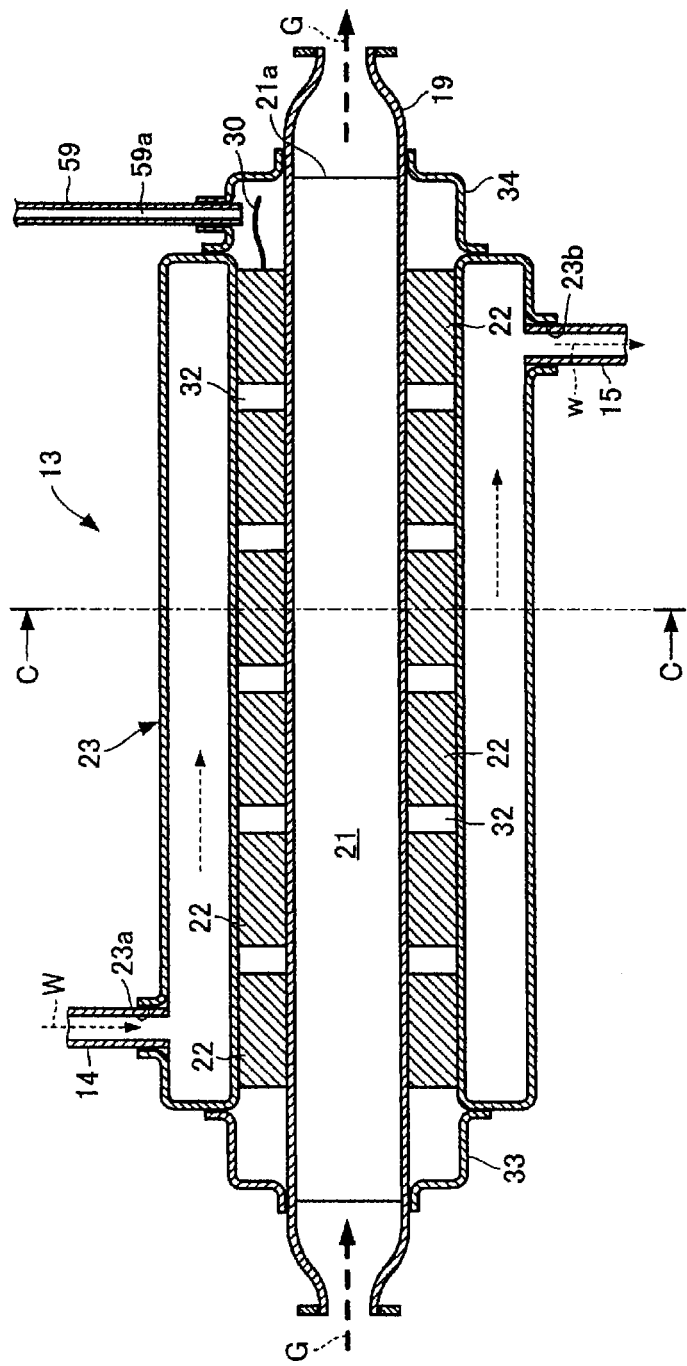
FIG. 14 is a cross-sectional side view illustrating the thermoelectric generator in accordance with the third embodiment of the present invention.
Figure 15:
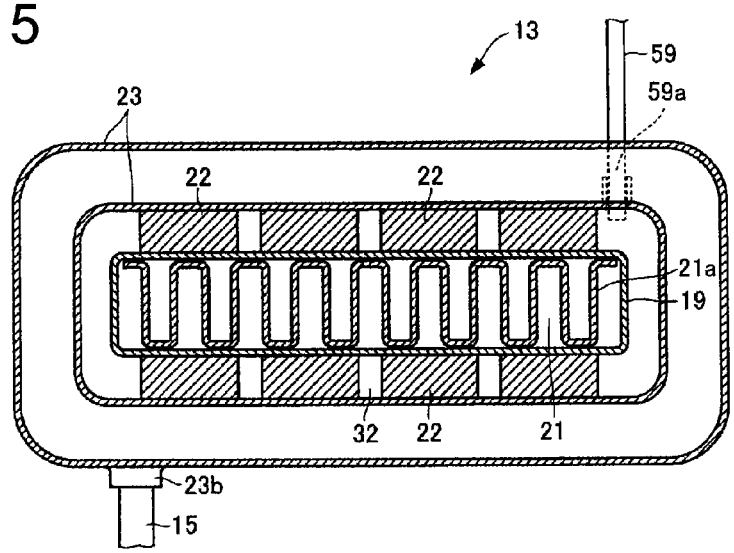
FIG. 15 is a cross-sectional view taken along line C-C in FIG. 14, illustrating the thermoelectric generator in accordance with the third embodiment of the present invention.

In FIGS. 13 to 15, a first end of a pipe 59 as a communication pipe is connected to the purge pipe 57, and a second end of the pipe 59 is connected to the plate 34. The pipe 59 has a communication passage 59a that connects the module chamber 32 with the purge passage 57a.

A purge valve 60 is provided at an end of the purge pipe 57 on the side of the intake pipe 2, and serves to open and close the purge passage 57a.

Figure 16:
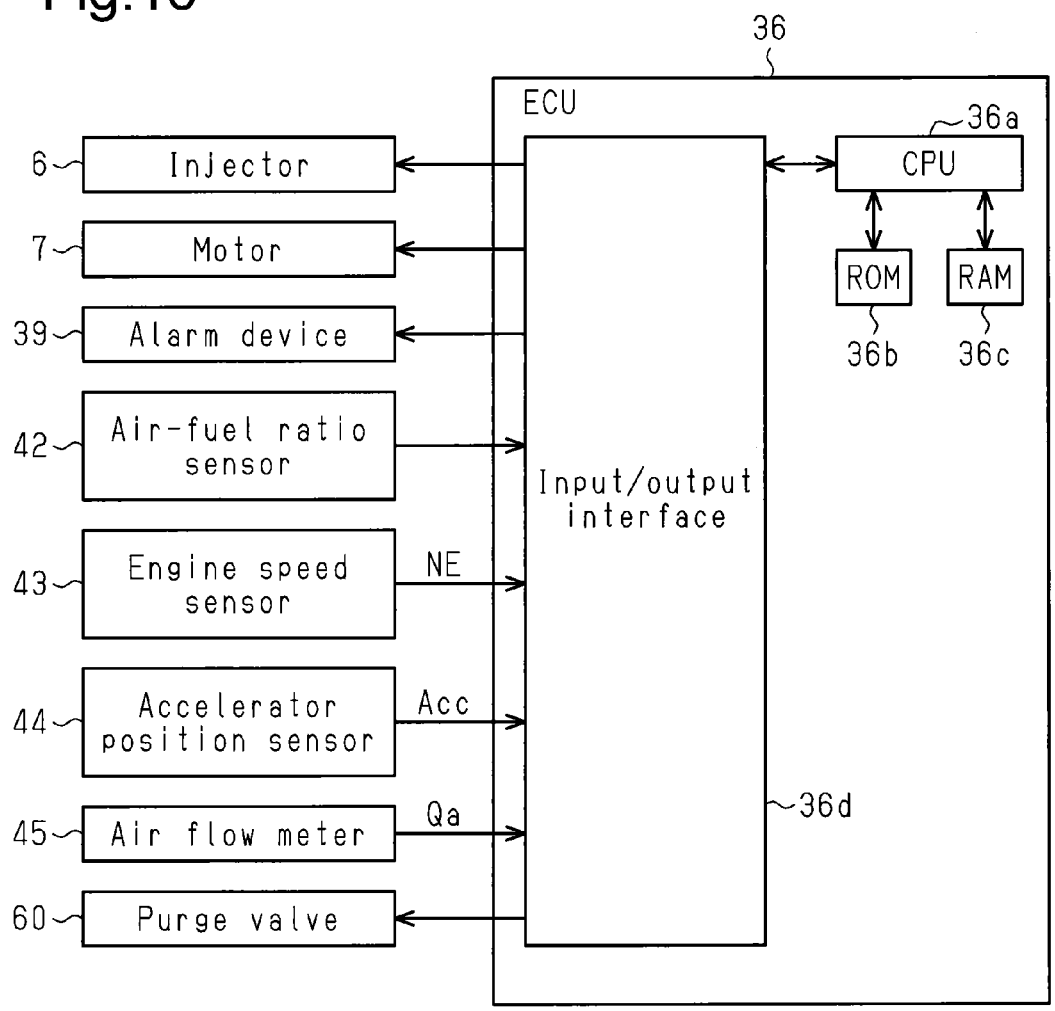
FIG. 16 is a block diagram illustrating a control circuit for an engine and the thermoelectric generator in accordance with the third embodiment of the present invention.

As shown in FIG. 16, the ECU 36 applies an excitation current to the purge valve 60. The opening degree of the purge valve 60 is varied by duty-controlling the excitation current applied from the ECU 36 to the purge valve 60.

Fuel is desorbed from the adsorbent 56 of the canister 54 by the negative pressure of intake air in the intake passage 3 and is drawn with air into the intake passage 3 as purge gas at a purge ratio corresponding to the duty ratio of the purge valve 60.

The pipe 59 is provided with a one-way valve 61, and the one-way valve 61 opens when exhaust gas flows from the pipe 59 to the purge pipe 57 and closes when exhaust gas flows from the purge pipe 57 to the pipe 59.

Accordingly, fuel evaporated from the canister 54 is prevented from flowing to the module chamber 32 when the purge valve 60 closes.

A one-way valve 62 is provided at an end of the purge pipe 57 on the side of the canister 54, and the one-way valve 62 opens when purge gas flows from the canister 54 to the intake pipe 2 and closes when purge gas flows from the intake pipe 2 or the pipe 59 to the canister 54.

Thus, when the purge valve 60 closes, exhaust gas is prevented from flowing from the module chamber 32 to the canister 54 through a hole formed in the exhaust pipe portion 19 due to corrosion.

As shown in FIG. 16, the ECU 36 of the present embodiment performs fault diagnosis on the thermoelectric generator 13 based on the detection information from the air-fuel ratio sensor 42 as an exhaust detecting means (or exhaust gas detection portion), and the ECU 36 and the alarm device 39 constitutes a fault diagnosis means (or fault diagnosis portion).

Next, operation will be described.

Figure 17:
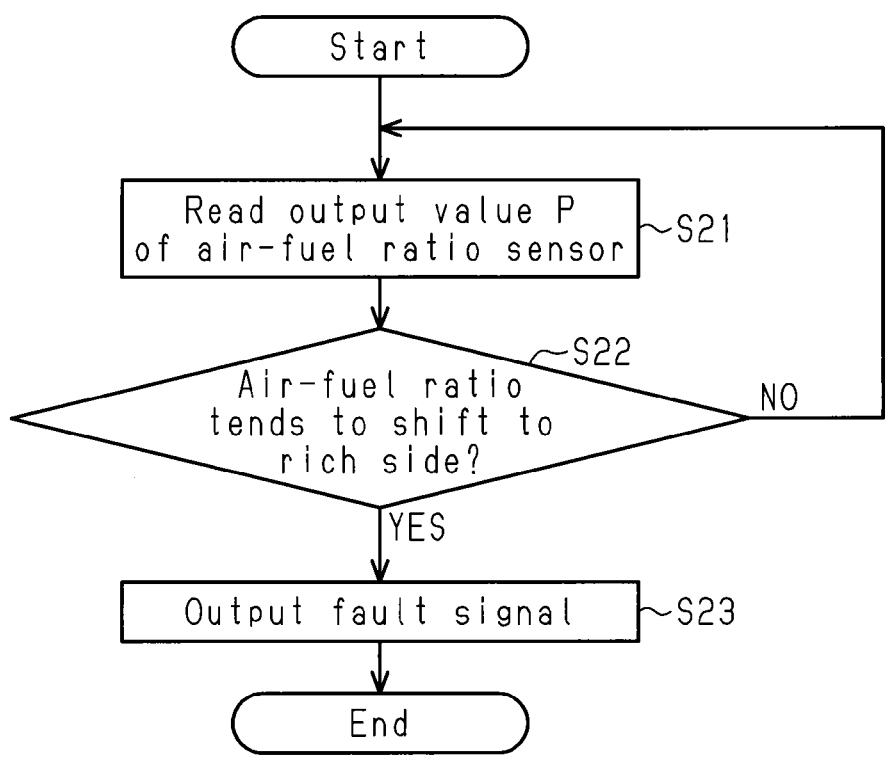
FIG. 17 is a flowchart illustrating a fault diagnosis program executed in the thermoelectric generator in accordance with the third embodiment of the present invention.

FIG. 17 is a flowchart of a fault diagnosis program executed by the ECU 36, and the fault diagnosis program is stored in the ROM 36b of the ECU 36 and is executed at regular intervals by the CPU 36a.

In the engine 1 of the present embodiment, when the purge valve 60 is driven according to an excitation signal from the ECU 36 to open the purge passage 57a, evaporated fuel adsorbed on the adsorbent 56 is conducted with the atmosphere as purge gas into the intake passage 3 through the purge passage 57a by the negative suction pressure generated in the intake passage 3.

The pipe 59 is connected to the purge pipe 57, and the module chamber 32 communicates with the intake passage 3 via the communication passage 59a and the purge passage 57a.

Thus, when a hole is formed in the exhaust pipe portion 19 due to corrosion, exhaust gas leaked from the exhaust pipe portion 19 into the module chamber 32 is conducted into the intake passage 3 through the communication passage 59a and the purge passage 57a by the negative pressure generated in the intake passage 3 of the engine 1.

Thus, using the existing air-fuel ratio sensor 42 provided at the exhaust pipe 10, in the case where the output value of the air-fuel ratio sensor 42 tends to shift to the rich side with respect to the stoichiometric air-fuel ratio similarly to that represented by a broken line in FIG. 12A based on the detection information from the air-fuel ratio sensor 42, the ECU 36 of the present embodiment determines that the thermoelectric generator 13 has a fault.

During a purge process, since the air-fuel mixture contains purge gas, the output value of the air-fuel ratio sensor 42 becomes rich. Thus, the ECU 36 decreases the fuel injection amount by the amount of evaporated fuel contained in purge gas during purging, and performs feedback control such that the air-fuel ratio equates with the predetermined target air-fuel ratio. For this reason, as represented by the solid line in FIG. 12A, the output value of the air-fuel ratio sensor 42 becomes the output signal that moves close to the stoichiometric air-fuel ratio, and shifts to the rich side and the lean side across the stoichiometric air-fuel ratio.

In FIG. 17, the ECU 36 reads an output value P from the air-fuel ratio sensor 42 (Step S21), and determines whether the air-fuel ratio tends to shift to the rich side with respect to the stoichiometric air-fuel ratio based on detection information from the air-fuel ratio sensor 42 (Step S22).

In Step S22, if the air-fuel ratio does not shift to the rich side with respect to the stoichiometric air-fuel ratio for not less than a certain period, the ECU 36 determines that the air-fuel ratio does not tend to shift to the rich side with respect to the stoichiometric air-fuel ratio and thus, the thermoelectric generator 13 has no fault, and returns to Step S21.

If the output value of the air-fuel ratio sensor 42 tends to shift to the rich side with respect to the stoichiometric air-fuel ratio for not less than a certain period, the ECU 36 determines that a hole is formed in the exhaust pipe portion 19 due to corrosion and the thermoelectric generator 13 has a fault.

That is, the ECU 36 determines that although the amount of intake air and the fuel injection amount are feedback-controlled based on the detection information from the air-fuel ratio sensor 42 such that the air-fuel ratio of air-fuel mixture supplied to the engine 1 equates with the predetermined target air-fuel ratio, the exhaust gas leaked into the module chamber 32 is mixed with the air-fuel mixture and thus, that the thermoelectric generator 13 has a fault.

If the ECU 36 determines that the thermoelectric generator 13 has a fault, the ECU 36 outputs a fault signal to the alarm device 39 (Step S23), and finishes the current processing.

When receiving a fault signal, the alarm device 39 issues an alert to the occupant using an indication lamp, a beeper, an audio speaker, or the like to urge the occupant to repair or replace the thermoelectric generator 13.

As described above, the engine 1 of the present embodiment includes the purge pipe 57 having the purge passage 57a, which connects the inside of the canister 54 having the adsorbent 56 for adsorbing evaporated fuel with the intake passage 3 of the intake pipe 2, and the communication passage 59a of the pipe 59 of the thermoelectric generator 13 connects the module chamber 32 with the purge passage 57a.

Thus, when exhaust gas leaks into the module chamber 32 through a hole formed in the exhaust pipe portion 19 due to corrosion, the exhaust gas leaked into the module chamber 32 can be conducted into the intake passage 3 with purge gas by the negative pressure generated in the intake passage 3. Then, the exhaust gas conducted into the intake passage 3 can be combusted with the air-fuel mixture and purge gas in the engine 1, and discharged to the exhaust pipe 10.

The ECU 36 performs fault diagnosis on the thermoelectric generator 13 based on the detection information from the air-fuel ratio sensor 42 provided at the exhaust pipe 10. If the ECU 36 determines that the oxygen concentration in exhaust gas discharged from the engine 1 to the exhaust pipe 10 decreases based on the detection information from the air-fuel ratio sensor 42, the ECU 36 can determine that the thermoelectric generator 13 has a fault.

Therefore, fault diagnosis on the thermoelectric generator 13 can be performed using the existing air-fuel ratio sensor 42 in the engine 1 to prevent an increase in manufacturing costs of the thermoelectric generator 13.

ECU 36 of the present embodiment may perform fault diagnosis on the thermoelectric generator 13 when supply of fuel from the injector 6 stops. In this manner, lowering of the detection accuracy of the air-fuel ratio sensor 42 is prevented.

That is, when supply of fuel to the engine 1 stops, the flow rate of exhaust gas discharged from the engine 1 decreases, and purge gas is conducted into the engine 1.

Thus, in the case where exhaust gas leaks into the module chamber 32 through a hole formed in the exhaust pipe portion 19 due to corrosion, when the ECU 36 performs fault diagnosis on the thermoelectric generator 13 after stop of supply of fuel to the engine 1, the air-fuel ratio sensor 42 detects only gas containing the exhaust gas leaked into the module chamber 32 and purge gas.

The ECU 36 finds the amount of evaporated fuel purged from the canister 54 by learning control according to the operation state of the engine 1, and determines that exhaust gas leaks into the module chamber 32 when the output value of the air-fuel ratio sensor 42 tends to shift to the rich side with respect to the value obtained when only purge gas is detected.

In this manner, the air-fuel ratio sensor 42 is prevented from being affected by disturbances (air-fuel mixture of fuel and intake air), increasing the accuracy of detecting the exhaust gas leaked into the module chamber 32.

Figure 18:
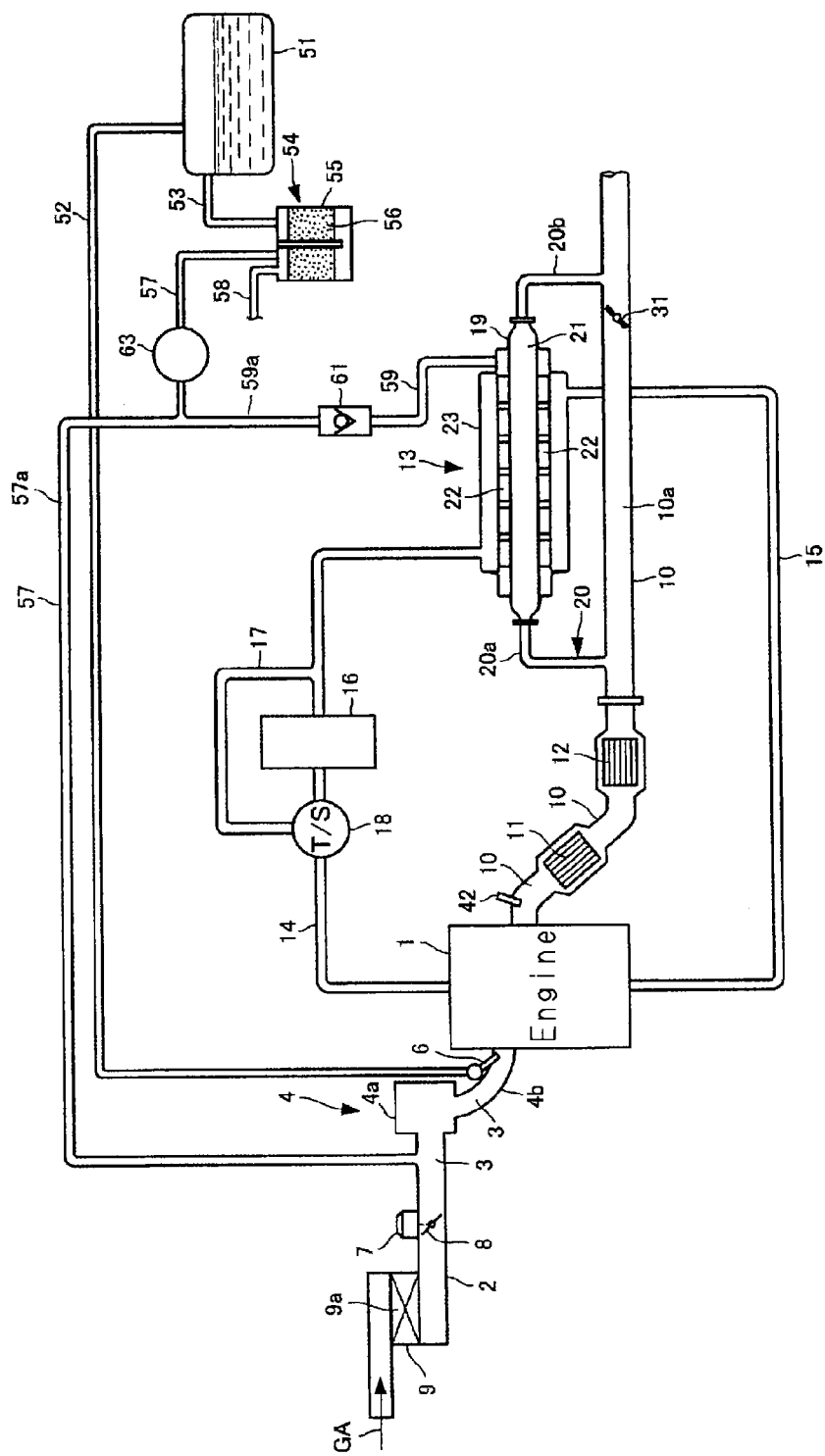
FIG. 18 is a schematic configuration view illustrating a vehicle provided with a thermoelectric generator having another configuration in accordance with the third embodiment of the present invention.

In the present embodiment, the purge valve 60 is provided at the end of the purge pipe 57 on the side of the intake pipe 2 and however, the present invention is not limited to this, but a configuration as shown in FIG. 18 may be adopted.

In FIG. 18, a purge valve 63 as an open-close means (or open-close portion) is provided at a section in the purge pipe 57 that is upstream from the connection between the pipe 59 and the purge pipe 57 in the purge gas flowing direction, and the purge valve 63 serves to open or close the purge passage 57a.

Figure 19:
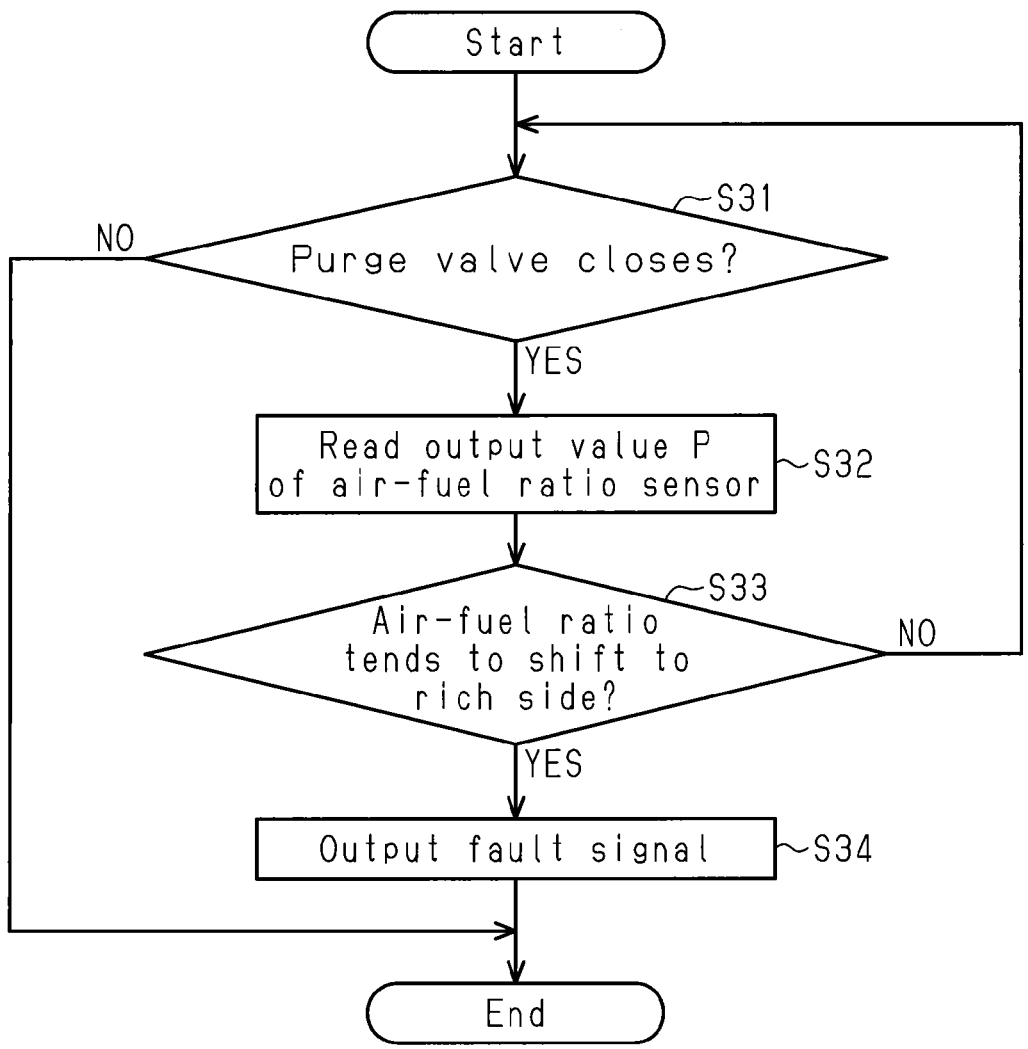
FIG. 19 is a flowchart illustrating a fault diagnosis program executed by an ECU of the thermoelectric generator having the another configuration in accordance with the third embodiment of the present invention.

FIG. 19 is a flowchart of a fault diagnosis program executed by the ECU 36 in the case where the position of the purge valve 63 is changed, and the fault diagnosis program is stored in the ROM 36b of the ECU 36 and is executed at regular intervals by the CPU 36a.

In FIG. 19, the ECU 36 determines whether the purge valve 63 is closed (Step S31). If the ECU 36 determines that the purge valve 63 is closed, the ECU 36 reads an output value P of the air-fuel ratio sensor 42 (Step S32).

Next, the ECU 36 determines whether the air-fuel ratio tends to shift to the rich side with respect to the stoichiometric air-fuel ratio based on the detection information from the air-fuel ratio sensor 42 (Step S33).

If the ECU 36 determines that the air-fuel ratio does not tend to shift to the rich side with respect to the stoichiometric air-fuel ratio, the ECU 36 determines that the thermoelectric generator 13 has no fault, and returns to Step S31.

If the ECU 36 determines that the air-fuel ratio tends to shift to the rich side with respect to the stoichiometric air-fuel ratio, the ECU 36 determines that the thermoelectric generator 13 has a fault, outputs a fault signal to the alarm device 39 (Step S34), and finishes the current processing.

In the state where the purge valve 63 closes the purge passage 57a to isolate the inside of the main body case 55 from the intake passage 3, when the ECU 36 of the present embodiment performs fault diagnosis on the thermoelectric generator 13, purge gas is prevented from flowing to the intake passage 3 even when exhaust gas leaks into the module chamber 32 through a hole formed in the exhaust pipe portion 19 due to corrosion.

Thus, the air-fuel ratio sensor 42 is prevented from being affected by disturbances (purge gas). This can increase the accuracy of detecting the exhaust gas leaked into the space portion.

In the thermoelectric generator 13 of the present embodiment, the module chamber 32 is formed of a sealed space. However, the present invention is not limited to this, but a part of the module chamber 32 may communicate with the atmosphere.

The thermoelectric generator 13 of the present embodiment includes the pipe 59 and the purge pipe 57, which introduce exhaust gas from the module chamber 32 into the intake pipe 2 by using the negative pressure of intake air. Thus, even when a part of the module chamber 32 communicates with the atmosphere, much of the exhaust gas leaked into the module chamber 32 is reliably conducted into the intake passage 3 by the negative pressure of intake air. Thus, fault diagnosis on the thermoelectric generator 13 is reliably performed using the air-fuel ratio sensor 42.

In the present embodiment, a fault of the thermoelectric generator 13 can be determined before formation of a hole in the coolant pipe 23. Thus, leakage of coolant from the coolant pipe 23 is reliably prevented. This reliably prevents lowering of the cooling performance of the engine 1.

In the thermoelectric generator 13 of the present embodiment, fault diagnosis on the thermoelectric generator 13 is performed based on the detection information from the air-fuel ratio sensor 42. Similarly to that shown in FIG. 2, however, the module chamber 32 may be provided with an HC sensor 35, and fault diagnosis on the thermoelectric generator 13 is performed based on the detection information from the HC sensor 35 and the detection information from the air-fuel ratio sensor 42. In this manner, the accuracy of fault diagnosis on the thermoelectric generator 13 is further increased.

Fourth Embodiment

FIGS. 20 to 23 are diagrams illustrating a thermoelectric generator in accordance with a fourth embodiment of the present invention, and the same components as those in the first and second embodiments are given the same reference numerals and description thereof is omitted.

Figure 20:
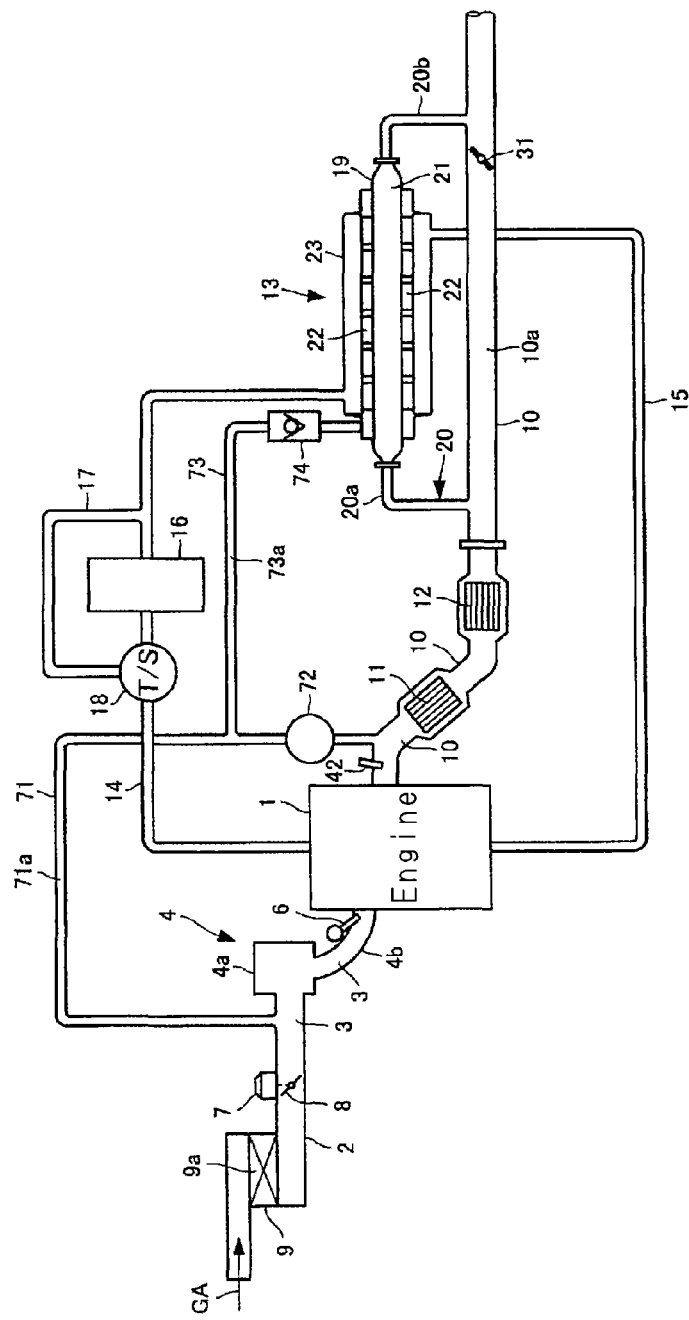
FIG. 20 is a schematic configuration view illustrating a vehicle provided with a thermoelectric generator in accordance with a fourth embodiment of the present invention.

In FIG. 20, an exhaust gas recirculation (EGR) pipe 71 is located between an intake pipe 2 and an exhaust pipe 10, and the EGR pipe 71 has an EGR passage 71a, which connects the intake passage 3 with the exhaust passage 10a.

An EGR valve 72 as an open-close means (or open-close portion) is provided at the EGR pipe 71, and the EGR valve 72 is formed of a linear electromagnetic valve, and the opening degree of the EGR passage 71a is changed by duty-controlling an excitation current applied from the ECU 36.

Adjusting the opening degree of the EGR valve 72 causes some of exhaust gas to recirculate (return) as EGR gas from the exhaust passage 10a into the intake passage 3 through the EGR passage 71a, and to be mixed with air-fuel mixture, lowering the combustion temperature to prevent the occurrence of NOx.

Figure 21:
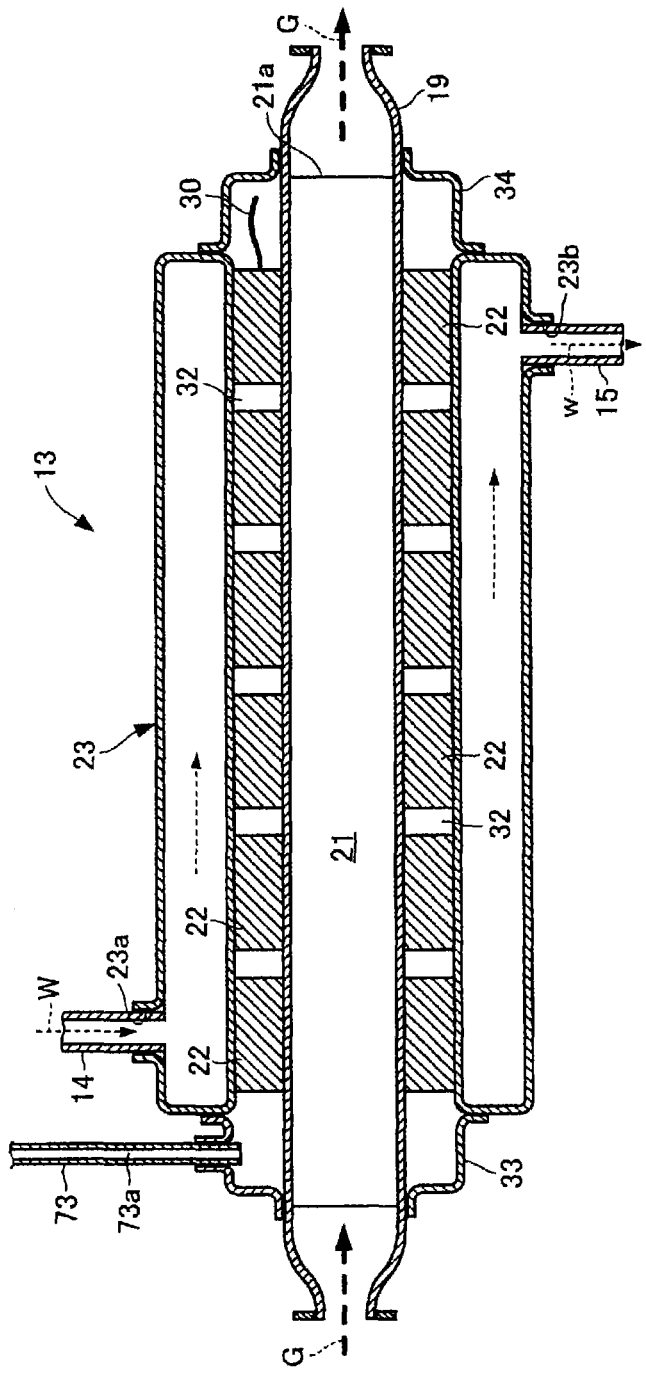
FIG. 21 is a cross-sectional side view illustrating the thermoelectric generator in accordance with the fourth embodiment of the present invention.

As shown in FIGS. 20 and 21, the plate 33 of the thermoelectric generator 13 is connected to the EGR pipe 71 via a pipe 73 as a communication pipe, and the pipe 73 has a communication passage 73a that connects the module chamber 32 with the EGR passage 71a.

The EGR valve 72 is provided in a section of the EGR pipe 71 that is upstream from the connection of the pipe 73 with the EGR pipe 71 in the EGR gas flow direction.

The pipe 73 is provided with a one-way valve 74, and the one-way valve 74 opens when exhaust gas flows from the module chamber 32 to the communication passage 73a, and closes when EGR gas flows from the EGR passage 71a to the module chamber 32. Thus, EGR gas is prevented from being conducted from the EGR passage 71a into the module chamber 32.

Figure 22:
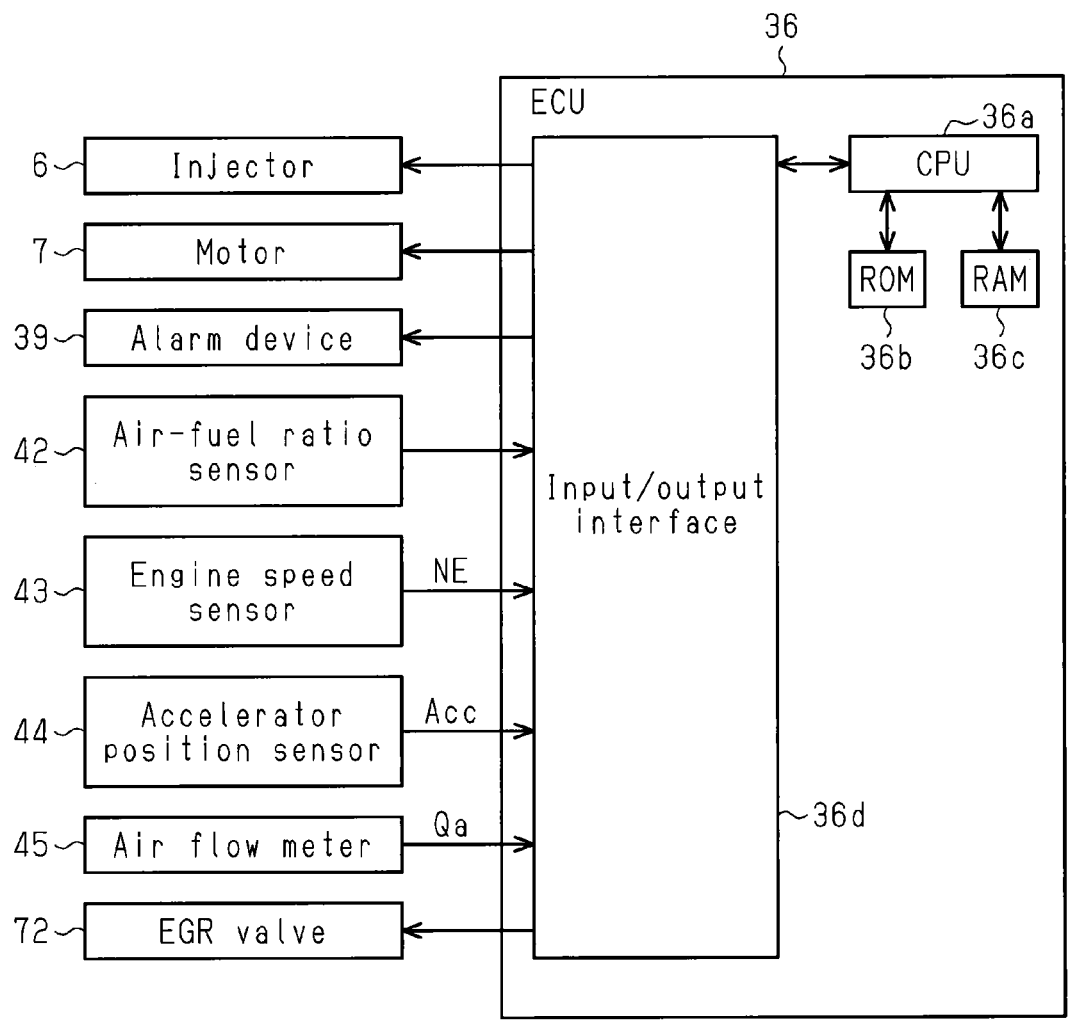
FIG. 22 is a block diagram illustrating a control circuit for an engine and the thermoelectric generator in accordance with the fourth embodiment of the present invention.

As shown in FIG. 22, the ECU 36 of the present embodiment performs fault diagnosis on the thermoelectric generator 13 based on the detection information from the air-fuel ratio sensor 42 as an exhaust detecting means (or exhaust gas detection portion), and the ECU 36 and the alarm device 39 constitute a fault diagnosis means (or fault diagnosis portion).

Next, operation will be described.

Figure 23:
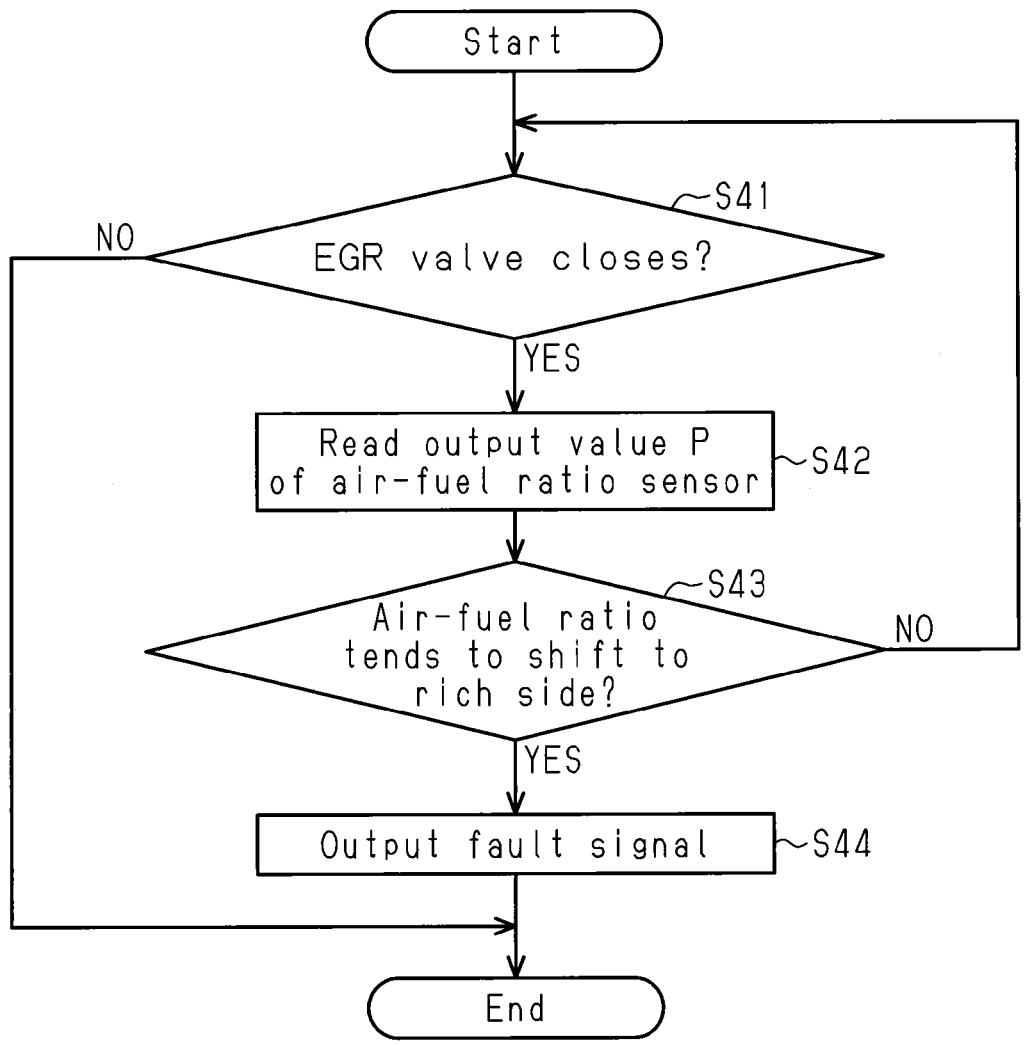
FIG. 23 is a flowchart illustrating a fault diagnosis program executed in the thermoelectric generator in accordance with the fourth embodiment of the present invention.

FIG. 23 is a flowchart of a fault diagnosis program executed by the ECU 36, and the fault diagnosis program is stored in the ROM 36b of the ECU 36 and is executed at regular intervals by the CPU 36a.

In the engine 1 of the present embodiment, when the EGR valve 72 is driven in response to an excitation signal of the ECU 36 to open the EGR passage 71a, some of exhaust gas as EGR gas is returned from the exhaust passage 10a to the intake passage 3 by the negative suction pressure generated in the intake passage 3.

The pipe 73 is connected to the EGR pipe 71, and the module chamber 32 communicates with the intake passage 3 through the communication passage 73a and the EGR passage 71a.

Thus, when a hole is formed in the exhaust pipe portion 19 due to corrosion, exhaust gas leaked from the exhaust pipe portion 19 into the module chamber 32 is conducted into the intake passage 3 through the communication passage 73a and the EGR passage 71a by the negative pressure generated in the intake passage 3 of the engine.

Thus, the ECU 36 of the present embodiment performs fault diagnosis on the thermoelectric generator 13 based on the detection information from the existing air-fuel ratio sensor 42 provided at the exhaust pipe 10.

When EGR gas is conducted into the cylinder of the engine 1, the air-fuel mixture contains EGR gas. Thus, the output value of the air-fuel ratio sensor 42 becomes rich. Accordingly, at closing of the EGR valve 72, the ECU 36 performs fault diagnosis on the thermoelectric generator 13.

In FIG. 23, the ECU 36 determines whether the EGR valve 72 is closed (Step S41). If the ECU 36 determines that the EGR valve 72 is closed, the ECU 36 reads an output value P of the air-fuel ratio sensor 42 (Step S42).

Next, the ECU 36 determines whether the air-fuel ratio tends to shift to the rich side with respect to the stoichiometric air-fuel ratio based on the detection information from the air-fuel ratio sensor 42 (Step S43).

If the ECU 36 determines that the output value of the air-fuel ratio sensor 42 does not tend to shift to the rich side with respect to the stoichiometric air-fuel ratio for not less than a certain period, the ECU 36 determines that the thermoelectric generator 13 has no fault, and returns to Step S41.

When the output value of the air-fuel ratio sensor 42 tends to shift to the rich side with respect to the stoichiometric air-fuel ratio for not less than a certain period, the ECU 36 determines that a hole is formed in the exhaust pipe portion 19 due to corrosion, and the thermoelectric generator 13 has a fault.

That is, the ECU 36 determines that although the amount of intake air and the fuel injection amount are feedback-controlled based on the detection information from the air-fuel ratio sensor 42 such that the air-fuel ratio of air-fuel mixture supplied to the engine 1 equates with the predetermined target air-fuel ratio, the exhaust gas leaked into the module chamber 32 is mixed with the air-fuel mixture and thus, the thermoelectric generator 13 has a fault.

If the ECU 36 determines that the thermoelectric generator 13 has a fault, the ECU 36 outputs a fault signal to the alarm device 39 (Step S44), and finishes the current processing.

When receiving a fault signal, the alarm device 39 issues an alert to the occupant using an indication lamp, a beeper, an audio speaker, or the like to urge the occupant to repair or replace the thermoelectric generator 13.

As described above, the engine 1 of the present embodiment includes the EGR pipe 71 having the EGR passage 71a, which allows the exhaust passage 10a to communicate with the intake passage 3 and EGR gas discharged from the exhaust passage 10a to return to the intake passage 3, and the thermoelectric generator 13 includes the pipe 73 having the communication passage 73a, which allows the EGR passage 71a to communicate with the module chamber 32.

Thus, when exhaust gas leaks into the module chamber 32 through a hole formed in the exhaust pipe portion 19 due to corrosion, the exhaust gas leaked into the module chamber 32 can be conducted into the engine 1 through the communication passage 73a, the EGR passage 71a, and the intake passage 3 by the negative pressure generated in the intake passage 3. Thus, the exhaust gas conducted into the engine 1 can be discharged from the engine 1 to the exhaust pipe.

The ECU 36 performs fault diagnosis on the thermoelectric generator 13 based on detection information from the air-fuel ratio sensor 42 provided at the exhaust pipe 10. If the ECU 36 determines that the oxygen concentration in the exhaust gas discharged from the engine 1 to the exhaust pipe 10 decreases based on the detection information from the air-fuel ratio sensor 42, the ECU 36 can determine that the thermoelectric generator 13 has a fault.

Therefore, fault diagnosis on the thermoelectric generator 13 can be performed using the existing air-fuel ratio sensor 42 in the engine 1 and the EGR pipe 71 to prevent an increase in manufacturing costs of the thermoelectric generator 13.

The ECU 36 of the present embodiment may perform fault diagnosis on the thermoelectric generator 13 when supply of fuel from the injector 6 is stopped. This prevents lowering of the detection accuracy of the air-fuel ratio sensor 42.

That is, when supply of fuel to the engine 1 stops, the flow rate of the exhaust gas discharged from the engine 1 decreases. Thus, in the case where exhaust gas leaks into the module chamber 32 through a hole formed in the exhaust pipe portion 19 due to corrosion, when the ECU 36 performs fault diagnosis on the thermoelectric generator 13 after stop of supply of fuel to the engine 1, the air-fuel ratio sensor 42 detects only the exhaust gas leaked into the module chamber 32.

Therefore, the air-fuel ratio sensor 42 is prevented from being affected by disturbances (air-fuel mixture of fuel and intake air), increasing the accuracy of detecting the exhaust gas leaked into the module chamber 32.

In the thermoelectric generator 13 of the present embodiment, the module chamber 32 is formed of a sealed space. However, the present invention is not limited to this, but a part of the module chamber 32 may communicate with the atmosphere.

The thermoelectric generator 13 of the present embodiment includes the pipe 73 and the EGR pipe 71, which introduce exhaust gas from the module chamber 32 into the intake pipe 2 by using the negative pressure of intake air. Thus, even when a part of the module chamber 32 communicates with the atmosphere, much of the exhaust gas leaked into the module chamber 32 is reliably conducted into the intake passage 3 by the negative pressure of intake air. Thus, fault diagnosis on the thermoelectric generator 13 is reliably performed using the air-fuel ratio sensor 42.

In the present embodiment, a fault of the thermoelectric generator 13 can be determined before formation of a hole in the coolant pipe 23. Thus, leakage of coolant from the coolant pipe 23 is reliably prevented. This reliably prevents lowering of the cooling performance of the engine 1.

In the thermoelectric generator 13 of the present embodiment, fault diagnosis on the thermoelectric generator 13 is performed based on the detection information from the air-fuel ratio sensor 42. Similarly to that shown in FIG. 2, however, the module chamber 32 may be provided with an HC sensor 35, and fault diagnosis on the thermoelectric generator 13 is performed based on the detection information from the HC sensor 35 and the detection information from the air-fuel ratio sensor 42. In this manner, the accuracy of fault diagnosis on the thermoelectric generator 13 is further increased.

Fifth Embodiment

FIGS. 24 to 27 are diagrams illustrating a thermoelectric generator in accordance with a fifth embodiment of the present invention, and the same components as those in the first and second embodiments are given the same reference numerals and description thereof is omitted.

Figure 24:
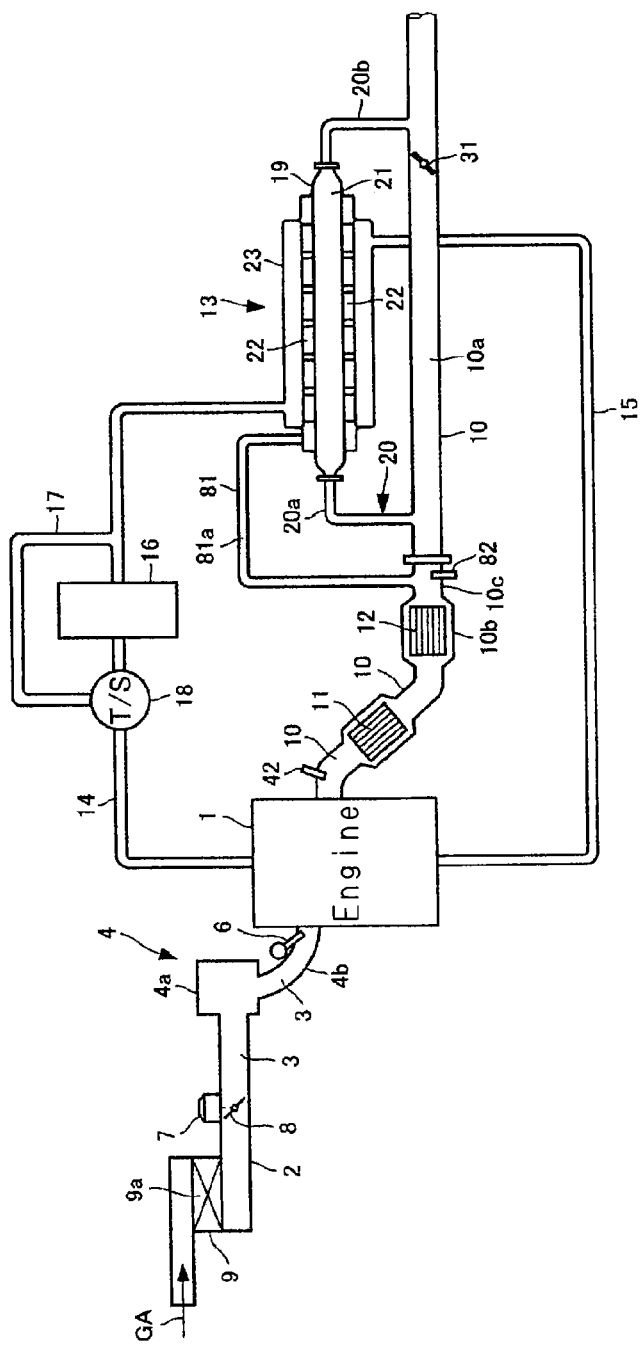
FIG. 24 is a schematic configuration view illustrating a vehicle provided with a thermoelectric generator in accordance with a fifth embodiment of the present invention.

In FIG. 24, a large-diameter portion 10b is formed in a part of the exhaust pipe 10, which is connected to the upstream side of the thermoelectric generator 13. The large-diameter portion 10b stores a catalyst 12. A small-diameter portion 10c having a smaller diameter than the large-diameter portion is formed downstream from the large-diameter portion 10b.

Figure 25:
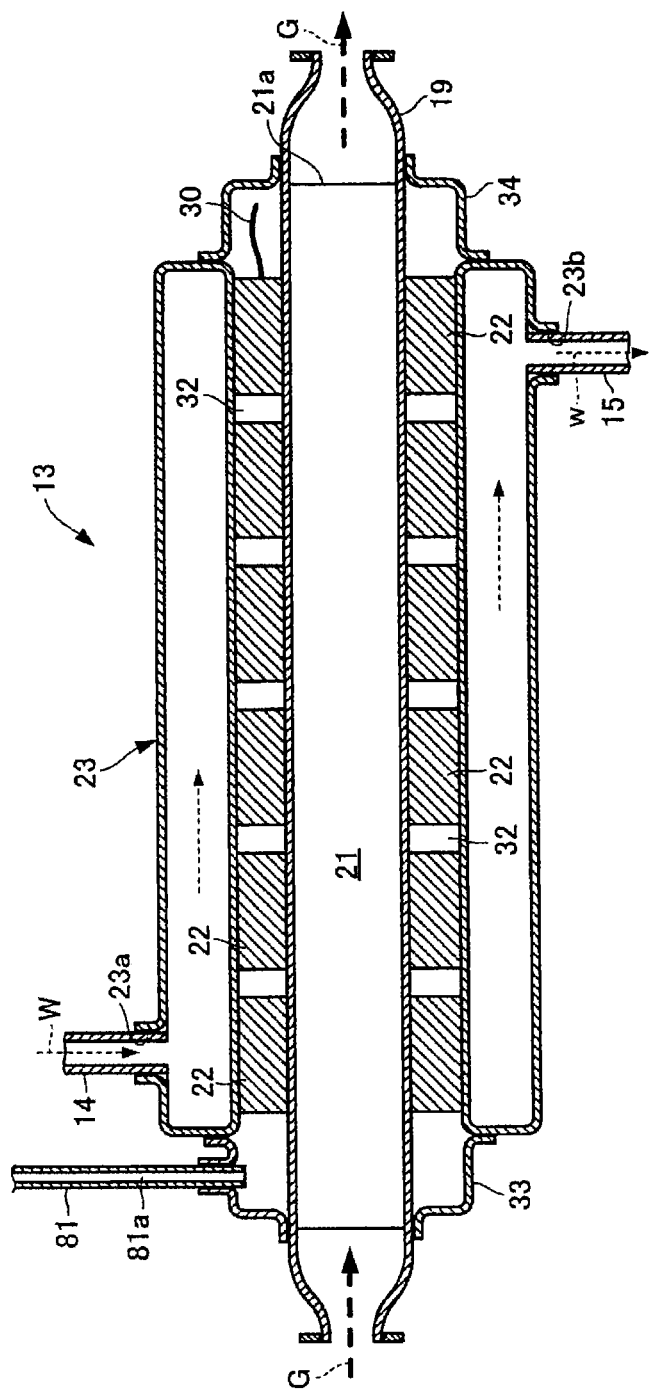
FIG. 25 is a cross-sectional side view illustrating the thermoelectric generator in accordance with the fifth embodiment of the present invention.
Figure 26:
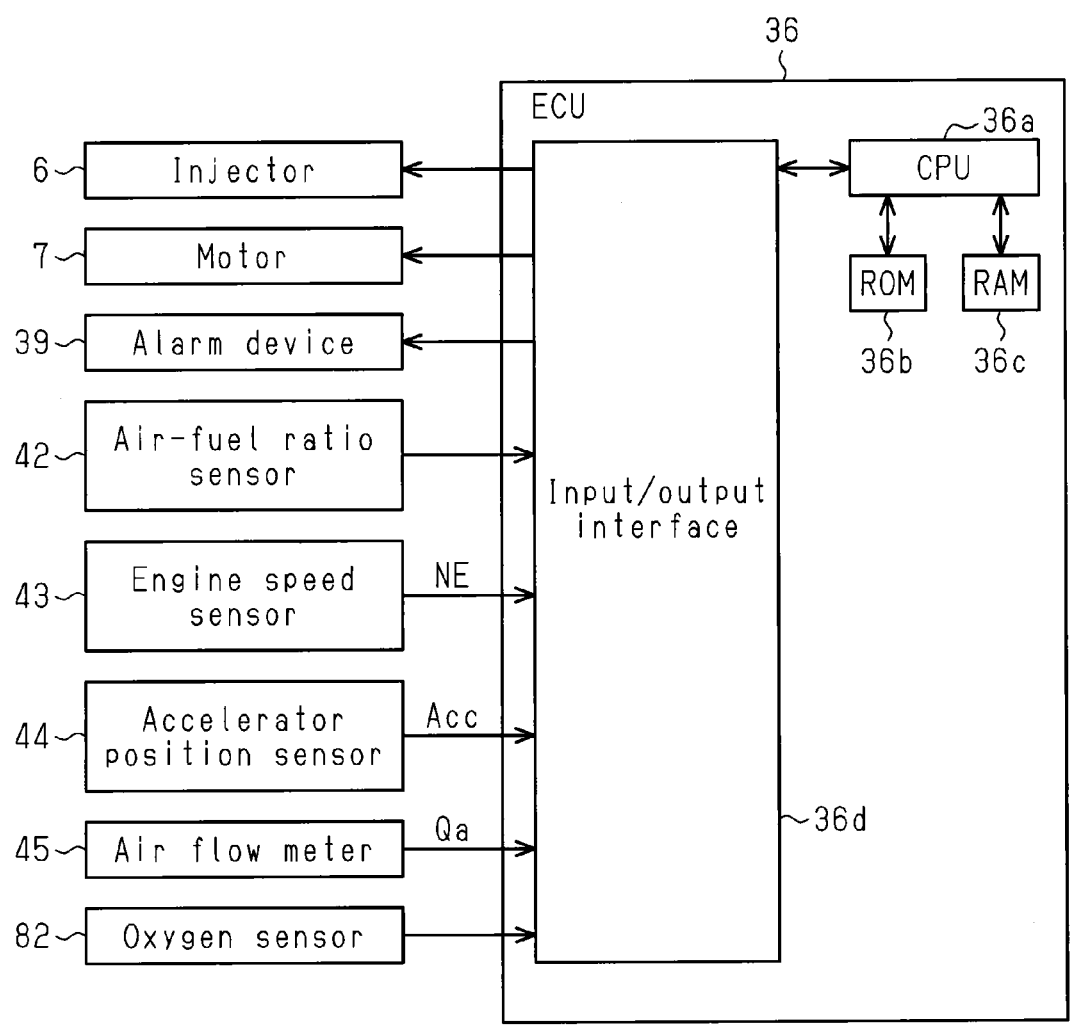
FIG. 26 is a block diagram illustrating a control circuit for an engine and the thermoelectric generator in accordance with the fifth embodiment of the present invention.

As shown in FIGS. 24 and 25, a first end of a pipe 81 as a communication pipe is connected to the small-diameter portion 10c, and a second end of the pipe 81 is connected to the plate 33 of the thermoelectric generator 13. The pipe 81 has a communication passage 81a that communicates with the module chamber 32 as well as the exhaust passage 10a in the small-diameter portion 10c, and the module chamber 32 communicates with the exhaust passage 10a through the communication passage 81a.

Thus, the flow rate of the exhaust gas discharged from the large-diameter portion 10b increases due to narrowing of the small-diameter portion 10c, and the pressure in the small-diameter portion 10c decreases due to the Venturi effect. The pressure drop of the small-diameter portion 10c leads to the negative pressure of the small-diameter portion 10c, thereby introducing the exhaust gas leaked into the module chamber 32 into the exhaust passage 10a through the pipe 81.

The small-diameter portion 10c is provided with an oxygen sensor 82 as an exhaust detecting means (or exhaust gas detection portion), and the oxygen sensor 82 is attached to the small-diameter portion 10c downstream from one end of the pipe 81. The oxygen sensor 82 outputs a binary signal indicating that the air-fuel ratio is lean or rich.

The catalysts 11 and 12 have individual differences and slightly vary in the oxygen occluded amount and the exhaust-gas purified state on each occasion. Thus, in order to maximize the exhaust-gas purifying capability of the catalysts 11 and 12, it is desirable to accurately find the exhaust-gas purified state and precisely control the air-fuel ratio.

For this reason, the oxygen sensor 82 for detecting the oxygen concentration of exhaust gas is provided downstream from the catalysts 11 and 12, and the oxygen sensor 82 detects the oxygen concentration of the exhaust gas passed through the catalysts 11 and 12. The feedback correction value for the air-fuel ratio is corrected based on the detected value.

That is, if the oxygen concentration detected by the oxygen sensor 82 is higher than a reference oxygen concentration, the ECU 36 increases the feedback correction value for the air-fuel ratio to increase the fuel injection amount. In contrast, if the oxygen concentration is lower than the reference oxygen concentration, the ECU 36 decreases the feedback correction value for the air-fuel ratio to decrease the final fuel injection amount.

On the condition that supply of fuel from the injector 6 stops, the ECU 36 of the present embodiment performs fault diagnosis on the thermoelectric generator 13 based on the detection information from the oxygen sensor 82.

In this manner, when the exhaust gas discharged from the engine 1 is lean so that a change in the oxygen concentration in the oxygen sensor 82 becomes large on the rich side, the ECU 36 can determine that the thermoelectric generator 13 has a fault. In the thermoelectric generator 13 of the present embodiment, the ECU 36 and the alarm device 39 constitute a fault diagnosis means (or fault diagnosis portion).

Figure 27:
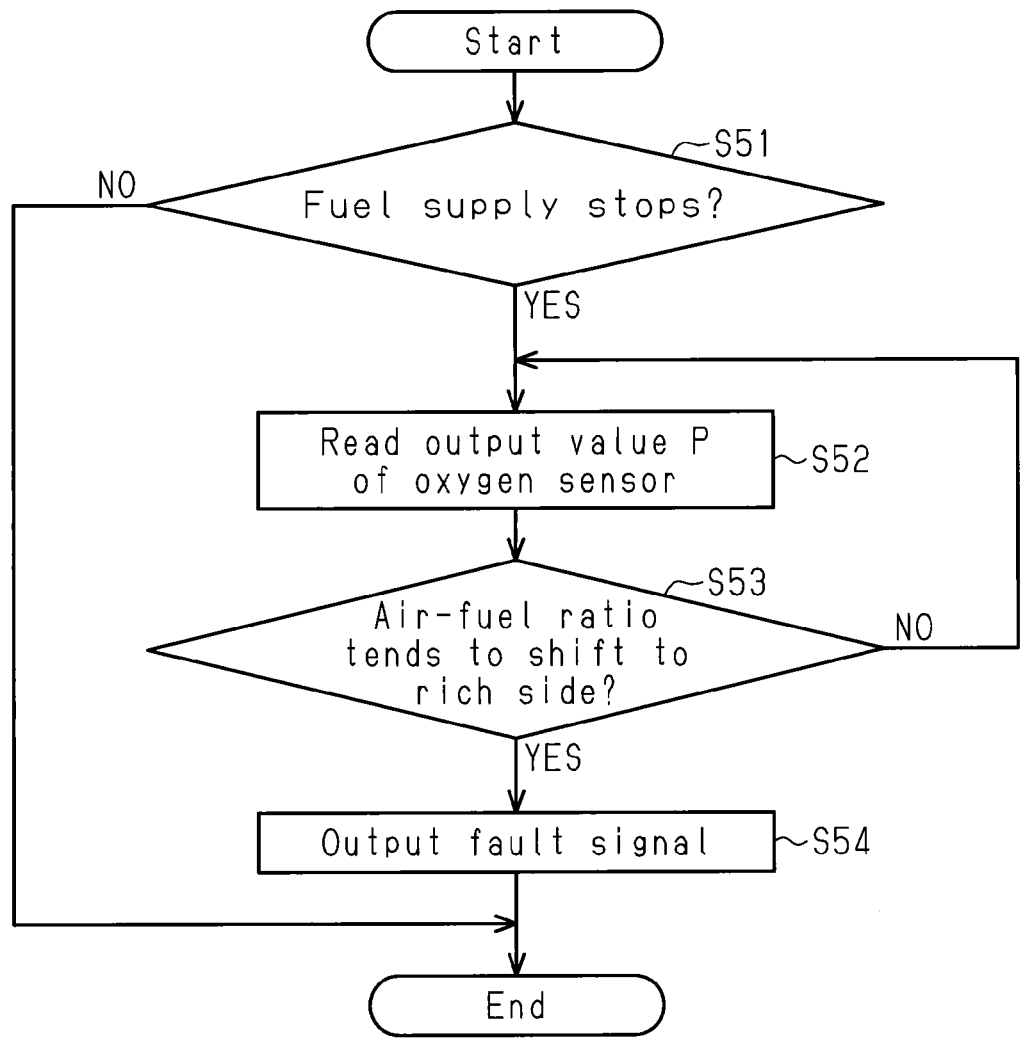
FIG. 27 is a flowchart illustrating a fault diagnosis program executed in the thermoelectric generator in accordance with the fifth embodiment of the present invention.

FIG. 27 is a flowchart of a fault diagnosis program executed by the ECU 36, and the fault diagnosis program is stored in the ROM 36b of the ECU 36, and is executed at regular intervals by the CPU 36a.

In the engine 1 of the present embodiment, when a hole is formed in the exhaust pipe portion 19 due to corrosion, a pressure drop of the exhaust gas flowing through the small-diameter portion 10c generates the negative pressure of the small-diameter portion 10c, thereby introducing the exhaust gas leaked into the module chamber 32 into the exhaust passage 10a through the pipe 81.

The ECU 36 of the present embodiment performs fault diagnosis on the thermoelectric generator 13 based on the detection information from the existing oxygen sensor 82 provided at the exhaust pipe 10.

In FIG. 27, the ECU 36 determines whether supply of fuel from the injector 6 stops (Step S51). When supply of fuel from the injector 6 does not stop, the ECU 36 finishes the current processing.

When determining that supply of fuel from the injector 6 stops, the ECU 36 reads a detection value P of the oxygen sensor 82 (Step S52) and then, determines whether the air-fuel ratio tends to shift to the rich side with respect to the stoichiometric air-fuel ratio for not less than a certain period based on detection information from the oxygen sensor 82 (Step S53).

If the output of the oxygen sensor 82 has a value indicating a lean state, the ECU 36 determines that the air-fuel ratio does not tend to shift to the rich side with respect to the stoichiometric air-fuel ratio, and the thermoelectric generator 13 has no fault, finishes the current processing, and returns to Step S52.

If the output of the oxygen sensor 82 has a value indicating a rich state for a certain period, the ECU 36 determines that the air-fuel ratio tends to shift to the rich side with respect to the stoichiometric air-fuel ratio.

That is, the ECU 36 determines that, despite the fact that the injector 6 stops injection of fuel and thus the air-fuel ratio shifts to the lean side with respect to the stoichiometric air-fuel ratio, the exhaust gas remains in the module chamber 32. That is, the ECU 36 determines that the exhaust gas of low oxygen concentration before stop of supply of fuel leaks from the module chamber 32 and mixes with the exhaust gas discharged from the engine 1, and that the thermoelectric generator 13 has a fault.

When determining that the thermoelectric generator 13 has a fault, the ECU 36 outputs a fault signal to the alarm device 39 (Step S54), and finishes the current processing.

When receiving a fault signal, the alarm device 39 issues an alert to the occupant using an indication lamp, a beeper, an audio speaker, or the like to urge the occupant to repair or replace the thermoelectric generator 13.

As described above, in the engine 1 of the present embodiment, a part of the exhaust pipe 10, which is connected to the upstream side the exhaust pipe portion 19, is constituted of the large-diameter portion 10b and the small-diameter portion 10c, which is located downstream from the large-diameter portion 10b and has a smaller diameter than the large-diameter portion 10b.

In addition, the thermoelectric generator 13 includes the pipe 81 having the communication passage 81a, the first end of which communicates with the exhaust passage 10a in the small-diameter portion 10c and the second end of which communicates with the module chamber 32. As a result, the flow rate of the exhaust gas flowing through the small-diameter portion 10c increases, generating the negative pressure in the communication passage 81a due to the Venturi effect.

Accordingly, when exhaust gas leaks into the module chamber 32 through a hole formed in the exhaust pipe portion 19 due to corrosion, the negative pressure in the small-diameter portion 10c can discharge the exhaust gas leaked into the module chamber 32 into the exhaust passage 10a.

The ECU 36 performs fault diagnosis on the thermoelectric generator 13 after stop of supply of fuel from the injector 6 based on the detection information from the oxygen sensor 82 provided in the small-diameter portion 10c. Thus, if the ECU 36 detects that the oxygen concentration of the exhaust gas discharged from the engine 1 to the exhaust pipe 10 decreases (is on the rich side) on the basis from the detection information from the oxygen sensor 82, the ECU 36 can determine that the thermoelectric generator 13 has a fault.

Therefore, fault diagnosis on the thermoelectric generator 13 can be performed using the existing oxygen sensor 82 in the engine 1 to prevent an increase in manufacturing costs of the thermoelectric generator 13.

The ECU 36 of the present embodiment performs fault diagnosis on the thermoelectric generator 13 when supply of fuel from the injector 6 stops. Thus, the detection accuracy of the oxygen sensor 82 is increased.

In the thermoelectric generator 13 of the present embodiment, the module chamber 32 is formed of a sealed space. However, the present invention is not limited to this, but a part of the module chamber 32 may communicate with the atmosphere.

The thermoelectric generator 13 of the present embodiment includes the pipe 81, which introduces exhaust gas from the module chamber 32 into the exhaust passage 10a by the negative pressure in the small-diameter portion 10c. Thus, even when a part of the module chamber 32 communicates with the atmosphere, exhaust gas leaked into the module chamber 32 is reliably introduced into the exhaust passage 10a by the negative pressure in the small-diameter portion 10c. Therefore, fault diagnosis on the thermoelectric generator 13 is reliably performed using the oxygen sensor 82.

In the present embodiment, a fault of the thermoelectric generator 13 can be determined before formation of a hole in the coolant pipe 23. Thus, leakage of coolant from the coolant pipe 23 is reliably prevented. This reliably prevents lowering of the cooling performance of the engine 1.

In the thermoelectric generator 13 of the present embodiment, fault diagnosis on the thermoelectric generator 13 is performed based on the detection information from the oxygen sensor 82. Similarly to that shown in FIG. 2, however, the module chamber 32 may be provided with an HC sensor 35, and fault diagnosis on the thermoelectric generator 13 may be performed based on the detection information from the HC sensor 35 and the detection information from the oxygen sensor 82. In this manner, the accuracy of determining a fault of the thermoelectric generator 13 is further increased.

In each of the embodiments, the cooling medium is formed of coolant. However, the present invention is not limited to this, but the cooling medium may be any liquid other than coolant or any gas such as air.

Advantageously, the thermoelectric generator according to the present invention detects leakage of exhaust gas into the space portion provided with thermoelectric conversion modules to perform fault diagnosis on the thermoelectric generator, and includes thermoelectric conversion modules capable of performing thermoelectric generation based on the temperature difference between the high-temperature part and the low-temperature part.

Sixth Embodiment

FIGS. 28 to 35 are diagrams illustrating a thermoelectric generator in accordance with a sixth embodiment of the present invention.

First, configuration will be described.

Figure 28:
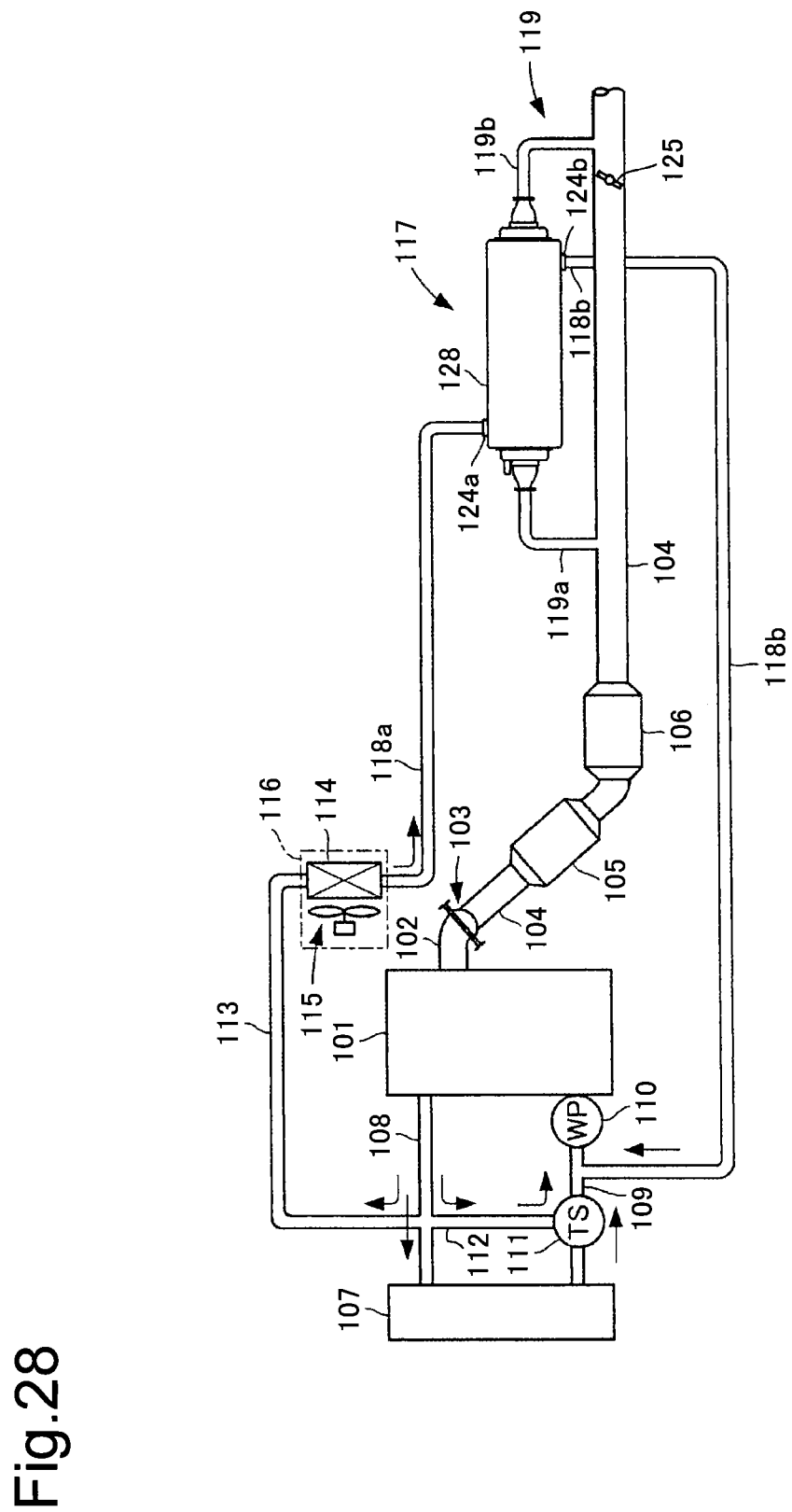
FIG. 28 is a schematic configuration view illustrating a vehicle provided with a thermoelectric generator in accordance with a sixth embodiment of the present invention.

As shown in FIG. 28, in the engine 101, which is an internal combustion engine mounted in a vehicle such as an automobile, air-fuel mixture acquired by mixing air from the intake system with fuel from the fuel supply system at an appropriate air-fuel ratio is supplied to the combustion chamber and combusted. Then, exhaust gas generated through the combustion is discharged from the exhaust system to the atmosphere.

The exhaust system includes an exhaust manifold 102 attached to the engine 101 and an exhaust pipe 104 connected to the exhaust manifold 102 via a spherical joint 103. The exhaust manifold 102 and the exhaust pipe 104 form an exhaust passage.

The spherical joint 103 allows appropriate swinging between the exhaust manifold 102 and the exhaust pipe 104, and prevents transmission of vibration and movement of the engine 101 to the exhaust pipe 104 or transmits lessened vibration and movement of the engine 101 to the exhaust pipe 104.

Two catalysts 105 and 106 are serially mounted in the exhaust pipe 104, and purify exhaust gas.

Out of the catalysts 105 and 106, the catalyst 105 arranged on the upstream side in the exhaust pipe 104 in the exhaust-gas exhaust direction is called a start catalyst (S/C), and the catalyst 106 arranged on the downstream side in the exhaust pipe 104 in the exhaust-gas exhaust direction is called a main catalyst (M/C) or a underfloor catalyst (U/F).

The catalysts 105 and 106 are each formed of a three-way catalyst, for example. The three-way catalysts have a purifying effect of collectively converting carbon monoxide (CO), hydrocarbon (HC), and nitrogen oxide (NOx) into harmless components by chemical reaction.

A water jacket is formed in the engine 101, and the water jacket is filled with cooling liquid (hereinafter referred to as merely coolant) called long life coolant (LLC).

The coolant is led out through a lead-out pipe 108 attached to the engine 101 and then, is supplied to a radiator 107, and returns from the radiator 107 to the engine 101 through a reflux pipe 109. The radiator 107 cools coolant circulated by a water pump 110 through heat exchange with the outside air.

A bypass pipe 112 is coupled to the reflux pipe 109, and a thermostat 111 is provided between the bypass pipe 112 and the reflux pipe 109 to adjust the amount of coolant flowing through the radiator 107 and the amount of coolant flowing through the bypass pipe 112.

For example, during warming up of the engine 101, the amount of coolant in the bypass pipe 112 is increased to promote warming up.

A heater pipe 113 is coupled to the bypass pipe 112, and a heater core 114 is provided in the middle of the heater pipe 113. The heater core 114 is a heat source that uses heat of coolant to warm the passenger compartment.

Air warmed by the heater core 114 is conducted into the passenger compartment by a blower fan 115. The heater core 114 and the blower fan 115 constitute a heater unit 116.

The heater pipe 113 is provided with an upstream-side pipe 118a, which supplies coolant to a below-mentioned thermoelectric generator 117, and a downstream-side pipe 118b, which discharges coolant from the thermoelectric generator 117 to the reflux pipe 109 and is provided between the thermoelectric generator 117 and the reflux pipe 109.

Thus, while the thermoelectric generator 117 performs an exhaust heat recovery operation (details of the exhaust heat recovery operation will be described below), the coolant flowing through the downstream-side pipe 118b has a higher temperature than the coolant flowing through the upstream-side pipe 118a.

The exhaust system of the engine 101 is provided with the thermoelectric generator 117, which is attached to a bypass pipe 119 branching off the exhaust pipe 104. The thermoelectric generator 117 recovers heat of the exhaust gas discharged from the engine 101, and converts thermal energy of the exhaust gas into electric energy.

Figure 29:
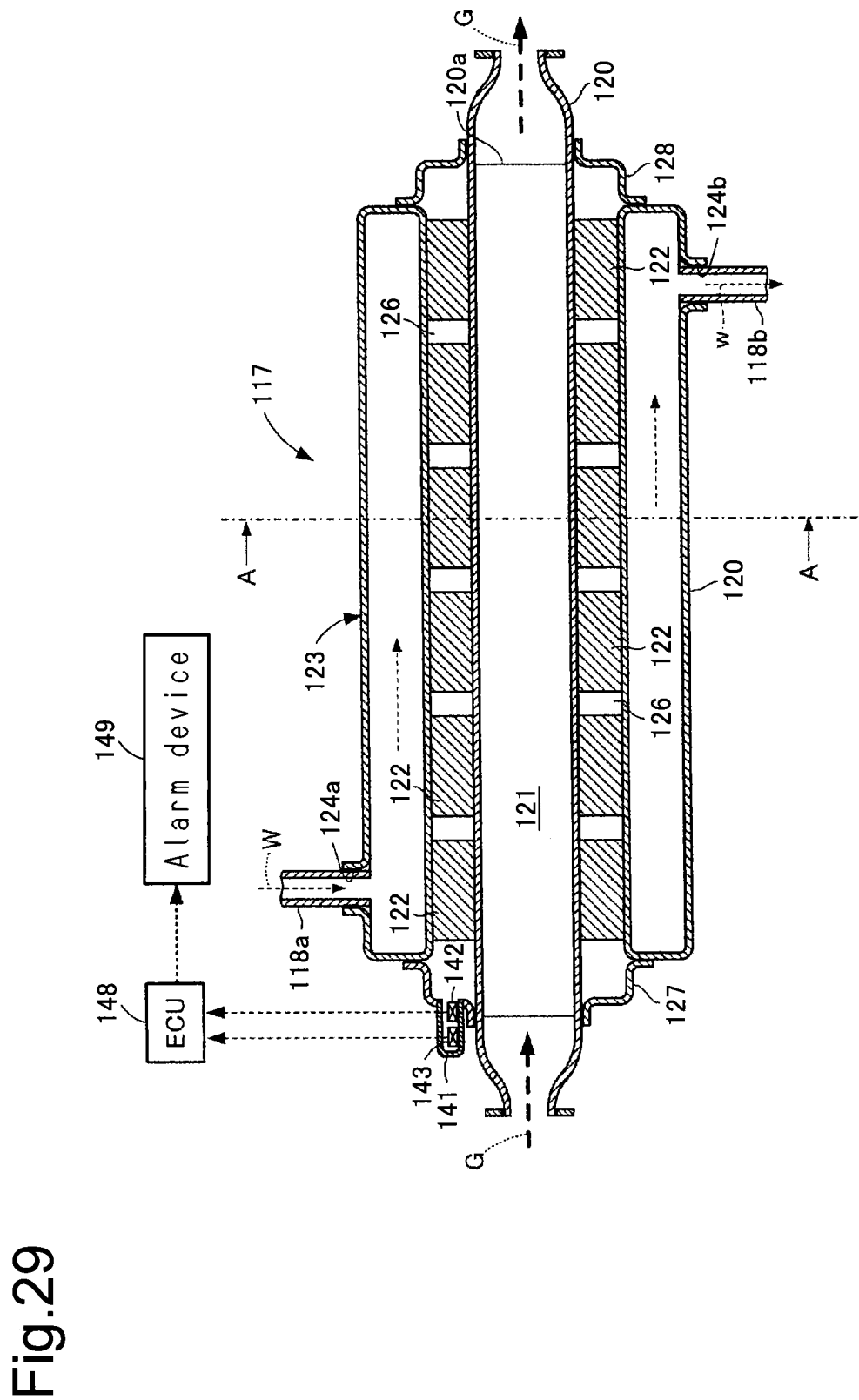
FIG. 29 is a cross-sectional side view illustrating of the thermoelectric generator in accordance with the sixth embodiment of the present invention.
Figure 30:
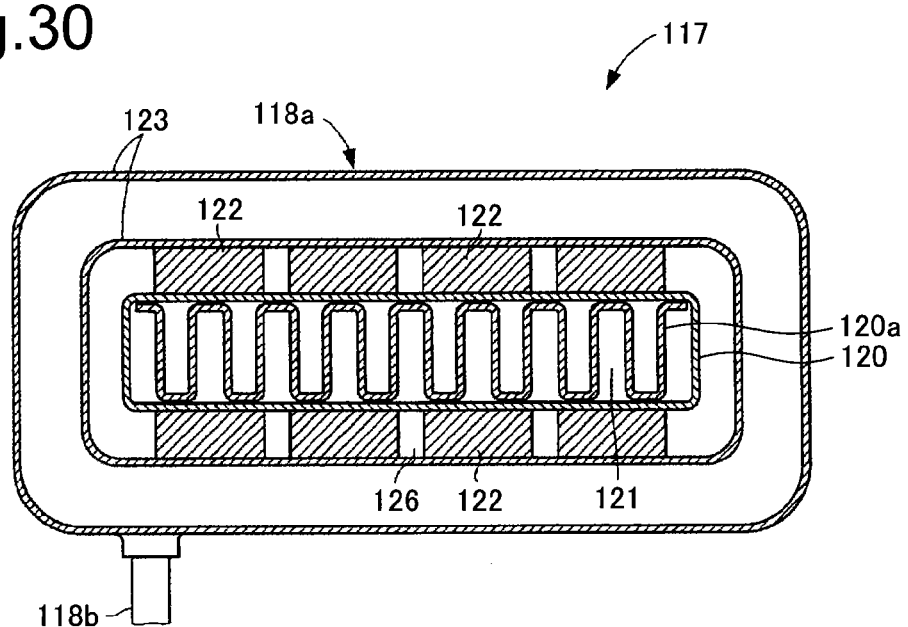
FIG. 30 is a cross-sectional view taken along line A-A in FIG. 29, illustrating the thermoelectric generator in accordance with the sixth embodiment of the present invention.

As shown in FIGS. 29 and 30, the thermoelectric generator 117 includes the small-diameter exhaust pipe 120 into which the exhaust gas G as a high-temperature fluid discharged from the engine 101 is conducted. The upstream end of the exhaust pipe 120 is connected to an upstream pipe portion 119a of the bypass pipe 119, the downstream end of the exhaust pipe 120 is connected to the downstream pipe portion 119b of the bypass pipe 119, and the exhaust pipe 120 has an exhaust passage 121 therein into which the exhaust gas G conducted from the exhaust pipe 104 into the upstream pipe portion 119a of the bypass pipe 119 is conducted. The exhaust passage 121 discharges the exhaust gas G into the exhaust pipe 104 through the downstream pipe portion 119b of the bypass pipe 119.

Thus, the exhaust gas G discharged from the engine 101 to the exhaust passage 121 of the exhaust pipe 120 through the exhaust pipe 104 is discharged again to the outside through the exhaust pipe 104.

The thermoelectric generator 117 includes a plurality of thermoelectric conversion modules 122 mounted in the exhaust direction of the exhaust gas G and a tubular coolant pipe 123 provided coaxially with the exhaust pipe 120.

Figure 31:
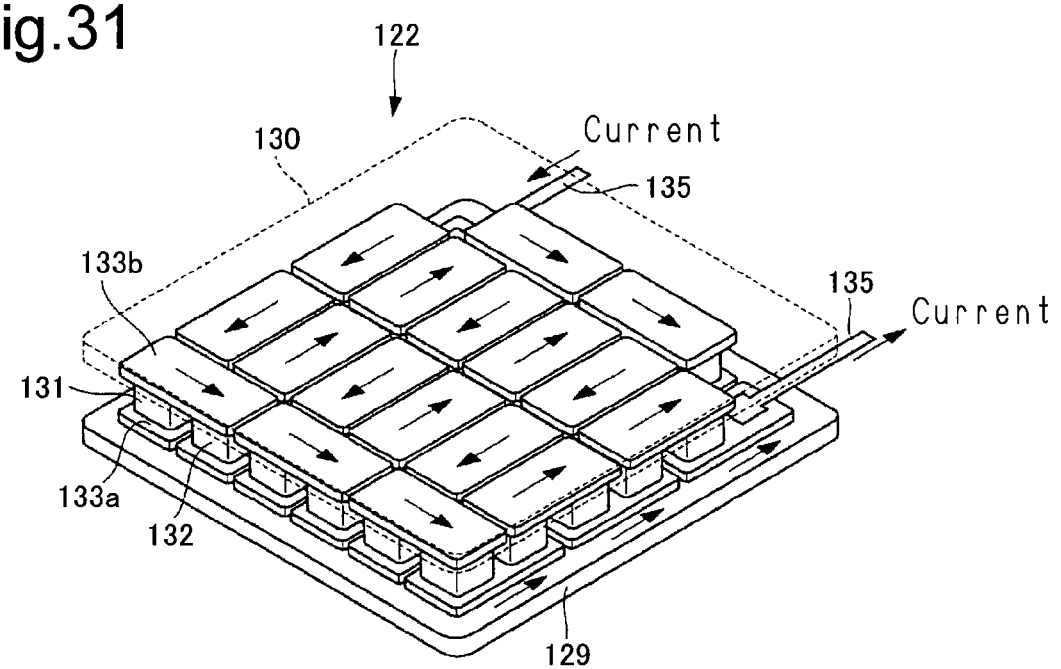
FIG. 31 is a perspective view illustrating a thermoelectric conversion module of the thermoelectric generator in accordance with the sixth embodiment of the present invention.
Figure 32:
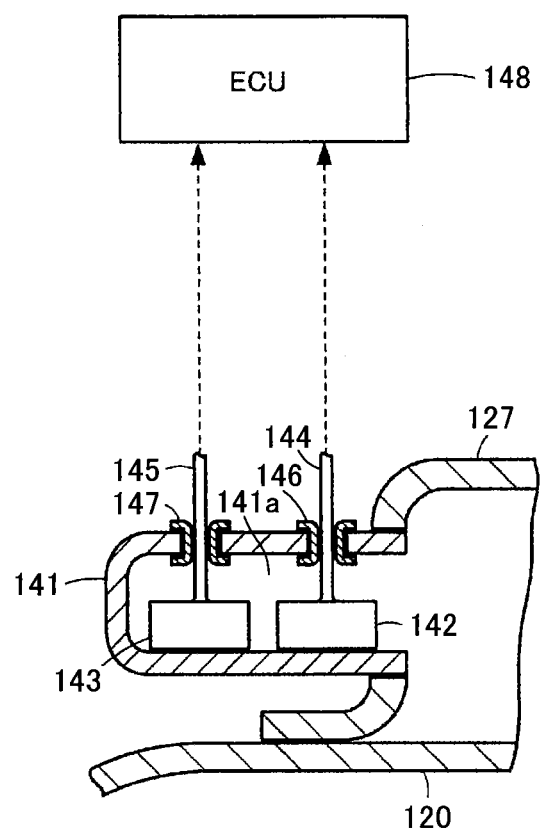
FIG. 32 is a configuration view illustrating a communication pipe of the thermoelectric generator in accordance with the sixth embodiment of the present invention.

As shown in FIG. 31, the thermoelectric conversion modules 122 each have a plurality of N-type thermoelectric conversion elements 131 and P-type thermoelectric conversion elements 132, which generate an electromotive force based on a temperature difference by the Seebeck effect between an insulating ceramic heating board 129 as a high-temperature part and an insulating ceramic radiating board 130 as a low-temperature part. The N-type thermoelectric conversion elements 131 and the P-type thermoelectric conversion elements 132 are connected alternatively and serially via electrodes 133a and 133b. The adjacent thermoelectric conversion modules 122 are electrically interconnected via a wire 135.

Examples of the N-type thermoelectric conversion elements 131 and the P-type thermoelectric conversion elements 132 include Bi—Te-based thermoelectric conversion elements having a usage upper limit (heatproof temperature) of about 300° C. of the high-temperature part and Si—Ge-based thermoelectric conversion elements having a usage upper limit of about 500° C. of the high-temperature part.

In FIGS. 29 and 30, the heating board 129, the radiating board 130, the N-type thermoelectric conversion elements 131, the P-type thermoelectric conversion elements 132, and the electrodes 133a and 133b are omitted to simplify the thermoelectric conversion modules 122. In fact, the heating board 129 is opposed to and contacts the exhaust pipe 120, and the radiating board 130 is opposed to and contacts the coolant pipe 123.

The thermoelectric conversion modules 122 of the present embodiment are substantially square plate and need to be in close contact with the exhaust pipe 120 and the coolant pipe 123. Thus, the exhaust pipe 120 and the coolant pipe 123 are rectangular.

The exhaust pipe 120 and the coolant pipe 123 may be circular. In this case, the heating board 129 and the radiating board 130 of the thermoelectric conversion modules 122 may be curved. The exhaust passage 121 of the exhaust pipe 120 is provided with a comb-like heat transfer member 120a. The heat transfer member 120a is bent along the width of the exhaust pipe 120, and extends in the longitudinal direction of the exhaust pipe 120, and the bent portions of its upper end and lower end are in contact with the inner circumferential upper surface and the inner circumferential lower surface of the exhaust pipe 120, respectively, so as to surface the heating board 129.

For this reason, heat of exhaust gas flowing through the exhaust passage 121 is efficiently transferred to the heating board 129 along the heat transfer member 120a.

The coolant pipe 123 includes a coolant inlet portion 124a coupled to the upstream-side pipe 118a and a coolant outlet portion 124b coupled to the downstream-side pipe 118b.

The coolant pipe 123 is arranged such that the coolant outlet portion 124b is provided downstream from the coolant inlet portion 124a in the exhaust direction. This allows the coolant W to be conducted from the coolant inlet portion 124a to the coolant pipe 123 and flow in the same direction as the exhaust direction of the exhaust gas G. As a result, the coolant W flows in the same direction as the flowing direction of the exhaust gas G in the exhaust pipe 120.

The coolant pipe 123 may be arranged such that the coolant outlet portion 124b is provided upstream from the coolant inlet portion 124a in the exhaust direction. In this case, the coolant conducted from the coolant inlet portion 124a to the coolant pipe 123 flows in the opposite direction to the exhaust direction of the exhaust gas G.

As shown in FIG. 28, the exhaust pipe 104 is provided with an on-off valve 125, and the on-off valve 125 is provided between the upstream pipe portion 119a and the downstream pipe portion 119b of the bypass pipe 119, and is rotationally attached to the exhaust pipe 104 to open/close the exhaust pipe 104. The on-off valve 125 is automatically opened/closed according to the pressure of exhaust gas flowing through the exhaust pipe 104.

That is, during idling and in the low and middle speed range of the engine 101, the on-off valve 125 closes the exhaust pipe 104, thereby conducting the exhaust gas conducted into the exhaust pipe 104 into the exhaust pipe 120 through the bypass pipe 119.

In the high-speed range of the engine 101, the on-off valve 125 is opened by high-pressure exhaust gas to open the exhaust pipe 104, and discharges exhaust gas through the exhaust pipe 104, not through the exhaust pipe 120, thereby preventing an increase in the back pressure of the exhaust gas to prevent a fall in the exhaust performance.

In the high-speed range of the engine 101, by setting the opening degree of the on-off valve 125 to a predetermined opening degree, some of the exhaust gas may be conducted into the exhaust pipe 120 through the bypass pipe 119. This enables the thermoelectric generator 117 to perform thermoelectric generation while preventing an increase in the back pressure of the exhaust gas.

A space between the exhaust pipe 120 and the coolant pipe 123 defines a module chamber 126 that is a sealed space in which the thermoelectric conversion modules 122 are arranged. That is, a plate 127 is attached between the upstream side of the exhaust pipe 120 and the coolant pipe 123 to close the upstream end of the module chamber 126.

A plate 128 is attached between the downstream side of the exhaust pipe 120 and the coolant pipe 123 to close the downstream end of the module chamber 126. Accordingly, the module chamber 126 is formed of a sealed space surrounded by the outer circumference of the exhaust pipe 120, the inner circumference of the coolant pipe 123, and the plates 127 and 128. In the thermoelectric generator 117 of the present embodiment, the exhaust pipe 120, the coolant pipe 123, and the plates 127 and 128 constitute a sealed member.

A communication pipe 141 is connected to the plate 127 (see FIG. 32), and the communication pipe 141 has a communication chamber 141a constituting a sealed space in communication with the module chamber 126. A pressure sensor 142 for detecting the pressure in the module chamber 126 and a temperature sensor 143 for detecting the temperature of the module chamber 126 are arranged in the communication chamber 141a of the communication pipe 141.

Wires 144, 145 of the pressure sensor 142 and the temperature sensor 143 are drawn out of the communication chamber 141a through the inner circumferences of sealing members 146 and 147, respectively, sealing openings on the communication pipe 141. The communication chamber 141a is sealed with the sealing members 146 and 147. Thus, the module chamber 126 is isolated from outside air to keep its sealed state.

The wires 144 and 145 are connected to an electronic control unit (ECU) 148, and detection information from the pressure sensor 142 and the temperature sensor 143 is outputted to the ECU 148 via the wires 144 and 145. The pressure sensor 142 and the temperature sensor 143 may be provided directly in the module chamber 126.

The ECU 148 includes a central processing unit (CPU), a read only memory (ROM), and a random access memory (RAM), which are not illustrated, to constitute an electronic control circuit.

At manufacturing of the thermoelectric generator 117, the pressure in the module chamber 126 is previously set to a reference pressure P101. However, the reference pressure P101 is a relative pressure. That is, the pressure represents a difference from the atmospheric pressure. For this reason, the reference pressure P101 is the pressure in the absence of leakage of air into the module chamber 126, that is, leakage of exhaust gas into the module chamber 126.

The reference pressure P101 varies depending on the temperature of the module chamber 126. Thus, the RAM of the ECU 148 previously stores a basic map in which the temperature of the module chamber 126 is associated with the reference pressure.

In the basic map, for example, when the module chamber 126 is sealed at the temperature of 25° C. and a positive relative pressure of 50 kPa, a temperature of the module chamber 126 of −30° C. is assigned to a relative pressure of 20 kPa, and a temperature of the module chamber 126 of 400° C. is assigned to a relative pressure of 230 kPa. In the basic map, for example, the reference pressure P101 is assigned every 10° C. The numeric values of the temperature and the reference pressure P101 are merely examples and not limited to these.

Referring to the basic map, the ECU 148 reads from the ROM the reference pressure P101 corresponding to the temperature of the module chamber 126, which is detected by the temperature sensor 143, and compares a current pressure P102 of the module chamber 126, which is detected by the pressure sensor 142, with the reference pressure P101.

Then, if the difference between the reference pressure P101 and the pressure P102 equals to or larger than a predetermined threshold P0, the ECU 148 determines that exhaust gas leaks into the module chamber 126, and outputs a fault signal to an alarm device 149.

The alarm device 149 is, for example, an indication lamp, a beeper, or an audio speaker, and is mounted on an instrument panel. When receiving a fault signal from the ECU 148, the alarm device 149 issues a visual or audible alarm about a fault of the thermoelectric generator 117 to the vehicle occupant, who is the user.

In the thermoelectric generator 117 of the present embodiment, the ECU 148, the pressure sensor 142, and the temperature sensor 143 constitute a fault diagnosis means (or fault diagnosis portion), and the ECU 148, the pressure sensor 142, the temperature sensor 143, and the alarm device 149 constitute a fault diagnosis device.

Next, operation will be described.

At cold start of the engine 101, all of the catalysts 105 and 106 and coolant of the engine 101 are at a low temperature (at about the outside temperature).

When the engine 101 is activated in this state, the engine 101 discharges exhaust gas into the exhaust pipe 104 through the exhaust manifold 102, increasing the temperature of the two catalysts 105 and 106 due to heat of the exhaust gas G.

The coolant is returned to the engine 101 through the bypass pipe 112 without passing the radiator 107, thereby achieving warming up.

At cold start of the engine 101, for example, the pressure of exhaust gas is low with the engine 101 at idling and thus, the on-off valve 125 is closed.

For this reason, the exhaust gas G conducted into the bypass pipe 119 from the exhaust pipe 104 is conducted into the exhaust passage 121, and the exhaust gas G passing the bypass pipe 119 rises the temperature of the coolant W flowing though the coolant pipe 123 to promote warming of the engine 101.

In the low and middle speed range of the engine 101 after warming up of the engine 101, even when the temperature of the exhaust gas is high, the on-off valve 125 is closed. Accordingly, the exhaust gas G is conducted from the exhaust pipe 104 into the exhaust passage 121 of the exhaust pipe 120 through the bypass pipe 119.

Here, the hot exhaust gas flowing through the exhaust passage 121 acts on the heating boards 129 of the thermoelectric conversion modules 122, and the cold coolant flowing through the coolant pipe 123 acts on the radiating boards 130 of the thermoelectric conversion modules 122. Thus, the temperature difference between the heating boards 129 and the radiating boards 130 of the thermoelectric conversion modules 122 generates power. Then, the generated electric power is supplied to the battery via a cable (not shown), and charges the battery.

In the high-speed range of the engine 101, it is needed to improve the cooling performance of the engine 101. In the high-speed range of the engine 101, for example, the engine 101 operates at high speed to increase the pressure of exhaust gas. As a result, the pressure of the exhaust gas G conducted into the exhaust pipe 104 rises to open the on-off valve 125.

When the on-off valve 125 is opened, exhaust gas is discharged to the outside through the exhaust pipe 104 without being conducted into the bypass pipe 119. For this reason, hot exhaust gas does not heat the coolant W flowing through the coolant pipe 123.

At this time, the thermostat 111 blocks communication of the bypass pipe 112 with the reflux pipe 109, thereby conducting the coolant exited from the engine 101 through the lead-out pipe 108 to the reflux pipe 109 via the radiator 107. Accordingly, the cold coolant is supplied to the engine 101 to improve the cooling performance of the engine 101.

Since the on-off valve 125 opens in the high-speed range of the engine 101, the back pressure of the exhaust gas flowing through the exhaust pipe 104 does not increase. This prevents lowering of the exhaust performance of exhaust gas.

Next, a fault diagnosis process executed by the ECU 148 according to a flowchart in FIG. 33 will be described. The flowchart in FIG. 33 is stored in the ROM of the ECU 148 and is executed at regular intervals by the CPU.

Figure 33:
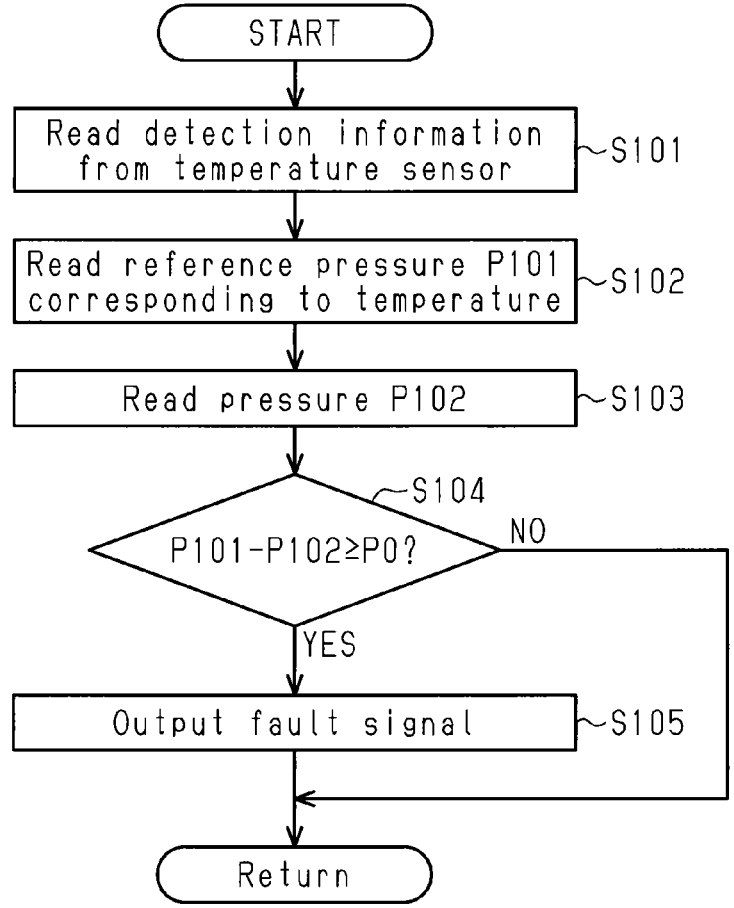
FIG. 33 is a flowchart illustrating a fault diagnosis process executed in the thermoelectric generator in accordance with the sixth embodiment of the present invention.

In FIG. 33, the ECU 148 reads detection information from the temperature sensor 143 (Step S101) and then, refers to the basic map based on the detection information, and reads the reference pressure P101 corresponding to the temperature of the module chamber 126 (Step S102). For example, if the temperature of the module chamber 126 is 400° C., 230 kPa is read as the reference pressure.

Next, the ECU 148 reads the current pressure P102 of the module chamber 126 based on detection information from the pressure sensor 142 (Step S103), calculates a differential pressure between the reference pressure P101 and the pressure P102, and determines whether the differential pressure is equal to or larger than the threshold P0 (Step S104).

If the ECU 148 determines that the differential pressure between the reference pressure P101 and the pressure P102 is smaller than the threshold P0 in Step S104, the ECU 148 determines that no hole is formed in the exhaust pipe 120 and finishes the process.

If the ECU 148 determines that the differential pressure between the reference pressure P101 and the pressure P102 is equal to or larger than the threshold P0 in Step S104, the ECU 148 determines that a hole is formed in the exhaust pipe 120.

Specifically, even when the exhaust pipe 120 and the heat transfer member 120a are formed of corrosion-resistant stainless steel plates, acidic condensed water can be generated in the exhaust passage 121 in regions where fuel having a high sulfur content is used, and a hole may be formed in the exhaust pipe 120 by the corrosive action of condensed water.

In this case, the thermoelectric conversion modules 122 is exposed to exhaust gas leaked from the exhaust pipe 120 into the module chamber 126, and deteriorates to lower its power generation efficiency.

The coolant pipe 123 may corrode with time due to the condensed water leaked into the module chamber 126, causing leakage of coolant from the coolant pipe 123 to lower the cooling performance of the engine 101.

Figure 34:
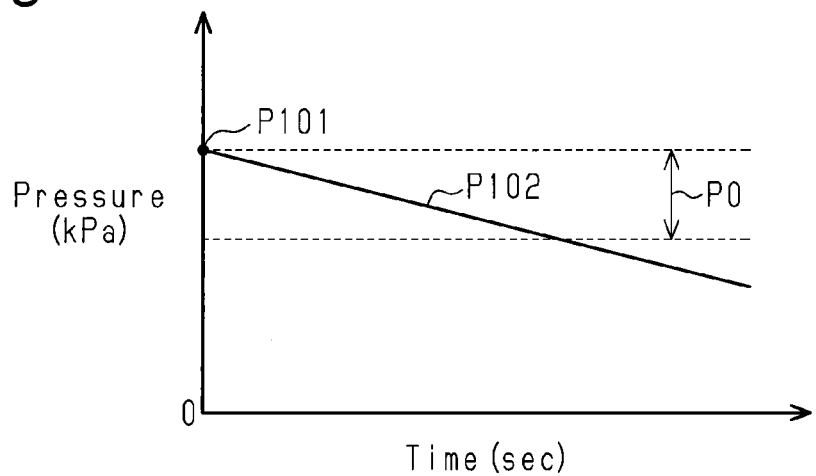
FIG. 34 is a graph illustrating a change in the pressure in the sealed space, which is set to a positive reference pressure, when exhaust gas leaks in the thermoelectric generator in accordance with the sixth embodiment of the present invention.

When a hole is made in the exhaust pipe 120, the pressure in the module chamber 126 gradually decreases as shown in FIG. 34.

If the ECU 148 of the present embodiment determines that the pressure P102 in the module chamber 126 lowers from the reference pressure P101, and the differential pressure between the pressure P102 and the reference pressure P101 is larger than the threshold P0, the ECU 148 determines that a hole is formed in the exhaust pipe 120 and gas leaks from the exhaust pipe 120 into the module chamber 126, and outputs a fault signal to the alarm device 149 (Step S105).

This enables the user to recognize the fault on the thermoelectric generator 117 according to the alarm from the alarm device 149, and to be urged to perform repair or replacement of the thermoelectric generator 117.

As described above, in the thermoelectric generator 117 of the present embodiment, the ECU 148 can detects the change in the pressure in the module chamber 126, which stores the thermoelectric conversion modules 122, and determine whether exhaust gas leaks into the module chamber 126 based on the change in the pressure in the module chamber 126, detecting leakage of exhaust gas through a hole generated in the exhaust pipe 120 at an early stage.

Therefore, exhaust gas is prevented from leaking into the module chamber 126 to deteriorate the thermoelectric conversion modules 122, thereby preventing lowering of the power generation efficiency of the thermoelectric conversion modules 122.

Since the ECU 148 can determine leakage of exhaust gas before formation of a hole in the coolant pipe 123, leakage of coolant from the coolant pipe 123 is reliably prevented. This reliably prevents lowering of the cooling performance of the engine 101.

The ECU 148 of the present embodiment determines that exhaust gas leaks into the module chamber 126 if the differential pressure between the reference pressure P101 in the absence of leakage of exhaust gas into the module chamber 126 and the pressure in the module chamber 126 is equal to or larger than the predetermined threshold P0. Thus, the leakage of exhaust gas in the module chamber 126 can be readily determined at an early stage.

The ECU 148 of the present embodiment corrects the reference pressure P101 depending on the temperature of the module chamber 126 and compares the corrected reference pressure P101 and the pressure P102 in the module chamber 126. Thus, leakage of exhaust gas can be determined with high accuracy.

If the reference pressure P101 is a fixed value, changes in the temperature of the module chamber 126 would change the true value of the reference pressure P101, and the reference pressure P101 (fixed value) would deviate from the true value. For example, when the temperature of the module chamber 126 rises, the true value also rises. However, since the reference pressure P1 is the fixed value, the reference pressure P1 deviates from the true value to the lower side. In this case, the reference pressure P1 (fixed value) may be close to the pressure P102 in the module chamber 126 in the presence of leakage of exhaust gas into the module chamber 126. In the case where the reference pressure P1 (fixed value) is close to the pressure P102 in the module chamber 126 in the presence of leakage of exhaust gas into the module chamber 126, it is difficult to compare the pressure P102 with the reference pressure P1 to determine leakage of exhaust gas.

In contrast, the ECU 148 of the present embodiment corrects the reference pressure P101 depending on the temperature of the module chamber 126, preventing the reference pressure P101 from deviating from the true value due to a change in the temperature of the module chamber 126.

Since the ECU 148 of the present embodiment causes the alarm device 149 to issue an alarm on the condition of the determination that exhaust gas leaks into the module chamber 126, the ECU 148 can inform the user of the leakage of exhaust gas in the module chamber 126 and urge the user to perform repair or replacement of the thermoelectric generator 117.

The thermoelectric generator 117 of the present embodiment includes the pressure sensor 142 mounted in the communication pipe 141 having the sealed communication chamber 141a in communication with the module chamber 126, and the ECU 148 performs diagnosis on leakage of exhaust gas into the module chamber 126 based on detection information from the pressure sensor 142.

Thus, the leakage of exhaust gas into the module chamber 126 can be determined with the pressure sensor 142 under the same pressure condition as the pressure condition of the module chamber 126.

Therefore, a change in the pressure in the module chamber 126 is detected with high accuracy, improving the accuracy of diagnosis on leakage of exhaust gas.

The threshold P0 may be a constant value, or may be increased as the pressure in the module chamber 126 becomes higher and decreased as the pressure becomes lower.

At manufacturing of the thermoelectric generator 117, the pressure in the module chamber 126 may be previously set to a reference pressure P103 that is any negative pressure.

Since the reference pressure P103 varies depending on the temperature of the module chamber 126, the RAM of the ECU 148 stores a basic map in which the temperature of the module chamber 126 is associated with the reference pressure.

In the basic map, for example, when the module chamber 126 is sealed at the temperature of 25° C. and a negative pressure of −80 kPa, a temperature of the module chamber 126 of −30° C. is assigned to a negative pressure of −84 kPa, and a temperature of the module chamber 126 of 400° C. is assigned to a negative pressure of −55 kPa.

In the basic map, for example, the reference pressure P103 is assigned every 10° C. These numerical values of the temperature and the reference pressure P103 are merely examples and not limited to these.

Referring to the basic map, the ECU 148 reads the reference pressure P103 Corresponding to the temperature of the module chamber 126, which is detected by the temperature sensor 143, and compares the current pressure P102 of the module chamber 126, which is detected by the pressure sensor 142, and the reference pressure P103.

Figure 35:
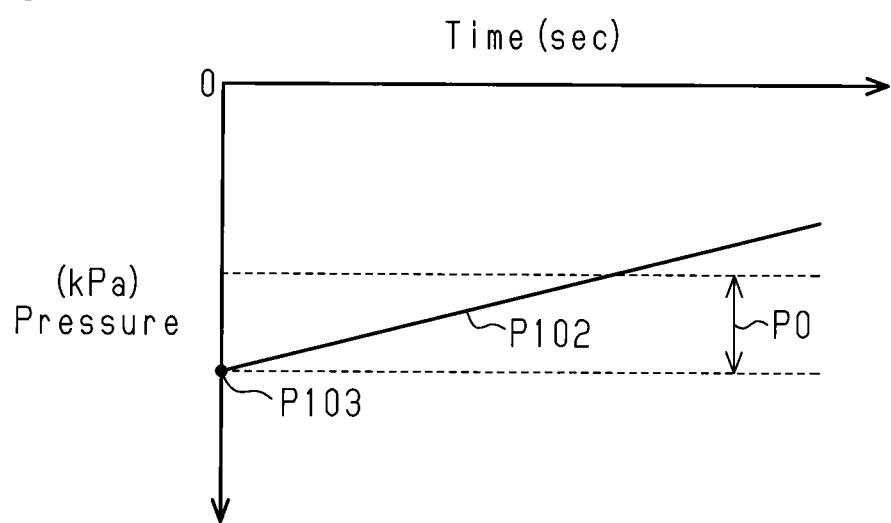
FIG. 35 is a graph illustrating a change in the pressure in the sealed space, which is set to a negative reference pressure, when exhaust gas leaks in the thermoelectric generator in accordance with the sixth embodiment of the present invention.

As shown in FIG. 35, if the differential pressure between the reference pressure P103 and the current pressure P102 equals to or larger than the predetermined threshold P0, the ECU 148 determines that exhaust gas leaks into the module chamber 126. This also enables early detection of leakage of exhaust gas due to a hole in the exhaust pipe 120.

In the thermoelectric generator 117 of the present embodiment, the temperature sensor 143 is provided in the communication pipe 141 having the communication chamber 141a, and the ECU 148 directly detects the temperature of the module chamber 126 based on the detection information from the temperature sensor 143. However, the present invention is not limited to this.

For example, the ECU 148 may estimate the temperature of the module chamber 126 based on the temperature of the exhaust gas, which is detected with an existing exhaust temperature sensor for detecting the temperature of exhaust gas.

The thermoelectric generator of the present embodiment includes the thermoelectric conversion modules stored in a sealed space, and any thermoelectric generator having such configuration can be used.

As described above, the thermoelectric generator according to the present invention can detect leakage of fluid from the sealed space at an early stage, preventing lowering of the power generation efficiency of the thermoelectric conversion modules. The thermoelectric generator can also prevent a negative effect due to leakage of coolant (cooling medium) and is therefore suitably used for thermoelectric conversion modules that perform thermoelectric generation based on the temperature difference between a high-temperature part and a low-temperature part.

DESCRIPTION OF THE REFERENCE NUMERALS

1 . . . engine (internal combustion engine), 2 . . . intake pipe (intake pipe), 4 . . . intake manifold (intake pipe), 10 . . . exhaust pipe, 10b . . . large-diameter portion, 10c . . . small-diameter portion, 13 . . . thermoelectric generator, 19 . . . exhaust pipe portion, 22 . . . thermoelectric conversion modules, 23 . . . coolant pipe (cooling portion), 24 . . . heating board (high-temperature part), 25 . . . radiating board (low-temperature part), 32 . . . module chamber (space portion, sealed space), 33, 34 . . . plate (partitions), 35 . . . HC sensor (fault diagnosis means, exhaust detecting means), 36 . . . ECU (fault diagnosis means), 39 . . . alarm device (fault diagnosis means, alarm member), 41, 59, 73, 81 . . . pipe (communication pipe), 41a, 59a, 73a, 81a . . . communication passage, 42 . . . air-fuel ratio sensor (exhaust detecting means), 54 . . . canister (adsorber), 56 . . . adsorbent, 57 . . . purge pipe, 57a . . . purge passage, 63 . . . purge valve (open-close means), 71 . . . EGR pipe, 71a . . . EGR passage, 72 . . . EGR valve (open-close means), 82 . . . oxygen sensor (exhaust detecting means), 101 . . . engine (internal combustion engine), 117 . . . thermoelectric generator, 120 . . . exhaust pipe, 121 . . . exhaust passage, 122 . . . thermoelectric conversion modules, 123 . . . coolant pipe, 126 . . . module chamber (sealed space), 129 . . . heating board (high-temperature part), 130 . . . radiating board (low-temperature part), 141 . . . communication pipe, 141a . . . communication chamber, 142 . . . pressure sensor (fault diagnosis means, fault diagnosis device), 148 . . . ECU (fault diagnosis means, fault diagnosis device), 149 . . . alarm device (fault diagnosis means, fault diagnosis device).

The invention claimed is:

1. A thermoelectric generator comprising:
an exhaust pipe portion into which exhaust gas is conducted;
a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion; and
a fault diagnosis circuitry that performs fault diagnosis on the thermoelectric generator based on exhaust gas leaking from the exhaust pipe portion into the space portion, the fault diagnosis circuitry includes an exhaust sensor located in the space portion and performs fault diagnosis on the thermoelectric generator based on detection information from the exhaust sensor, and
the fault diagnosis circuitry includes an alarm member that issues an alarm when the fault diagnosis circuitry determines that the thermoelectric generator has a fault.

2. A thermoelectric generator comprising:
an exhaust pipe portion into which exhaust gas is conducted;
a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion;
a fault diagnosis circuitry that performs fault diagnosis on the thermoelectric generator based on exhaust gas leaking from the exhaust pipe portion into the space portion; and
a communication pipe having a communication passage that connects an inside of an intake pipe for conducting intake air into an internal combustion engine with the space portion,
the fault diagnosis circuitry performs fault diagnosis on the thermoelectric generator based on detection information from an exhaust sensor located in an exhaust pipe to which exhaust gas is discharged from the internal combustion engine, and
the fault diagnosis circuitry includes an alarm member that issues an alarm when the fault diagnosis circuitry determines that the thermoelectric generator has a fault.

3. The thermoelectric generator according to claim 2, wherein the fault diagnosis circuitry performs fault diagnosis on the thermoelectric generator after stop of supply of fuel to the internal combustion engine.

4. A thermoelectric generator comprising:
an exhaust pipe portion into which exhaust gas is conducted;

a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion; and
a fault diagnosis circuitry that performs fault diagnosis on the thermoelectric generator based on exhaust gas leaking from the exhaust pipe portion into the space portion,
the thermoelectric generator is mounted in an internal combustion engine provided with an exhaust pipe to which exhaust gas is discharged from the internal combustion engine, an intake pipe that conducts intake air into the internal combustion engine, an adsorber having an adsorbent that adsorbs evaporated fuel, and a purge pipe having a purge passage that connects an inside of the adsorber with an inside of the intake pipe, wherein the exhaust pipe portion is connected to the exhaust pipe,
the thermoelectric generator further comprises a communication pipe having a communication passage that connects the space portion with the purge passage,
the fault diagnosis circuitry performs fault diagnosis on the thermoelectric generator based on detection information from an exhaust sensor provided in the exhaust pipe, and
the fault diagnosis circuitry includes an alarm member that issues an alarm when the fault diagnosis circuitry determines that the thermoelectric generator has a fault.

5. The thermoelectric generator according to claim 4, wherein:
the internal combustion engine includes a valve provided in a section of the purge pipe upstream from a connection between the communication pipe and the purge pipe in a purge gas flow direction, wherein the valve opens and closes the purge passage, and
the fault diagnosis circuitry performs fault diagnosis on the thermoelectric generator when the valve closes the purge passage.

6. The thermoelectric generator according to claim 4, wherein the fault diagnosis circuitry performs fault diagnosis on the thermoelectric generator after stop of supply of fuel to the internal combustion engine.

7. A thermoelectric generator comprising:
an exhaust pipe portion into which exhaust gas is conducted;
a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion; and
a fault diagnosis circuitry that performs fault diagnosis on the thermoelectric generator based on exhaust gas leaking from the exhaust pipe portion into the space portion,
the thermoelectric generator is mounted in an internal combustion engine provided with an exhaust pipe to which exhaust gas is discharged from the internal combustion engine, an intake pipe that conducts intake air into the internal combustion engine, and an EGR pipe having an EGR passage that connects an inside of the exhaust pipe with an inside of the intake pipe and returns some of the exhaust gas discharged from the exhaust pipe as EGR gas to the intake pipe, wherein the exhaust pipe portion is connected to the exhaust pipe,
the thermoelectric generator further comprises a communication pipe having a communication passage that connects the EGR passage with the space portion,
the fault diagnosis circuitry performs fault diagnosis on the thermoelectric generator based on detection information from an exhaust sensor provided in the exhaust pipe, and
the fault diagnosis circuitry includes an alarm member that issues an alarm when the fault diagnosis circuitry determines that the thermoelectric generator has a fault.

8. The thermoelectric generator according to claim 7, wherein:
the internal combustion engine includes a valve provided in a section of the EGR pipe upstream from a connection between the communication pipe and the EGR pipe in an EGR gas flow direction to open and close the EGR pipe, and
the fault diagnosis circuitry performs fault diagnosis on the thermoelectric generator when the valve closes the EGR passage.

9. The thermoelectric generator according to claim 7, wherein the fault diagnosis circuitry performs fault diagnosis on the thermoelectric generator after stop of supply of fuel to the internal combustion engine.

10. A thermoelectric generator comprising:
an exhaust pipe portion into which exhaust gas is conducted;
a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion; and
a fault diagnosis circuitry that performs fault diagnosis on the thermoelectric generator based on exhaust gas leaking from the exhaust pipe portion into the space portion,
the exhaust pipe portion of the thermoelectric generator is connected to an exhaust pipe to which exhaust gas is discharged from an internal combustion engine,
the exhaust pipe includes a large-diameter portion and a small-diameter portion configured to be located downstream from the large-diameter portion and have a smaller inner diameter than the large-diameter portion,
the thermoelectric generator includes a communication pipe having a communication passage having a first end in connection with an inside of the small-diameter portion and a second end in connection with the space portion,
the fault diagnosis circuitry performs fault diagnosis on the thermoelectric generator based on detection information from an exhaust sensor provided in the small-diameter portion downstream from the first end of the communication pipe, and
the fault diagnosis circuitry includes an alarm member that issues an alarm when the fault diagnosis circuitry determines that the thermoelectric generator has a fault.

11. The thermoelectric generator according to claim 10, wherein the fault diagnosis circuitry performs fault diagnosis on the thermoelectric generator after stop of supply of fuel to the internal combustion engine.

12. The thermoelectric generator according to claim 1, wherein the space portion is a sealed space that is defined by partitions provided in the exhaust pipe portion and the cooling portion and is isolated from the atmosphere.

13. The thermoelectric generator according to claim 1, wherein the cooling medium is formed of coolant flowing through the cooling portion.

14. A thermoelectric generator comprising:
an exhaust pipe portion into which exhaust gas is conducted;
a cooling portion to which a cooling medium is supplied;
a thermoelectric conversion module that has a high-temperature part opposed to the exhaust pipe portion and a low-temperature part opposed to the cooling portion, wherein the thermoelectric conversion module performs thermoelectric generation using a temperature difference between the high-temperature part and the low-temperature part, and wherein the thermoelectric conversion module is located in a space portion defined between the exhaust pipe portion and the cooling portion; and
a fault diagnosis circuitry that performs fault diagnosis on the thermoelectric generator based on exhaust gas leaking from the exhaust pipe portion into the space portion, the space portion is a sealed space,
the fault diagnosis circuitry detects a change in a pressure in the sealed space and performs fault diagnosis on the thermoelectric generator based on the change in the pressure in the sealed space,
in a case in which a pressure in the absence of leakage of fluid into the sealed space is a reference pressure, the fault diagnosis circuitry determines that the fluid leaks into the sealed space if a differential pressure between the reference pressure and the pressure in the sealed space is equal to or larger than a predetermined threshold,
the fault diagnosis circuitry corrects the reference pressure depending on a temperature of the sealed space and compares the corrected reference pressure with the pressure in the sealed space, and
the fault diagnosis circuitry includes an alarm member that issues an alarm when the fault diagnosis circuitry determines that fluid leaks into the sealed space.

15. The thermoelectric generator according to claim 14, wherein the fault diagnosis circuitry includes a pressure sensor located in the sealed space or a communication pipe having a sealed communication passage in communication with the sealed space and determines whether fluid leaks into the sealed space based on detection information from the pressure sensor.

* * * * *